United States Patent
Noda et al.

(10) Patent No.: US 9,735,280 B2
(45) Date of Patent: Aug. 15, 2017

(54) SEMICONDUCTOR DEVICE, METHOD FOR MANUFACTURING SEMICONDUCTOR DEVICE, AND METHOD FOR FORMING OXIDE FILM

(71) Applicant: Semiconductor Energy Laboratory Co., Ltd., Atsugi-shi, Kanagawa-ken (JP)

(72) Inventors: Kosei Noda, Atsugi (JP); Suzunosuke Hiraishi, Tochigi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 13/777,074

(22) Filed: Feb. 26, 2013

(65) Prior Publication Data

US 2013/0228775 A1   Sep. 5, 2013

(30) Foreign Application Priority Data

Mar. 2, 2012  (JP) ................................. 2012-046295
Mar. 2, 2012  (JP) ................................. 2012-046296

(51) Int. Cl.
  *H01L 29/10*  (2006.01)
  *H01L 29/786* (2006.01)
  *H01L 29/66*  (2006.01)

(52) U.S. Cl.
  CPC .... *H01L 29/7869* (2013.01); *H01L 29/66742* (2013.01)

(58) Field of Classification Search
  CPC .................................................. H01L 29/7869

(Continued)

(56) References Cited

U.S. PATENT DOCUMENTS 4,824,546 A * 4/1989 Ohmi ...................... B67C 3/202
                                                         204/192.12
5,500,102 A   3/1996 Ichikawa et al.
(Continued)

FOREIGN PATENT DOCUMENTS

EP      1737044 A    12/2006
EP      2226847 A     9/2010
(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — John C Ingham
*Assistant Examiner* — Frederick B Hargrove
(74) *Attorney, Agent, or Firm* — Robinson Intellectual Property Law Office; Eric J. Robinson

(57) ABSTRACT

One embodiment of the present invention is a semiconductor device at least including an oxide semiconductor film, a gate insulating film in contact with the oxide semiconductor film, and a gate electrode overlapping with the oxide semiconductor film with the gate insulating film therebetween. The oxide semiconductor film has a spin density lower than $9.3 \times 10^{16}$ spins/cm$^3$ and a carrier density lower than $1 \times 10^{15}$/cm$^3$. The spin density is calculated from a peak of a signal detected at a g value (g) of around 1.93 by electron spin resonance spectroscopy. The oxide semiconductor film is formed by a sputtering method while bias power is supplied to the substrate side and self-bias voltage is controlled, and then subjected to heat treatment.

24 Claims, 27 Drawing Sheets

(58) Field of Classification Search
USPC .............................................. 257/43, 57, 59
See application file for complete search history.

(56) References Cited

U.S. PATENT DOCUMENTS

| | | | |
|---|---|---|---|
| 5,528,032 A | | 6/1996 | Uchiyama |
| 5,622,607 A | * | 4/1997 | Yamazaki et al. ........ 204/192.15 |
| 5,731,856 A | | 3/1998 | Kim et al. |
| 5,744,864 A | | 4/1998 | Cillessen et al. |
| 5,888,858 A | | 3/1999 | Yamazaki et al. |
| 5,985,740 A | | 11/1999 | Yamazaki et al. |
| 6,063,654 A | | 5/2000 | Ohtani |
| 6,077,731 A | | 6/2000 | Yamazaki et al. |
| 6,093,934 A | | 7/2000 | Yamazaki et al. |
| 6,100,562 A | | 8/2000 | Yamazaki et al. |
| 6,180,439 B1 | | 1/2001 | Yamazaki et al. |
| 6,225,152 B1 | | 5/2001 | Yamazaki et al. |
| 6,294,274 B1 | | 9/2001 | Kawazoe et al. |
| 6,316,810 B1 | * | 11/2001 | Yamazaki et al. ............ 257/347 |
| 6,465,287 B1 | | 10/2002 | Yamazaki et al. |
| 6,478,263 B1 | | 11/2002 | Yamazaki et al. |
| 6,504,174 B1 | | 1/2003 | Yamazaki et al. |
| 6,528,358 B1 | | 3/2003 | Yamazaki et al. |
| 6,528,820 B1 | | 3/2003 | Yamazaki et al. |
| 6,541,315 B2 | | 4/2003 | Yamazaki et al. |
| 6,563,174 B2 | | 5/2003 | Kawasaki et al. |
| 6,727,522 B1 | | 4/2004 | Kawasaki et al. |
| 6,744,069 B1 | | 6/2004 | Yamazaki et al. |
| 7,037,811 B1 | | 5/2006 | Yamazaki et al. |
| 7,049,190 B2 | | 5/2006 | Takeda et al. |
| 7,056,381 B1 | | 6/2006 | Yamazaki et al. |
| 7,061,014 B2 | | 6/2006 | Hosono et al. |
| 7,064,346 B2 | | 6/2006 | Kawasaki et al. |
| 7,078,727 B2 | | 7/2006 | Yamazaki et al. |
| 7,105,868 B2 | | 9/2006 | Nause et al. |
| 7,135,741 B1 | | 11/2006 | Yamazaki et al. |
| 7,141,491 B2 | | 11/2006 | Yamazaki et al. |
| 7,173,282 B2 | | 2/2007 | Yamazaki et al. |
| 7,211,825 B2 | | 5/2007 | Shih et al |
| 7,282,782 B2 | | 10/2007 | Hoffman et al. |
| 7,297,977 B2 | | 11/2007 | Hoffman et al. |
| 7,323,356 B2 | | 1/2008 | Hosono et al. |
| 7,385,224 B2 | | 6/2008 | Ishii et al. |
| 7,402,506 B2 | | 7/2008 | Levy et al. |
| 7,411,209 B2 | | 8/2008 | Endo et al. |
| 7,422,630 B2 | | 9/2008 | Yamazaki et al. |
| 7,427,780 B2 | | 9/2008 | Yamazaki et al. |
| 7,453,065 B2 | | 11/2008 | Saito et al. |
| 7,453,087 B2 | | 11/2008 | Iwasaki |
| 7,456,056 B2 | | 11/2008 | Yamazaki et al. |
| 7,462,862 B2 | | 12/2008 | Hoffman et al. |
| 7,468,304 B2 | | 12/2008 | Kaji et al. |
| 7,501,293 B2 | | 3/2009 | Ito et al. |
| 7,674,650 B2 | | 3/2010 | Akimoto et al. |
| 7,679,087 B2 | | 3/2010 | Yamazaki et al. |
| 7,709,837 B2 | | 5/2010 | Yamazaki et al. |
| 7,732,819 B2 | | 6/2010 | Akimoto et al. |
| 7,791,072 B2 | | 9/2010 | Kumomi et al. |
| 7,910,490 B2 | | 3/2011 | Akimoto et al. |
| 7,932,521 B2 | | 4/2011 | Akimoto et al. |
| 7,972,898 B2 | | 7/2011 | Cowdery-Corvan et al. |
| 8,237,166 B2 | | 8/2012 | Kumomi et al. |
| 8,274,077 B2 | | 9/2012 | Akimoto et al. |
| 8,476,719 B2 | | 7/2013 | Endo et al. |
| 8,669,556 B2 | | 3/2014 | Yamazaki et al. |
| 8,680,522 B2 | | 3/2014 | Yamazaki et al. |
| 8,709,864 B2 | | 4/2014 | Yamazaki et al. |
| 8,871,565 B2 | | 10/2014 | Yamazaki et al. |
| 8,901,552 B2 | | 12/2014 | Yamazaki et al. |
| 8,994,021 B2 | | 3/2015 | Yamazaki et al. |
| 9,331,208 B2 | | 5/2016 | Yamazaki et al. |
| 2001/0046027 A1 | | 11/2001 | Tai et al. |
| 2002/0056838 A1 | | 5/2002 | Ogawa |
| 2002/0132454 A1 | | 9/2002 | Ohtsu et al. |
| 2003/0189401 A1 | | 10/2003 | Kido et al. |
| 2003/0218222 A1 | | 11/2003 | Wager et al. |
| 2004/0038446 A1 | | 2/2004 | Takeda et al. |
| 2004/0127038 A1 | | 7/2004 | Carcia et al. |
| 2005/0017302 A1 | | 1/2005 | Hoffman |
| 2005/0199959 A1 | | 9/2005 | Chiang et al. |
| 2006/0035452 A1 | | 2/2006 | Carcia et al. |
| 2006/0043377 A1 | | 3/2006 | Hoffman et al. |
| 2006/0091793 A1 | | 5/2006 | Baude et al. |
| 2006/0108529 A1 | | 5/2006 | Saito et al. |
| 2006/0108636 A1 | | 5/2006 | Sano et al. |
| 2006/0110867 A1 | * | 5/2006 | Yabuta et al. ................ 438/151 |
| 2006/0113536 A1 | | 6/2006 | Kumomi et al. |
| 2006/0113539 A1 | | 6/2006 | Sano et al. |
| 2006/0113549 A1 | | 6/2006 | Den et al. |
| 2006/0113565 A1 | | 6/2006 | Abe et al. |
| 2006/0169973 A1 | | 8/2006 | Isa et al. |
| 2006/0170111 A1 | | 8/2006 | Isa et al. |
| 2006/0197092 A1 | | 9/2006 | Hoffman et al. |
| 2006/0208977 A1 | | 9/2006 | Kimura |
| 2006/0228974 A1 | | 10/2006 | Thelss et al. |
| 2006/0231882 A1 | | 10/2006 | Kim et al. |
| 2006/0238135 A1 | | 10/2006 | Kimura |
| 2006/0244107 A1 | | 11/2006 | Sugihara et al. |
| 2006/0284171 A1 | | 12/2006 | Levy et al. |
| 2006/0284172 A1 | | 12/2006 | Ishii |
| 2006/0292777 A1 | | 12/2006 | Dunbar |
| 2007/0024187 A1 | | 2/2007 | Shin et al. |
| 2007/0046191 A1 | | 3/2007 | Saito |
| 2007/0052025 A1 | | 3/2007 | Yabuta |
| 2007/0054507 A1 | | 3/2007 | Kaji et al. |
| 2007/0072439 A1 | | 3/2007 | Akimoto et al. |
| 2007/0090365 A1 | | 4/2007 | Hayashi et al. |
| 2007/0108446 A1 | | 5/2007 | Akimoto |
| 2007/0152217 A1 | | 7/2007 | Lai et al. |
| 2007/0172591 A1 | | 7/2007 | Seo et al. |
| 2007/0187678 A1 | | 8/2007 | Hirao et al. |
| 2007/0187760 A1 | | 8/2007 | Furuta et al. |
| 2007/0194379 A1 | | 8/2007 | Hosono et al. |
| 2007/0252928 A1 | | 11/2007 | Ito et al. |
| 2007/0272922 A1 | | 11/2007 | Kim et al. |
| 2007/0278490 A1 | * | 12/2007 | Hirao .................. H01L 29/7869 257/64 |
| 2007/0287296 A1 | | 12/2007 | Chang |
| 2008/0006877 A1 | | 1/2008 | Mardilovich et al. |
| 2008/0038882 A1 | | 2/2008 | Takechi et al. |
| 2008/0038929 A1 | | 2/2008 | Chang |
| 2008/0050595 A1 | | 2/2008 | Nakagawara et al. |
| 2008/0073653 A1 | | 3/2008 | Iwasaki |
| 2008/0083950 A1 | | 4/2008 | Pan et al. |
| 2008/0106191 A1 | | 5/2008 | Kawase |
| 2008/0128689 A1 | | 6/2008 | Lee et al. |
| 2008/0129195 A1 | | 6/2008 | Ishizaki et al. |
| 2008/0166834 A1 | | 7/2008 | Kim et al. |
| 2008/0182358 A1 | | 7/2008 | Cowdery-Corvan et al. |
| 2008/0224133 A1 | | 9/2008 | Park et al. |
| 2008/0254569 A1 | | 10/2008 | Hoffman et al. |
| 2008/0258139 A1 | | 10/2008 | Ito et al. |
| 2008/0258140 A1 | | 10/2008 | Lee et al. |
| 2008/0258141 A1 | | 10/2008 | Park et al. |
| 2008/0258143 A1 | | 10/2008 | Kim et al. |
| 2008/0296568 A1 | | 12/2008 | Ryu et al. |
| 2008/0308796 A1 | | 12/2008 | Akimoto et al. |
| 2008/0308805 A1 | | 12/2008 | Akimoto et al. |
| 2009/0008639 A1 | | 1/2009 | Akimoto et al. |
| 2009/0020753 A1 | * | 1/2009 | Jeong .................. C23C 14/086 257/43 |
| 2009/0068773 A1 | | 3/2009 | Lai et al. |
| 2009/0073325 A1 | | 3/2009 | Kuwabara et al. |
| 2009/0081826 A1 | | 3/2009 | Cowdery-Corvan et al. |
| 2009/0114910 A1 | | 5/2009 | Chang |
| 2009/0134399 A1 | | 5/2009 | Sakakura et al. |
| 2009/0152506 A1 | | 6/2009 | Umeda et al. |
| 2009/0152541 A1 | | 6/2009 | Maekawa et al. |
| 2009/0224340 A1 | * | 9/2009 | Akai ...................... C30B 23/02 257/421 |
| 2009/0278122 A1 | | 11/2009 | Hosono et al. |
| 2009/0280600 A1 | | 11/2009 | Hosono et al. |
| 2009/0283763 A1 | | 11/2009 | Park et al. |
| 2009/0305461 A1 | | 12/2009 | Akimoto et al. |

(56) References Cited

U.S. PATENT DOCUMENTS

| | | | |
|---|---|---|---|
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0136743 | A1 | 6/2010 | Akimoto et al. |
| 2011/0042670 | A1 | 2/2011 | Sato et al. |
| 2011/0068336 | A1 | 3/2011 | Yamazaki et al. |
| 2011/0101335 | A1 | 5/2011 | Yamazaki et al. |
| 2011/0104851 | A1 | 5/2011 | Akimoto et al. |
| 2011/0117697 | A1 | 5/2011 | Akimoto et al. |
| 2011/0121290 | A1 | 5/2011 | Akimoto et al. |
| 2011/0163311 | A1 | 7/2011 | Akimoto et al. |
| 2011/0284846 | A1 | 11/2011 | Endo et al. |
| 2012/0018727 | A1* | 1/2012 | Endo et al. ............. 257/57 |
| 2012/0064664 | A1 | 3/2012 | Yamazaki et al. |
| 2012/0064665 | A1 | 3/2012 | Yamazaki |
| 2012/0138922 | A1* | 6/2012 | Yamazaki et al. ............. 257/43 |
| 2012/0187397 | A1 | 7/2012 | Yamazaki et al. |
| 2012/0261657 | A1 | 10/2012 | Takahashi et al. |
| 2013/0099237 | A1 | 4/2013 | Sasaki et al. |
| 2013/0153892 | A1 | 6/2013 | Sasaki et al. |
| 2014/0183532 | A1 | 7/2014 | Yamazaki et al. |
| 2014/0246674 | A1 | 9/2014 | Yamazaki et al. |
| 2015/0024544 | A1 | 1/2015 | Yamazaki et al. |
| 2016/0240694 | A1 | 8/2016 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 11-330476 A | 11/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-249447 A | 9/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2007-123861 | 5/2007 |
| JP | 2008-108985 | 5/2008 |
| JP | 2010-016298 A | 1/2010 |
| JP | 2011-501877 | 1/2011 |
| JP | 2011-119720 A | 6/2011 |
| JP | 2012-009838 A | 1/2012 |
| JP | 2012-084860 A | 4/2012 |
| JP | 2012-084861 A | 4/2012 |
| JP | 2012-084867 A | 4/2012 |
| JP | 2012-119672 A | 6/2012 |
| JP | 2012-134475 A | 7/2012 |
| JP | 2013-102171 A | 5/2013 |
| WO | WO-2004/114391 | 12/2004 |
| WO | WO-2009/042144 | 4/2009 |
| WO | WO-2011/055769 | 5/2011 |
| WO | WO-2011/145632 | 11/2011 |
| WO | WO-2012/036104 | 3/2012 |
| WO | WO-2012/073844 | 6/2012 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letter) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crytalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

(56) References Cited

OTHER PUBLICATIONS

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn —Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Tecnical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Diplay Applicaton,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

(56) References Cited

OTHER PUBLICATIONS

Hosono.H et al., "Working hypothesis to explore novel wide band gap electrically conducting amorphous oxides and example,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE, METHOD FOR MANUFACTURING SEMICONDUCTOR DEVICE, AND METHOD FOR FORMING OXIDE FILM

BACKGROUND OF THE INVENTION

1. Field of the Invention

This document relates to semiconductor devices, method for manufacturing semiconductor devices, and method for forming oxide films.

Note that a semiconductor device in this specification refers to general devices which can function by utilizing semiconductor characteristics; for example, a semiconductor element such as a transistor, a semiconductor circuit including a semiconductor element, an electro-optical device such as a display device, and an electronic device are all semiconductor devices.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

In recent years, attention has been drawn to a technique of using, instead of a silicon semiconductor, a metal oxide exhibiting semiconductor characteristics for transistors. Note that in this specification, a metal oxide exhibiting semiconductor characteristics is referred to as an oxide semiconductor.

For example, a technique of using an oxide semiconductor containing at least one element selected from indium (In), gallium (Ga), and zinc (Zn) for a transistor is disclosed (see Patent Document 1 and Patent Document 2).

In addition, a technique of forming an oxide semiconductor which contains zinc oxide as a main component by sputtering while supplying a gas containing oxygen and supplying bias power to the substrate side is disclosed (see Patent Document 3).

REFERENCE

Patent Document

[Patent Document 1] Japanese Published Patent Application No. 2006-165528
[Patent Document 2] Japanese Published Patent Application No. 2007-123861
[Patent Document 3] Japanese Published Patent Application No. 2008-108985

SUMMARY OF THE INVENTION

In a transistor including an oxide semiconductor, hydrogen (including water, a hydrogen ion, a hydroxide ion, and the like) and oxygen vacancies in the oxide semiconductor film causes the transistor to have poor electric characteristics. For example, the threshold voltage of a transistor which includes an oxide semiconductor film including hydrogen and oxygen vacancies tends to shift in the negative direction, and thus the transistor tends to be normally on. This is because charge is generated owing to the hydrogen and oxygen vacancies in the oxide semiconductor film to reduce the resistance of the oxide semiconductor film. It is difficult to reduce the oxygen vacancies in the oxide semiconductor film. For example, oxygen vacancies are easily formed in an oxide semiconductor film in the step of forming or etching the oxide semiconductor film.

In a variety of semiconductor devices such as display devices and semiconductor memory devices, improvement of the electric characteristics of a transistor included in the semiconductor device results in improvement of the performance of the semiconductor device. To manufacture a display device with higher definition, for example, it is important to achieve an increase in the field-effect mobility of the transistor, a reduction in the leakage current of the transistor, and the like.

In view of the above, an object of one embodiment of the present invention is to provide a semiconductor device including an oxide semiconductor film in which oxygen vacancies are reduced and a method for manufacturing the semiconductor device. Another object of one embodiment of the present invention is to provide a high-performance semiconductor device having favorable electric characteristics and a method for manufacturing the semiconductor device.

Another object of one embodiment of the present invention is to provide a method for forming an oxide film (an oxide semiconductor film or an oxide insulating film) whose oxygen content is increased. Specifically, an object is to provide a method for forming an oxide semiconductor film whose oxygen content is increased and in which oxygen vacancies are reduced. Further, an object is to provide a method for forming an oxide insulating film whose oxygen content is increased. Note that one embodiment of the present invention achieves at least one of the above objects.

When a film in contact with an oxide semiconductor film contains a large amount of oxygen and can release part of the oxygen, the film can supply oxygen to the oxide semiconductor film and reduce oxygen vacancies in the oxide semiconductor film. Accordingly, it is important to increase the oxygen content of an oxide insulating film that is in contact with an oxide semiconductor film, for example.

One embodiment of the present invention is a semiconductor device including an oxide semiconductor film in which oxygen vacancies and carrier density are reduced, as a semiconductor film including a channel formation region. Note that in this specification, the oxide semiconductor film in which oxygen vacancies are reduced refers to an oxide semiconductor film which has fewer signals due to oxygen vacancies according to detection of electron spin resonance (ESR). Specifically, the oxide semiconductor film in which oxygen vacancies are reduced is an oxide semiconductor film whose spin density, which is calculated from the peak of a signal detected at a g value (g) of around 1.93 by electron spin resonance spectroscopy, is lower than $9.3 \times 10^{16}$ spins/cm$^3$.

Note that a symmetrical signal which is found at a g value (g) of around 1.93 in electron spin resonance spectroscopy is a signal due to oxygen vacancies. In electron spin resonance spectroscopy, the g value (g) at which a signal due to oxygen vacancies is found varies depending on the composition of an oxide semiconductor film subjected to measurement. For example, in the case where the oxide semiconductor film subjected to the measurement is an In—Ga—Zn-based oxide, a signal due to oxygen vacancies in the In—Ga—Zn-based oxide is found at a g value of 1.93 when the proportion of In is equal to those of Ga and Zn, whereas a signal due to oxygen vacancies tends to be found at a g value smaller than 1.93 when the proportion of In is higher than those of Ga and Zn. Further, in this specification, the oxide semiconductor film in which carrier density is reduced refers to an oxide semiconductor film which has a carrier density lower than $1\times10^{15}/cm^3$.

To form an oxide semiconductor film in which oxygen vacancies and carrier density are reduced, an oxide semiconductor film is formed in a manner such that oxygen vacancies are not formed in the oxide semiconductor film, and then hydrogen or the like which generates charge is removed.

To form an oxide semiconductor film in a manner such that oxygen vacancies are not formed, the oxide semiconductor film is formed in a manner such that oxygen is taken in by the oxide semiconductor film. Specifically, the oxide semiconductor film is formed by a sputtering method in an oxygen atmosphere with bias power supplied to the substrate side. Then, heat treatment is preferably performed to remove impurities. By supplying bias power to the substrate side at the time of forming the oxide semiconductor film by a sputtering method, self-bias voltage is generated between the substrate and oxygen plasma that is generated in a treatment chamber of a sputtering apparatus. For example, bias power is supplied so that oxygen ions in the oxygen plasma move toward the substrate side easily. In other words, bias power is preferably supplied so that the substrate side has a negative potential with respect to the potential of the generated oxygen plasma. For example, RF power is supplied as bias power to the substrate side to generate self-bias voltage, so that the substrate side has a negative potential with respect to the oxygen plasma, which enables oxygen ions (typically, $O^+$ and $O_2^+$) in the oxygen plasma to move toward the substrate side easily; thus, the oxide semiconductor film is formed while taking in oxygen ions. Moreover, the number of oxygen ions taken in can be changed by control of the self-bias voltage. As the self-bias voltage is increased, the oxygen ions taken in by the oxide semiconductor film are increased, so that an oxide semiconductor film with even fewer oxygen vacancies can be formed.

Specifically, oxygen is supplied as a sputtering gas to a reaction chamber and power is supplied to a target for forming an oxide film (an oxide semiconductor film or an oxide insulating film) to generate oxygen plasma, bias power is supplied to the object (e.g., a substrate) side, and the oxide film is formed with self-bias voltage that is generated between the oxygen plasma and the object controlled to be higher than or equal to 400 V.

After the formation of the oxide film (the oxide semiconductor film or the oxide insulating film), heat treatment is preferably performed to remove impurities (e.g., hydrogen) from the formed film. For example, the heat treatment can be performed at a temperature higher than or equal to 300° C. and lower than or equal to 700° C. under reduced pressure, a nitrogen atmosphere, an oxygen atmosphere, or a rare gas atmosphere. By the heat treatment, hydrogen contained in the formed oxide film can be removed.

In view of the above, one embodiment of the present invention is a semiconductor device at least including an oxide semiconductor film, a gate insulating film in contact with the oxide semiconductor film, and a gate electrode overlapping with the oxide semiconductor film with the gate insulating film therebetween. The oxide semiconductor film has a spin density lower than $9.3\times10^{16}$ spins/cm$^3$ and a carrier density lower than $1\times10^{15}/cm^3$. The spin density is calculated from a peak of a signal detected at a g value (g) of around 1.93 by electron spin resonance spectroscopy. In the semiconductor device, a source electrode and a drain electrode are provided in contact with the oxide semiconductor film.

As mentioned above, Patent Document 3 discloses a technique of forming an oxide semiconductor film by sputtering while supplying a gas containing oxygen and supplying bias power to the substrate side. However, Patent Document 3 focuses on preventing a reduction in the resistance of the oxide semiconductor film due to heat treatment or the like in a manufacturing process of a transistor by increasing the thermal stability of the oxide semiconductor film, and, unlike one embodiment of the present invention, does not refer to a technique of forming an oxide semiconductor film with self-bias voltage controlled so as to prevent formation of oxygen vacancies nor to defect density and carrier density due to oxygen vacancies.

For example, an oxide semiconductor film is formed with self-bias voltage controlled to be higher than or equal to 400 V, and then hydrogen is removed by heat treatment. In this manner, an oxide semiconductor film whose spin density, which is calculated from the peak of a signal detected at a g value (g) of around 1.93 by electron spin resonance spectroscopy, is lower than $9.3\times10^{16}$ spins/cm$^3$ and whose carrier density is lower than $1\times10^{15}/cm^3$ can be formed. Consequently, a transistor with reduced off-state current can be manufactured.

A transistor according to one embodiment of the present invention is not limited to a top-gate transistor, and may have any of a variety of structures, such as a bottom-gate structure or a dual-gate structure. Accordingly, one embodiment of the present invention is a semiconductor device in which a gate electrode is provided in contact with an upper surface of a gate insulating film or a lower surface of the gate insulating film.

In the above structure, it is effective to reduce the contact resistance with the source electrode and the drain electrode in order to improve on-state current and field-effect mobility. One embodiment of the present invention is a transistor which includes an oxide semiconductor film including a channel formation region and a low-resistance region. Note that the low-resistance region can be formed by injection of a dopant.

In view of the above, one embodiment of the present invention is a semiconductor device including an oxide semiconductor film which includes a first region and a pair of second regions having lower resistance than the first region and in which the first region lies between the pair of second regions, a gate insulating film over the oxide semiconductor film, a gate electrode overlapping with the first region with the gate insulating film therebetween, and a source electrode and a drain electrode in contact with the pair of second regions. The first region has a spin density lower than $9.3\times10^{16}$ spins/cm$^3$ and a carrier density lower than $1\times10^{15}/cm^3$. The spin density is calculated from a peak of a signal detected at a g value (g) of around 1.93 by electron spin resonance spectroscopy.

In the low-resistance region, regions with different resistances are preferably provided so that a region in contact with the source electrode or the drain electrode has the lowest resistance. Regions with different resistances can be provided by varying the dopant concentration in the low-resistance region. In this manner, an electric field can be gradually applied to the oxide semiconductor film included in the transistor, which can prevent the transistor from being damaged by electric-field concentration in the vicinity of a drain region.

In view of the above, one embodiment of the present invention is a semiconductor device including an oxide semiconductor film which includes a first region, a pair of second regions having lower resistance than the first region, and a pair of third regions having lower resistance than the pair of second regions and in which the first region lies between the pair of second regions and the first region and the pair of second regions lie between the pair of third regions, a gate insulating film over the oxide semiconductor film, a gate electrode overlapping with the first region with the gate insulating film therebetween, a sidewall insulating film overlapping with the pair of second regions and being in contact with a side surface of the gate electrode, and a source electrode and a drain electrode in contact with the pair of third regions. The first region has a spin density lower than $9.3 \times 10^{16}$ spins/cm$^3$ and a carrier density lower than $1 \times 10^{15}$/cm$^3$. The spin density is calculated from a peak of a signal detected at a g value (g) of around 1.93 by electron spin resonance spectroscopy.

In the above structure, a metal oxide film containing two or more metal elements can be used as the oxide semiconductor film of the transistor according to one embodiment of the present invention. Since an oxide semiconductor containing indium has high carrier mobility as compared with other oxide semiconductors, in a metal oxide containing two or more metal elements, the carrier mobility is increased as the proportion of indium is higher than those of other metal elements. Accordingly, it is preferable to use an oxide semiconductor containing indium, particularly an oxide semiconductor which contains both indium and zinc and in which the proportion of indium is higher than that of zinc. This makes it possible to manufacture a transistor with high on-state current and high field-effect mobility. Note that an oxide film containing indium can be used as the oxide semiconductor film instead of the metal oxide film containing two or more metal elements.

According to one embodiment of the present invention, a semiconductor device including an oxide semiconductor film in which oxygen vacancies are reduced can be provided. Further, a high-performance semiconductor device having favorable electric characteristics can be provided.

Moreover, according to one embodiment of the present invention, a method for forming an oxide film (an oxide semiconductor film or an oxide insulating film) whose oxygen content is increased can be provided. Specifically, a method for forming an oxide semiconductor film whose oxygen content is increased and in which oxygen vacancies are reduced can be provided. Further, a method for forming an oxide insulating film whose oxygen content is increased can be provided.

DETAILED DESCRIPTION OF THE INVENTION

Figure 1A:
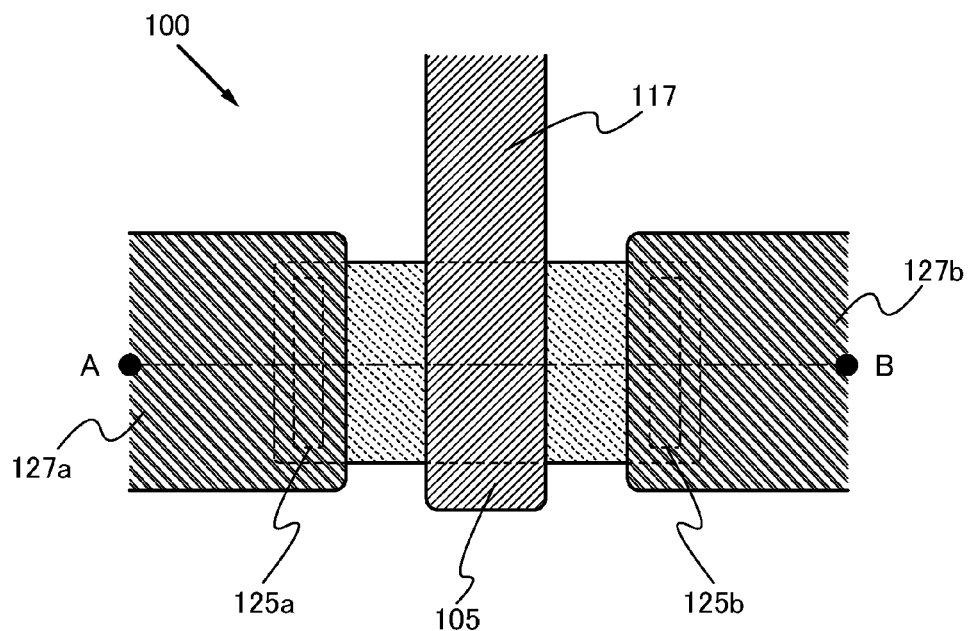
FIGS. 1A and 1B are a top view and a cross-sectional view illustrating an example of a transistor.

Hereinafter, embodiments and an example of the present invention will be described in detail with reference to the accompanying drawings. However, the present invention is not limited to the following description and it is easily understood by those skilled in the art that the mode and details can be variously changed without departing from the scope and spirit of the present invention. Therefore, the present invention is not construed as being limited to the description of the following embodiments and example. In addition, in the following embodiments and example, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, the embodiments and example of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flowing is changed in circuit operation, for example. Therefore, the terms "source" and "drain" can be used to denote the drain and the source, respectively, in this specification.

In this specification, in the case where an etching step is performed after a photolithography step, a mask formed in the photolithography step is removed after the etching step.

Embodiment 1

In this embodiment, a semiconductor device of one embodiment of the present invention will be described with reference to drawings. A transistor will be described as an example of the semiconductor device.

<Structure Example of Transistor>

Figure 1B:
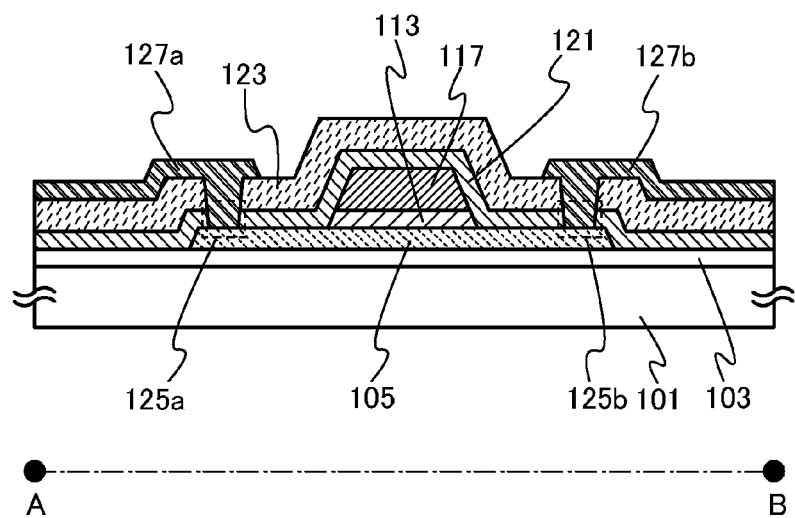

FIGS. 1A and 1B are a top view and a cross-sectional view which illustrate a transistor 100. FIG. 1A is a top view of the transistor 100, and FIG. 1B is a cross-sectional view taken along dashed-dotted line A-B in FIG. 1A. Note that in FIG. 1A, some components of the transistor 100 (e.g., a substrate 101, a base insulating film 103, and a gate insulating film 113) are omitted for simplicity.

According to FIGS. 1A and 1B, in the transistor 100, the base insulating film 103 is provided over the substrate 101, an oxide semiconductor film 105 is provided over the base insulating film 103, the gate insulating film 113 is provided over the oxide semiconductor film 105, a gate electrode 117 is provided over the gate insulating film 113, a metal oxide film 121 having an insulating property is provided over the base insulating film 103, the oxide semiconductor film 105, the gate insulating film 113, and the gate electrode 117, an interlayer insulating film 123 is provided over the metal oxide film 121 having an insulating property, and a source electrode 127a and a drain electrode 127b are provided in contact with the oxide semiconductor film 105 through openings 125a and 125b which are formed in the metal oxide film 121 having an insulating property and the interlayer insulating film 123. Note that the base insulating film 103 and the interlayer insulating film 123 are not necessarily provided.

The gate electrode 117 is provided so as to overlap with the oxide semiconductor film 105 with the gate insulating film 113 therebetween. In other words, the gate electrode 117 is provided in contact with an upper surface of the gate insulating film 113 (i.e., provided above the oxide semiconductor film 105), which means that the transistor 100 is a top-gate transistor. In the transistor 100, the source electrode 127a and the drain electrode 127b are in contact with an upper surface of the oxide semiconductor film 105.

The gate electrode 117 also serves as a gate wiring. The source electrode 127a also serves as a source wiring. The drain electrode 127b also serves as a drain wiring.

The oxide semiconductor film 105 includes at least a channel formation region. The oxide semiconductor film 105 is an amorphous oxide semiconductor film or an oxide semiconductor film having crystallinity, such as a single crystal oxide semiconductor film, a polycrystalline (also referred to as polycrystal) oxide semiconductor film, or a microcrystalline oxide semiconductor film.

A metal oxide containing two or more metal elements can be used for the oxide semiconductor film 105. Since an oxide semiconductor containing indium has high carrier mobility as compared with other oxide semiconductors, in a metal oxide containing two or more metal elements, the carrier mobility is increased as the proportion of indium is higher than those of other metal elements. Accordingly, it is preferable to use an oxide semiconductor containing indium, particularly an oxide semiconductor which contains both indium and zinc and in which the proportion of indium is higher than that of zinc. This makes it possible to manufacture a transistor with high on-state current, high field-effect mobility, and favorable electric characteristics. Note that an oxide containing indium can be used for the oxide semiconductor film instead of the metal oxide containing two or more metal elements.

In a transistor including an oxide semiconductor, hydrogen (including water, a hydrogen ion, a hydroxide ion, and the like) and oxygen vacancies in the oxide semiconductor film generate charge, thus increasing the carrier density of the oxide semiconductor film and reducing the resistance of the oxide semiconductor film. Accordingly, the threshold voltage of a transistor that includes an oxide semiconductor film including hydrogen and oxygen vacancies tends to shift in the negative direction, and thus the transistor tends to be normally on.

The oxide semiconductor film 105 is an oxide semiconductor film in which oxygen vacancies and carrier density are reduced. Specifically, the oxide semiconductor film 105 is an oxide semiconductor film which has no signals due to oxygen vacancies (i.e., the spin density due to oxygen vacancies is below the lower limit of detection) according to detection of electron spin resonance (ESR) and has reduced carrier density. When the oxide semiconductor film has oxygen vacancies, a symmetrical signal is found at a g value (g) of around 1.93 in electron spin resonance spectroscopy.

In electron spin resonance spectroscopy, a magnetic field is swept under irradiation with microwaves, and resonance absorption which occurs when an energy difference between split levels becomes equal to the energy of the microwaves used for the irradiation is observed, whereby the number of defects or the like which include unpaired electrons can be measured. In this specification, a symmetrical signal is a signal that is obtained through measurement by electron spin resonance spectroscopy, an example of which is a signal having point symmetry with respect to a g value in the case of a thin film. An absorption curve that is obtained by integral transformation of the signal obtained through measurement by electron spin resonance spectroscopy can be represented as one peak, and the top of the peak is at the g value. The integral value of the peak corresponds to the total number of the defects including unpaired electrons. Accordingly, the spin density of a sample subjected to measurement can be found in the following manner: calculation is performed by comparing the integral value of the peak with that of a standard sample of which the total number of defects is quantified in advance, and the obtained value is divided by the volume of the sample.

The spin density of the oxide semiconductor film 105, which is calculated from the peak of a signal detected at a g value (g) of around 1.93 by electron spin resonance spectroscopy, is lower than $9.3 \times 10^{16}$ spins/cm$^3$, preferably lower than or equal to $5 \times 10^{16}$ spins/cm$^3$, further preferably below the lower limit of detection, and the carrier density thereof is lower than $1 \times 10^{15}$/cm$^3$. Note that carrier density can be measured by Hall effect measurement, CV measurement, or the like.

Furthermore, hydrogen contained in the oxide semiconductor film 105 is reduced; the hydrogen concentration in the oxide semiconductor film 105 is lower than $5 \times 10^{18}$ atoms/cm$^3$, preferably lower than or equal to 5×10$^{17}$ atoms/cm$^3$. Note that the hydrogen concentration is measured by secondary ion mass spectrometry (SIMS).

According to the above, the transistor 100 has favorable electric characteristics. Specifically, the off-state current is reduced, the on-state current and field-effect mobility are increased, and a shift of the threshold voltage in the negative direction is suppressed.

<Method for Forming Oxide Semiconductor Film>

Here, a method for forming an oxide semiconductor film in which oxygen vacancies and carrier density are reduced, which can be used as the oxide semiconductor film 105, is described.

To form an oxide semiconductor film in which oxygen vacancies and carrier density are reduced, an oxide semiconductor film is formed in a manner such that oxygen vacancies are not formed in the oxide semiconductor film, and then hydrogen or the like which generates charge is removed. In other words, the oxide semiconductor film is formed in a manner such that oxygen is taken in by the oxide semiconductor film, and then hydrogen or the like which generates charge is removed. Since the oxide semiconductor film is formed in a manner such that oxygen is taken in, the formed oxide semiconductor film contains excess oxygen. In this manner, an oxide semiconductor film containing oxygen in a proportion higher than that in the stoichiometric composition can be formed. Accordingly, an oxide semiconductor film in which oxygen vacancies and carrier density are reduced can also be referred to as an oxide semiconductor film containing oxygen in a proportion higher than that in the stoichiometric composition.

Specifically, the oxide semiconductor film is formed by a sputtering method in an oxygen atmosphere with bias power supplied to the substrate side, and then subjected to heat treatment.

Figure 2A:
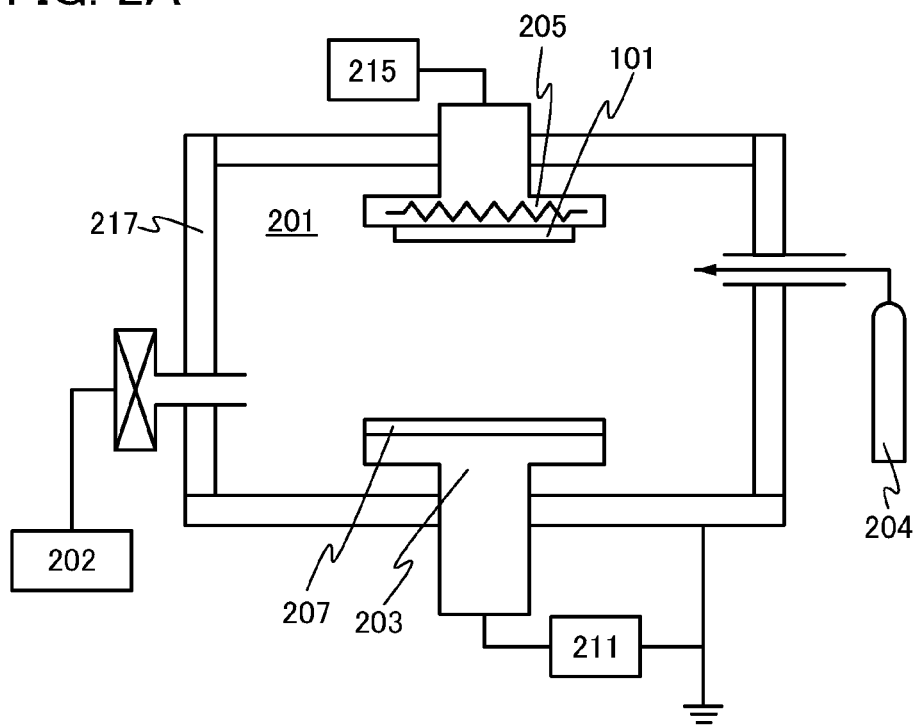
FIGS. 2A and 2B are cross-sectional views each illustrating a sputtering apparatus.
Figure 2B:
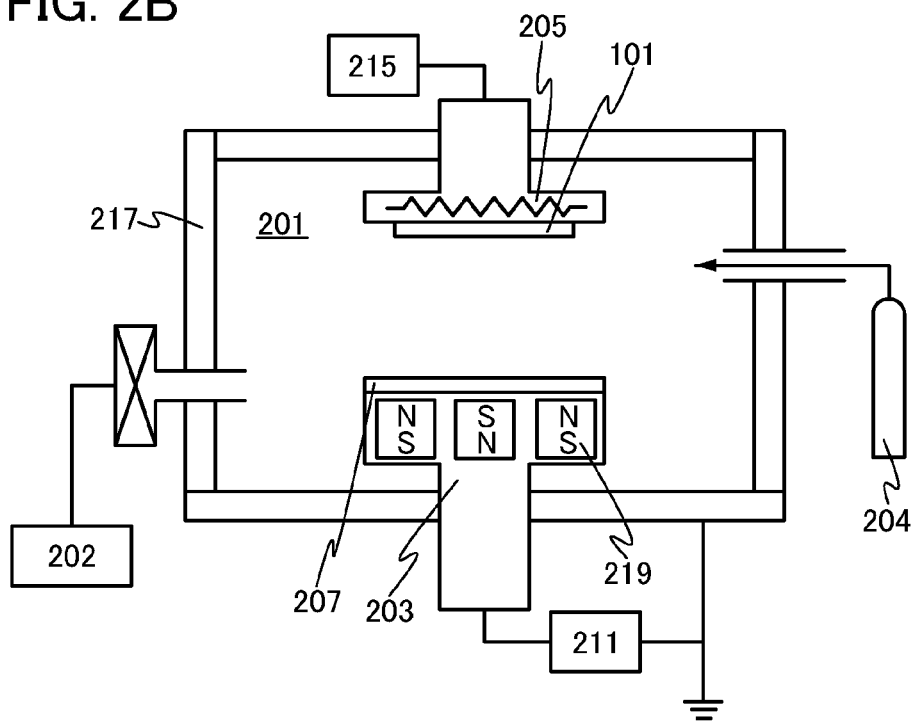

First, sputtering apparatuses with which the above formation method can be implemented are described. FIGS. 2A and 2B are cross-sectional views each illustrating a treatment chamber in the sputtering apparatus.

The sputtering apparatus in FIG. 2A is a diode sputtering apparatus, and the sputtering apparatus in FIG. 2B is a magnetron sputtering apparatus. Note that FIGS. 2A and 2B are merely structure examples of a sputtering apparatus, and the structure of a sputtering apparatus is not limited to these. For example, the number of electrodes in the sputtering apparatuses illustrated in FIGS. 2A and 2B may be three or four, without being limited to two.

The sputtering apparatus in FIG. 2A includes a treatment chamber 201. The treatment chamber 201 is formed of a material having rigidity, such as aluminum or stainless steel, and is configured to be evacuated to vacuum.

The treatment chamber 201 is provided with an evacuation unit 202. The evacuation unit 202 has a function of evacuating the treatment chamber 201 to vacuum and a function of adjusting the pressure to a predetermined pressure and keeping the pressure constant in the treatment chamber 201 to which a sputtering gas is supplied. The evacuation unit 202 includes a butterfly valve, a stop valve, a cryopump, a turbo molecular pump, a dry pump, and the like.

The treatment chamber 201 is provided with a gas supply unit 204. The gas supply unit 204 supplies a sputtering gas for generating plasma in the treatment chamber 201. Although not illustrated, a mass flow controller or the like which can control the flow rate of the sputtering gas is provided between the treatment chamber 201 and the gas supply unit 204.

The treatment chamber 201 is provided with an electrode 203 and a substrate support 205 facing the electrode 203. The electrode 203 and the substrate support 205 are placed substantially parallel to each other with a certain distance therebetween.

A target 207 can be placed on the electrode 203. The substrate 101 can be placed on the substrate support 205, which is provided with a heater that can heat the substrate 101. The heater is connected to a heater controller (not shown) with which the temperature of the heater can be controlled. Note that the substrate support 205 is formed of a conductive material and functions as an electrode.

A power source 211 is connected to the electrode 203 as a power supply unit, and a power source 215 is connected to the substrate support 205 as a power supply unit. The electrode 203 and a treatment chamber wall 217 are grounded.

A direct current (DC) power source, an alternating current (AC) power source, or a radio frequency (RF) power source can be used as the power source 211 to apply DC power, AC power, or RF power to the electrode 203. Similarly, a DC power source, an AC power source, or an RF power source can be used as the power source 215 to apply DC power, AC power, or RF power to the substrate support 205. Although not illustrated, a matching box may be provided between the power source 211 and the electrode 203 and between the power source 215 and the substrate support 205.

The sputtering apparatus in FIG. 2B has a structure in which a magnet 219 is added to the structure of the sputtering apparatus in FIG. 2A. The magnet 219 may be placed in any manner as long as ionization of the sputtering gas can be promoted with secondary electrons which are sputtered from the target 207 by generation of a magnetic field on the target 207.

Described next are specific steps for forming an oxide semiconductor film in which oxygen vacancies and carrier density are reduced with use of the sputtering apparatus illustrated in FIG. 2A or FIG. 2B.

A target containing any of the above materials which can be used for the oxide semiconductor film 105 is used as the target 207. Here, an oxide semiconductor target containing indium is used.

The substrate 101 is placed on the substrate support 205, and the treatment chamber 201 is evacuated to vacuum with the evacuation unit 202. Then, oxygen as a sputtering gas is supplied from the gas supply unit 204 to the treatment chamber 201, and the pressure (degree of vacuum) inside the treatment chamber 201 is controlled by the evacuation unit 202 to be a desired pressure. Note that a mixed gas including a rare gas in addition to oxygen may be used as a sputtering gas; in that case, the partial pressure of oxygen is preferably high in order that oxygen can be easily supplied to the oxide semiconductor film.

DC power, AC power, or RF power is supplied to the electrode 203 with the power source 211 to cause discharge, whereby oxygen plasma is generated in the treatment chamber 201. The pressure and the voltage in the treatment chamber 201 are controlled as appropriate so that oxygen plasma is generated.

At this time, DC power, AC power, or RF power is supplied to the substrate support 205 with the power source 215, whereby bias power is supplied to the substrate 101 side and self-bias voltage is generated between the oxygen plasma and the substrate 101. For example, bias power is supplied so that oxygen ions in the oxygen plasma move toward the substrate 101 side easily. In other words, bias power is preferably supplied so that the substrate 101 side has a negative potential with respect to the potential of the generated oxygen plasma.

For example, when RF power as bias power is supplied to the substrate 101 side to generate self-bias voltage, the substrate 101 side has a negative potential with respect to the potential of the generated oxygen plasma, which enables oxygen ions (typically, $O^+$ and $O_2^+$) included in the oxygen plasma to move toward the substrate 101 easily. In other words, when atoms sputtered from the target 207 by oxygen ions in the oxygen plasma are deposited on the substrate 101, the oxygen ions move toward the substrate 101 as well; by utilizing this phenomenon, the oxide semiconductor film is formed while oxygen ions are taken in by the oxide semiconductor film. By thus forming the oxide semiconductor film while oxygen ions are taken in, oxygen vacancies formed during the formation of the oxide semiconductor film can be reduced.

Moreover, the number of oxygen ions taken in can be changed by control of the self-bias voltage. For example, oxygen ions taken in by the oxide semiconductor film can be increased by an increase in self-bias voltage. The self-bias voltage can be increased by an increase in bias power supplied to the substrate 101 side. Specifically, the oxide semiconductor film is preferably formed with the self-bias voltage set higher than or equal to 400 V.

Furthermore, by forming the oxide semiconductor film in an oxygen atmosphere as described above, release of Zn from the formed film can be suppressed even when the heating temperature of the substrate 101 is set higher than or equal to 300° C., for example.

A high-purity sputtering gas (here, oxygen) from which hydrogen and moisture have been removed is introduced into the treatment chamber 201 while moisture which remains therein is removed, and the oxide semiconductor film is formed over the substrate 101 with the use of the above target. In order to remove moisture remaining in the treatment chamber 201, an entrapment vacuum pump such as a cryopump, an ion pump, or a titanium sublimation pump is preferably used. As an evacuation unit, a turbo molecular pump to which a cold trap is added may be used. In the treatment chamber 201 which is evacuated with use of the cryopump, a hydrogen atom, a compound containing a hydrogen atom such as water ($H_2O$) (further preferably, a compound containing a carbon atom), and the like are removed, whereby the impurity concentration in the oxide semiconductor film formed in the treatment chamber 201 can be reduced.

After that, the formed oxide semiconductor film is subjected to heat treatment. The temperature of the heat treatment is higher than or equal to 300° C. and lower than or equal to 700° C., or lower than the strain point of the substrate, for example. The heat treatment can be performed under reduced pressure, a nitrogen atmosphere, an oxygen atmosphere, a rare gas atmosphere, or the like. By the heat treatment, hydrogen contained in the formed oxide semiconductor film can be removed.

Note that a heat treatment apparatus used is not limited to an electric furnace, and a device for heating an object to be processed by heat conduction or heat radiation from a heating element such as a resistance heating element may be alternatively used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used. Any of the heat treatment apparatuses given here can be used as appropriate for heat treatment in a method for manufacturing a transistor according to one embodiment of the present invention.

Note that in the heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor film is heated, a high-purity oxygen gas, a high-purity dinitrogen monoxide gas, or ultra-dry air (air with a moisture amount of less than or equal to 20 ppm (−55° C. by conversion into a dew point), preferably less than or equal to 1 ppm, further preferably less than or equal to 10 ppb, in the case where measurement is performed with use of a dew point meter of a cavity ring down laser spectroscopy (CRDS) system) may be introduced into the same furnace. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main constituent material of the oxide semiconductor and that is reduced by the step for removing impurities for dehydration or dehydrogenation, so that the oxide semiconductor film can be a highly-purified, i-type (intrinsic) or substantially i-type oxide semiconductor film.

Through the above method, an oxide semiconductor film in which hydrogen and oxygen vacancies are reduced can be formed. In other words, an oxide semiconductor film with high purity and high resistance can be formed. Specifically, an oxide semiconductor film whose spin density, which is calculated from the peak of a signal detected at a g value (g) of around 1.93 by electron spin resonance spectroscopy, is lower than $9.3\times10^{16}$ spins/cm³, preferably lower than or equal to $5\times10^{16}$ spins/cm³, further preferably below the lower limit of detection and whose carrier density is lower than $1\times10^{15}$/cm³ can be formed.

<Method for Manufacturing Transistor>

Next, a method for manufacturing the transistor 100 is described with reference to drawings.

Figure 3A:
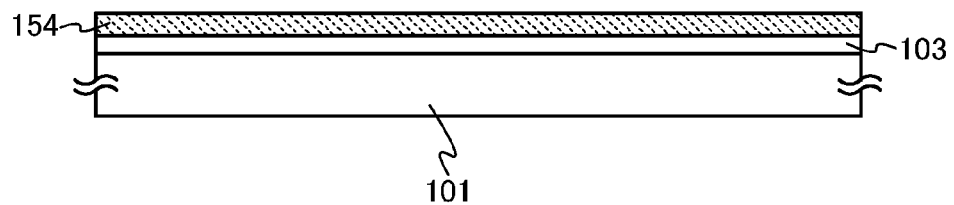
FIGS. 3A to 3D are cross-sectional views illustrating a method for manufacturing a transistor.

First, the substrate 101 is prepared, the base insulating film 103 is formed over the substrate 101, and an oxide semiconductor film 154 is formed over the base insulating film 103 (see FIG. 3A).

Although there is no particular limitation on the substrate 101, it is preferable that the substrate 101 have an insulating surface and at least heat resistance high enough to withstand heat treatment performed later. For example, a variety of glass substrates for electronics industry, such as a barium borosilicate glass substrate or an aluminoborosilicate glass substrate can be used. Note that as the substrate, a substrate having a thermal expansion coefficient of greater than or equal to $25\times10^{-7}/°$ C. and less than or equal to $50\times10^{-7}/°$ C. (preferably greater than or equal to $30\times10^{-7}/°$ C. and less than or equal to $40\times10^{-7}/°$ C.) and a strain point of higher than or equal to 650° C. and lower than or equal to 750° C. (preferably higher than or equal to 700° C. and lower than or equal to 740° C.) is preferably used.

In the case where a large-sized substrate having the size of the fifth generation (1000 mm×1200 mm or 1300 mm×1500 mm), the sixth generation (1500 mm×1800 mm), the seventh generation (1870 mm×2200 mm), the eighth generation (2200 mm×2500 mm), the ninth generation (2400 mm×2800 mm), the tenth generation (2880 mm×3130 mm), or the like is used, minute processing might become difficult owing to shrinkage of the substrate caused by heat treatment or the like in the manufacturing process of a semiconductor device. Therefore, when such a large-sized glass substrate is used as the substrate, the one with a small shrinkage is preferably used. For example, a large-sized glass substrate which has a shrinkage of 20 ppm or less, preferably 10 ppm or less, further preferably 5 ppm or less after heat treatment at 450° C., preferably 500° C. for one hour may be used as the substrate.

As the substrate 101, a ceramic substrate, a quartz substrate, a sapphire substrate, or the like can also be used. Alternatively, a single crystal semiconductor substrate or a polycrystalline semiconductor substrate made of silicon or silicon carbide, a compound semiconductor substrate made of silicon germanium or the like, an SOI substrate, or the like can be used. Still alternatively, any of these substrates provided with a semiconductor element may be used.

The semiconductor device may be manufactured using a flexible substrate as the substrate 101. In order to manufacture a flexible semiconductor device, the transistor 100 may be directly formed over a flexible substrate. Alternatively, the transistor 100 may be formed over a formation substrate, and then, the transistor 100 may be separated and transferred to a flexible substrate. Note that in order to separate the transistor 100 from the formation substrate and transfer it to the flexible substrate, a separation layer may be provided between the formation substrate and the transistor 100. An example of the flexible substrate is a substrate formed using an organic resin such as polyimide or polyester.

In this embodiment, a glass substrate is used as the substrate 101.

The base insulating film 103 is an insulating film which prevents diffusion of an impurity element such as hydrogen or moisture from the substrate 101 into the oxide semiconductor film 105. The base insulating film 103 preferably also has an effect of supplying part of its oxygen to the oxide semiconductor film by being heated in a manufacturing process of the transistor 100 to fill the oxygen vacancies in the oxide semiconductor film. Accordingly, the base insulating film 103 is preferably an insulating film containing oxygen.

For example, one insulating film selected from an oxide insulating film of silicon oxide, gallium oxide, aluminum oxide, or the like, an oxynitride insulating film of silicon oxynitride, aluminum oxynitride, or the like, and a nitride oxide insulating film of silicon nitride oxide or the like, or a stack of any of these films can be used as the base insulating film 103. Note that "silicon nitride oxide" contains more nitrogen than oxygen and "silicon oxynitride" contains more oxygen than nitrogen.

The base insulating film 103 can be formed using any of the materials given above by a chemical vapor deposition (CVD) method, a sputtering method, a molecular beam epitaxy (MBE) method, or a pulsed laser deposition (PLD) method.

In order for the base insulating film 103 to supply part of its oxygen to the oxide semiconductor film by being heated in the manufacturing process of the transistor 100, the base insulating film 103 is preferably an insulating film which releases part of its oxygen by being heated. Specifically, the base insulating film 103 is preferably an insulating film of which the amount of released oxygen converted into oxygen atoms is greater than or equal to $1.0\times10^{18}$ cm$^{-3}$, preferably greater than or equal to $3.0\times10^{20}$ cm$^{3}$, in thermal desorption spectroscopy (TDS) analysis.

A method for quantifying the amount of released oxygen that is converted into oxygen atoms in TDS analysis is described below.

The amount of released gas in TDS analysis is proportional to the integral value of a spectrum. Therefore, the amount of released gas can be calculated from the ratio of the integral value of a spectrum of the insulating film to the reference value of a standard sample. The reference value of a standard sample refers to the ratio of the density of a predetermined atom contained in a sample to the integral value of a spectrum.

For example, the number of oxygen molecules ($N_{O2}$) released from an insulating film can be found according to Formula 1 with the TDS analysis results of a silicon wafer containing hydrogen at a predetermined density, which is the standard sample, and the TDS analysis results of the insulating film. Here, all spectra having a mass number of 32 which are obtained by the TDS analysis are assumed to originate from an oxygen molecule. CH$_3$OH can be given as a gas having a mass number of 32, but is not taken into consideration on the assumption that it is unlikely to be present. Further, an oxygen molecule including an oxygen atom having a mass number of 17 or 18, which is an isotope of an oxygen atom, is also not taken into consideration because the proportion of such a molecule in the natural world is minimal.

$$N_{O2} = \frac{N_{H2}}{S_{H2}} \times S_{O2} \times \alpha \quad \text{[FORMULA 1]}$$

$N_{H2}$ is the value obtained by conversion of the number of hydrogen molecules desorbed from the standard sample into densities. $S_{H2}$ is the integral value of a spectrum of the standard sample which is analyzed by TDS. Here, the reference value of the standard sample is expressed by $N_{H2}/S_{H2}$. $S_{O2}$ is the integral value of a spectrum of the insulating film which is analyzed by TDS. A coefficient affecting the intensity of the spectrum in the TDS analysis is denoted by α. Japanese Published Patent Application No. H6-275697 can be referred to for details of Formula 1. Note that the above value of the amount of released oxygen is obtained by measurement with a thermal desorption spectroscopy apparatus produced by ESCO Ltd., EMD-WA1000S/W using a silicon wafer containing hydrogen atoms at $1\times10^{16}$ cm$^{-3}$ as the standard sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{O2}$ is the number of the released oxygen molecules. In the insulating film, the amount of released oxygen converted into oxygen atoms is twice the number of the released oxygen molecules.

An example of the insulating film which releases part of its oxygen by being heated is an insulating film containing oxygen in a proportion higher than that in the stoichiometric composition, such as a silicon oxynitride film containing excess oxygen or a silicon oxide ($SiO_x$ (x>2)) film containing excess oxygen. In the silicon oxide ($SiO_x$ (x>2)) film containing excess oxygen, the number of oxygen atoms per unit volume is more than twice the number of silicon atoms per unit volume. The number of silicon atoms and the number of oxygen atoms per unit volume are measured by Rutherford backscattering spectrometry.

The insulating film containing oxygen in a proportion higher than that in the stoichiometric composition can be formed, for example, by injecting oxygen ions by an ion implantation method or an ion doping method into an insulating film that is formed using any of the materials and methods given above.

Alternatively, the base insulating film 103 may be formed by a sputtering method which is performed with bias power supplied to the substrate side. With this sputtering method, an insulating film containing oxygen in a proportion higher than that in the stoichiometric composition can be formed as the base insulating film 103. A method for forming the base insulating film 103 is described in detail below.

<Method for Forming Oxide Insulating Film>

In the case where an oxide film which contains an oxide material having an insulating property (hereinafter referred to as an oxide insulating film) is formed as the base insulating film 103, an oxide such as silicon oxide, gallium oxide, hafnium oxide, yttrium oxide, or aluminum oxide, an oxynitride such as silicon oxynitride or aluminum oxynitride, or a nitride oxide such as silicon nitride oxide can be used as the oxide material.

The above method for forming the oxide semiconductor film by a sputtering method is used for the formation with the target 207 changed from the oxide semiconductor target to a target containing any of the oxide materials having insulating properties given above.

Specifically, a target containing any of the above oxide materials or a non-oxide target such as a silicon target can be used as the target 207. Note that an oxide target is preferably used so that oxygen is easily contained in the formed oxide insulating film.

The step of placing the substrate 101 on the substrate support 205, the step of evacuating the treatment chamber 201 to vacuum, and the step of supplying oxygen as a sputtering gas from the gas supply unit 204 to the treatment chamber 201 and controlling the pressure inside the treatment chamber 201 are the same as those in the above method for forming the oxide semiconductor film, and the above description can be referred to.

The subsequent step of supplying power to the electrode 203 with the power source 211 to generate oxygen plasma in the treatment chamber 201 and forming the oxide insulating film is the same as that in the above method for forming the oxide semiconductor film, and the above description can be referred to.

At this time, DC power, AC power, or RF power is supplied to the substrate support 205 with the power source 215, whereby bias power is supplied to the substrate 101 side and self-bias voltage is generated between the oxygen plasma and the substrate 101. For example, bias power is supplied so that oxygen ions in the oxygen plasma move toward the substrate 101 side easily. In other words, bias power is preferably supplied so that the substrate 101 side has a negative potential with respect to the potential of the generated oxygen plasma.

For example, when RF power as bias power is supplied to the substrate 101 side to generate self-bias voltage, the substrate 101 side has a negative potential with respect to the potential of the generated oxygen plasma, which enables oxygen ions (typically, $O^+$ and $O_2^+$) included in the oxygen plasma to move toward the substrate 101 easily. In other words, when atoms sputtered from the target 207 by oxygen ions in the oxygen plasma are deposited on the substrate 101, the oxygen ions move toward the substrate 101 as well; by utilizing this phenomenon, the oxide insulating film is formed while oxygen ions are taken in by the oxide insulating film. By thus forming the oxide insulating film while oxygen ions are taken in, the oxygen content of the formed base insulating film 103 can be increased.

Moreover, the number of oxygen ions taken in by the oxide insulating film can be changed by control of the self-bias voltage. For example, oxygen ions taken in by the oxide insulating film can be increased by an increase in self-bias voltage. To increase the self-bias voltage, bias power supplied to the substrate 101 side is increased. Specifically, the oxide insulating film is preferably formed with the self-bias voltage set higher than or equal to 400 V.

A high-purity sputtering gas (here, oxygen) from which hydrogen and moisture have been removed is preferably introduced into the treatment chamber 201 while moisture which remains therein is removed. As an evacuation unit, a turbo molecular pump to which a cold trap is added may be used. In the treatment chamber 201 which is evacuated with use of the cryopump, a hydrogen atom, a compound containing a hydrogen atom such as water ($H_2O$) (further preferably, a compound containing a carbon atom), and the like are removed, whereby the impurity concentration in the oxide insulating film formed in the treatment chamber 201 can be reduced.

It can be said that the oxide insulating film formed by the above method contains excess oxygen, the proportion of which is higher than that in the stoichiometric composition.

In the manufacturing process of the transistor 100, hydrogen that is contained in the base insulating film 103 diffuses into the oxide semiconductor film 105 to reduce the resistance thereof, and thus might cause the transistor 100 to have poor electric characteristics. Therefore, hydrogen in the base insulating film 103 is preferably reduced.

To remove hydrogen, moisture, or the like contained in the base insulating film 103, heat treatment is preferably performed at a temperature higher than or equal to 300° C. and lower than or equal to 700° C., or lower than the strain point of the substrate under reduced pressure, a nitrogen atmosphere, an oxygen atmosphere, a rare gas atmosphere, or the like before the injection of oxygen ions.

The thickness of the base insulating film 103 may be greater than or equal to 5 nm and less than or equal to 3000 nm; here, the base insulating film 103 is formed with a thickness of 300 nm.

In this embodiment, an insulating film containing oxygen in a proportion higher than that in the stoichiometric composition, specifically, a silicon oxynitride film containing excess oxygen is used as the base insulating film 103.

Note that the base insulating film 103 is not necessarily provided, and the oxide semiconductor film may be formed directly on the substrate 101. For example, in the case where a flexible substrate is used as the substrate 101, the oxide semiconductor film may be formed over the base insulating film 103 over the flexible substrate or may be formed directly on the flexible substrate.

A metal oxide containing two or more metal elements can be used as an oxide semiconductor used for the oxide semiconductor film 154. For example, an oxide semiconductor containing at least indium is preferable. An oxide semiconductor containing at least indium (In) and zinc (Zn) and in which the proportion of indium is higher than that of zinc is also preferable. As a stabilizer for reducing variation in electric characteristics of transistors, the oxide semiconductor preferably contains one or more elements selected from gallium (Ga), tin (Sn), hafnium (Hf), aluminum (Al), and zirconium (Zr).

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

Specifically, the following can be used: an oxide containing two kinds of metal, such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, an oxide containing three kinds of metal, such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or an oxide containing four kinds of metal, such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide, and the like. Note that indium oxide can be used instead of the metal oxide containing two or more metal elements.

For example, an In—Ga—Zn-based oxide means an oxide containing In, Ga, and Zn as its main components. The proportion of indium is preferably higher than that of zinc. The In—Ga—Zn-based oxide may contain a metal element other than the In, Ga, and Zn.

A material represented by $InMO_3(ZnO)_m$ (m>0, m is not an integer) may be used as the oxide semiconductor. Note that M represents one or more metal elements selected from Ga, Fe, Mn, and Co. Alternatively, a material represented by $In_2SnO_5(ZnO)_n$ (n>0, n is an integer) may be used as the oxide semiconductor.

For example, an oxide containing In, Ga, and Zn at the atomic ratio, In:Ga:Zn=a:b:c (a+b+c=1), can be used. Alternatively, an oxide whose composition is in the neighborhood of that of an oxide containing In, Ga, and Zn at the atomic ratio, In:Ga:Zn=a:b:c (a+b+c=1), can be used. Note that in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. The same applies to other oxides. For example, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or any of oxides whose composition is in the neighborhood of the above compositions can be used as the In—Ga—Zn-based oxide.

In the case of using an In—Sn—Zn-based oxide, high field-effect mobility can be obtained relatively easily. Note that field-effect mobility can be increased by reducing the defect density in a bulk also in the case of using an In—Ga—Zn-based oxide.

For example, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

The base insulating film 103 and the oxide semiconductor film 154 are preferably formed in succession without exposure to the air. By successive formation of the base insulating film 103 and the oxide semiconductor film 154 without exposure to the air, impurities such as hydrogen and moisture can be prevented from being adsorbed onto a surface of the base insulating film 103.

In this embodiment, a 20 nm thick IGZO film is formed as the oxide semiconductor film 154.

In the case where the oxide semiconductor film is formed over the base insulating film 103 by the above formation method, the oxide semiconductor film is subjected to heat treatment in a state of being in contact with the base insulating film 103. Thus, part of oxygen contained in the base insulating film 103 is released by the heat treatment and supplied to the oxide semiconductor film, whereby the interface state density between the oxide semiconductor film and the base insulating film 103 can be reduced and oxygen vacancies in the oxide semiconductor film formed by the above formation method can be filled.

The heat treatment is preferably performed before the oxide semiconductor film 154 is processed into a desired shape. In that case, oxygen contained in the base insulating film 103 can be prevented from being released outside by the heat treatment.

Figure 3B:
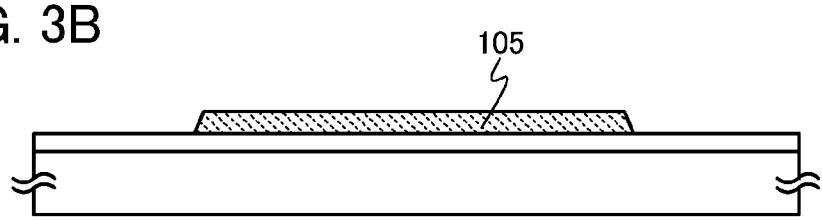

After the oxide semiconductor film is formed by the above formation method, the oxide semiconductor film is processed into the oxide semiconductor film 105 by a photolithography step and an etching step (see FIG. 3B). A resist mask for forming the island-shaped oxide semiconductor film 105 may be formed by an inkjet method. Formation of the resist mask by an inkjet method needs no photomask; thus, manufacturing cost can be reduced. Resist masks which are used in later manufacturing steps can be formed by an inkjet method or the like instead of a photolithography step.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. In addition, ITO07N (produced by KANTO CHEMICAL CO., INC.) may also be used.

Note that the oxide semiconductor film may be processed into a desired shape or may remain in the form of a film without being processed. In addition, an element isolation region formed using an insulating film may be provided to isolate the oxide semiconductor film for each element.

Figure 3C:
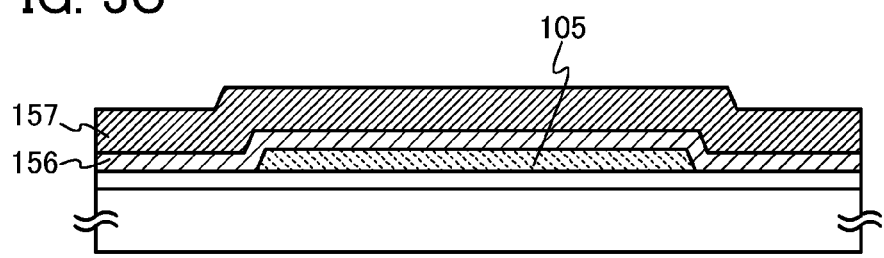

Next, an insulating film 156 which is to be processed into the gate insulating film 113 is formed over the base insulating film 103 and the oxide semiconductor film 105, and a conductive film 157 which is to be processed into the gate electrode 117 is formed over the insulating film 156 (see FIG. 3C).

The gate insulating film 113 can be formed with a structure and a method similar to those of the base insulating film 103. By using an insulating film which releases part of its oxygen by being heated as the gate insulating film 113, oxygen released from the gate insulating film 113 by the heat treatment in the manufacturing process of the transistor 100 can be supplied to the oxide semiconductor film to fill the oxygen vacancies in the oxide semiconductor film (particularly in the channel formation region). Consequently, the manufactured transistor 100 can have favorable electric characteristics.

Further, the gate insulating film 113 can be formed using a high-k material such as hafnium oxide, yttrium oxide, hafnium silicate ($HfSi_xO_y$ (x>0, y>0)), hafnium silicate to which nitrogen is added ($HfSi_xO_yN_z$ (x>0, y>0, z>0)), hafnium aluminate ($HfAl_xO_y$ (x>0, y>0)), or lanthanum oxide. By using such a material, gate leakage current can be reduced.

The thickness of the insulating film 156 is greater than or equal to 5 nm and less than or equal to 200 nm. To increase on-state current and field-effect mobility, the insulating film 156 that is processed into the gate insulating film 113 is preferably formed thin. For example, the thickness of the insulating film 156 is preferably greater than or equal to 5 nm and less than or equal to 20 nm, further preferably greater than or equal to 5 nm and less than or equal to 10 nm.

High-density plasma CVD using microwaves (e.g., a frequency of 2.45 GHz) enables a dense, high-quality insulating film having high withstand voltage to be formed. For example, a silicon oxynitride film may be formed by high-density plasma CVD using a silane gas and nitrogen monoxide as source gases. Note that, in addition to the source gases, argon or nitrogen may be used as a dilution gas.

Here, oxygen ions are injected, by an ion implantation method or an ion doping method, into a silicon oxynitride film that is formed by plasma CVD, whereby a silicon oxynitride film containing excess oxygen is formed as the insulating film 156. In this embodiment, a 20 nm thick silicon oxynitride film containing excess oxygen is formed.

It is also possible to form a silicon oxynitride film containing excess oxygen as the insulating film 156 using a method similar to that used for the base insulating film 103.

In the manufacturing process of the transistor 100, hydrogen that is contained in the insulating film 156 diffuses into the oxide semiconductor film to reduce the resistance thereof, and thus might cause the transistor 100 to have poor electric characteristics. Therefore, hydrogen in the insulating film 156 is preferably reduced. Thus, similarly to the base insulating film 103, the silicon oxynitride film formed as the insulating film 156 may be subjected to heat treatment for dehydrogenation or dehydration. The heat treatment is performed at a temperature higher than or equal to 300° C. and lower than or equal to 700° C., or lower than the strain point of the substrate 101 under reduced pressure, a nitrogen atmosphere, an oxygen atmosphere, a rare gas atmosphere, or the like. Note that part of oxygen released from the insulating film 156 is supplied to the oxide semiconductor film 105 owing to the heat treatment. Thus, oxygen vacancies in the oxide semiconductor film 105 can be reduced, so that a high-performance semiconductor device having favorable electric characteristics can be manufactured.

Examples of a material that can be used for the gate electrode 117 are metal materials such as molybdenum, titanium, tantalum, tungsten, aluminum, copper, neodymium, scandium, and chromium, and alloy materials which contain any of these elements. Further, the gate electrode 117 may be formed using a conductive metal oxide material. As the conductive metal oxide material, indium oxide ($In_2O_3$), tin oxide ($SnO_2$), zinc oxide (ZnO), indium tin oxide ($In_2O_3$—$SnO_2$, which is abbreviated to ITO in some cases), indium zinc oxide ($In_2O_3$—ZnO), or any of these metal oxide materials in which silicon or silicon oxide is contained can be used. Alternatively, the gate electrode 117 may be formed using a conductive metal nitride material.

The gate electrode 117 can be formed with a single-layer structure or a stacked-layer structure using any of the above materials. For example, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a two-layer structure in which a tungsten film is stacked over a tantalum nitride film, a two-layer structure in which a tungsten film is stacked over a tungsten nitride film, and a three-layer structure in which a titanium film, an aluminum film, and a titanium film are stacked in this order can be given. Note that the gate electrode 117 can also be formed using a transparent conductive material containing indium oxide, tin oxide, or zinc oxide.

Further, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (such as an indium nitride film, a zinc nitride film, a tantalum nitride film, or a tungsten nitride film) is preferably provided between the gate electrode 117 and the gate insulating film 113. These films each have a work function of 5 eV or higher, preferably 5.5 eV or higher; thus, the threshold voltage, which is one of the electric characteristics of the transistor 100, can be positive. Accordingly, the transistor 100 can be a so-called normally-off transistor. For example, in the case of using an In—Ga—Zn—O film containing nitrogen, an In—Ga—Zn—O film having a nitrogen concentration at least higher than that of the oxide semiconductor film 105 is used; specifically, an In—Ga—Zn—O film containing nitrogen atoms at a concentration higher than or equal to 7 at. % is used.

The conductive film 157 can be formed by a CVD method, a sputtering method, an MBE method, a PLD method, or a vacuum evaporation method. In this embodiment, a 30 nm thick tantalum nitride film over the insulating film 156 and a 200 nm thick tungsten film over the tantalum nitride film are formed as the conductive film 157 by a sputtering method.

Figure 3D:
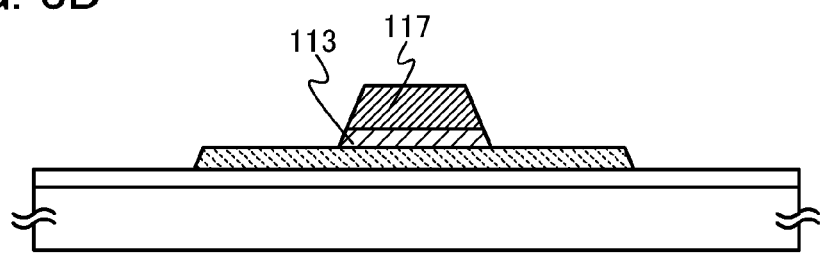

Next, by a photolithography step and an etching step, the conductive film 157 and the insulating film 156 are processed, so that the gate electrode 117 and the gate insulating film 113 are formed, respectively (see FIG. 3D). Here, the etching step may be wet etching, dry etching, or both of them.

Figure 4A:
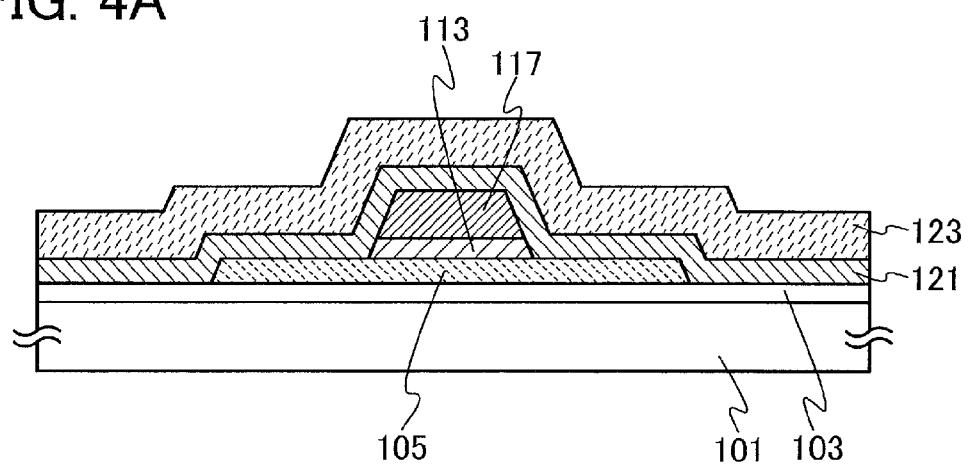
FIGS. 4A and 4B are cross-sectional views illustrating a method for manufacturing a transistor.

Then, the metal oxide film 121 having an insulating property is formed to cover the base insulating film 103, the oxide semiconductor film 105, the gate insulating film 113, and the gate electrode 117, and the interlayer insulating film 123 is formed over the metal oxide film 121 having an insulating property (see FIG. 4A).

The metal oxide film 121 having an insulating property is preferably an inorganic insulating film which is formed of a material different from that of the gate insulating film 113, particularly a dense inorganic insulating film. An aluminum oxide film formed by a sputtering method can be given as an example of the dense inorganic insulating film. By using an aluminum oxide film having high density (a film density of 3.2 g/cm$^3$ or higher, preferably 3.6 g/cm$^3$ or higher), the following effects can be obtained: an impurity such as moisture in the outside air is prevented from entering the oxide semiconductor film 105, and oxygen, which is one of constituent elements of the transistor 100, is prevented from being released outside the transistor 100. Thus, the metal oxide film 121 having an insulating property functions as a barrier film which prevents entry of moisture and the like to the oxide semiconductor film 105 (particularly to the channel formation region) and also as a barrier film which prevents release of oxygen, which is a main constituent material of the oxide semiconductor film 105, in and after the manufacturing process of the transistor 100, and thus enables the manufactured transistor 100 to have favorable electric characteristics. Note that the film density can be measured by Rutherford backscattering spectrometry (RBS) or X-ray reflection (XRR).

Here, an aluminum oxide film is formed by a sputtering method as the metal oxide film 121 having an insulating property. The thickness of the metal oxide film 121 having an insulating property is preferably greater than or equal to 5 nm and less than or equal to 200 nm, further preferably greater than or equal to 5 nm and less than or equal to 50 nm; here, a 20 nm thick aluminum oxide film is formed.

The interlayer insulating film 123 can be formed with a material and a method given in the description of the base insulating film 103. In this embodiment, a 400 nm thick silicon oxynitride film is formed by a plasma CVD method.

Heat treatment is preferably performed at least after the formation of the metal oxide film 121 having an insulating property. This heat treatment can be performed in a manner similar to that of the heat treatment performed after the oxide semiconductor film 154 is formed over the base insulating film 103. Owing to this heat treatment, part of oxygen contained in the base insulating film 103 and the gate insulating film 113 can be supplied to the interface between the base insulating film 103 and the oxide semiconductor film 105 (particularly the channel formation region), the interface between the gate insulating film 113 and the oxide semiconductor film 105 (particularly the channel formation region), and the oxide semiconductor film 105 to reduce the interface state density of each interface and fill the oxygen vacancies in the oxide semiconductor film 105.

Moreover, the metal oxide film 121 having an insulating property has an effect of preventing oxygen contained in the base insulating film 103 and the gate insulating film 113 from being released outside, which enables the interface state density to be reduced and oxygen vacancies to be filled efficiently and sufficiently. Accordingly, in the transistor 100, carrier trapping at the interface between the base insulating film 103 and the oxide semiconductor film 105 and the interface between the gate insulating film 113 and the oxide semiconductor film 105, which is caused by the operation of the transistor or the like, is suppressed; thus, the transistor 100 has excellent reliability. The oxide semiconductor film 105 has fewer electrons due to oxygen vacancies, and the metal oxide film 121 having an insulating property has an effect of preventing entry of an impurity such as hydrogen or moisture in the outside air, which also enables the transistor 100 to have excellent reliability. Note that hydrogen and moisture contained in the interlayer insulating film 123 can be removed by performing the heat treatment after the formation of the interlayer insulating film 123.

Figure 4B:
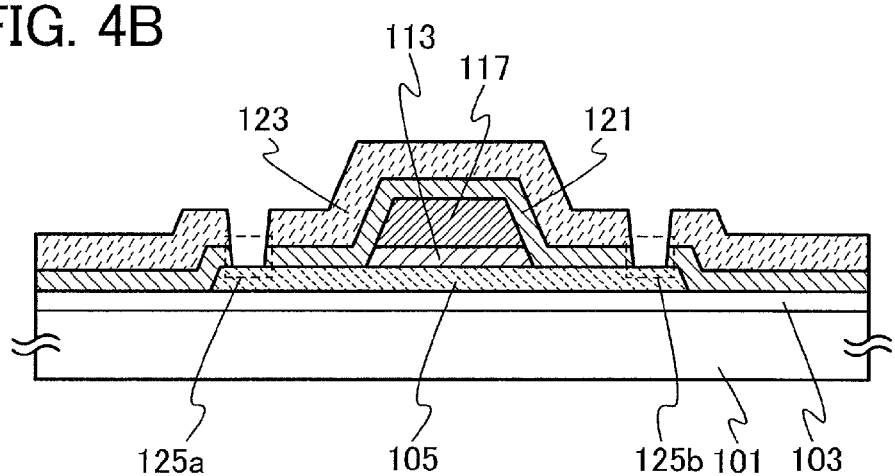

Next, a photolithography step and an etching step are performed on the metal oxide film 121 having an insulating property and the interlayer insulating film 123, whereby the openings 125a and 125b reaching the oxide semiconductor film 105 are formed (see FIG. 4B). A conductive film is formed over the openings 125a and 125b and subjected to a photolithography step and an etching step; thus, the source electrode 127a and the drain electrode 127b are formed (see FIG. 1B).

The source electrode 127a and the drain electrode 127b can be formed with a material and a method given in the description of the gate electrode 117. Besides that material, a metal nitride material containing any of molybdenum, titanium, tantalum, tungsten, aluminum, copper, neodymium, scandium, and chromium as its component (e.g., titanium nitride, molybdenum nitride, or tungsten nitride) may be used for the source electrode 127a and the drain electrode 127b. Alternatively, the source electrode 127a and the drain electrode 127b may have a structure in which a high-melting-point metal such as titanium, molybdenum, or tungsten, or a metal nitride material of any of these high-melting-point metals (titanium nitride, molybdenum nitride, or tungsten nitride) is stacked either or both over and under a metal such as aluminum or copper. In this embodiment, the source electrode 127a and the drain electrode 127b are formed by stacking titanium, aluminum, and titanium in this order.

In addition, a planarization insulating film may be formed over the interlayer insulating film 123 in order to reduce surface unevenness due to the transistor. For the planarization insulating film, an organic material such as polyimide, an acrylic resin, or a benzocyclobutene-based resin can be used. Other than such organic materials, it is also possible to use a low-dielectric constant material (a low-k material) or the like. Note that the planarization insulating film may be formed by stacking a plurality of insulating films formed from these materials.

Figure 5:
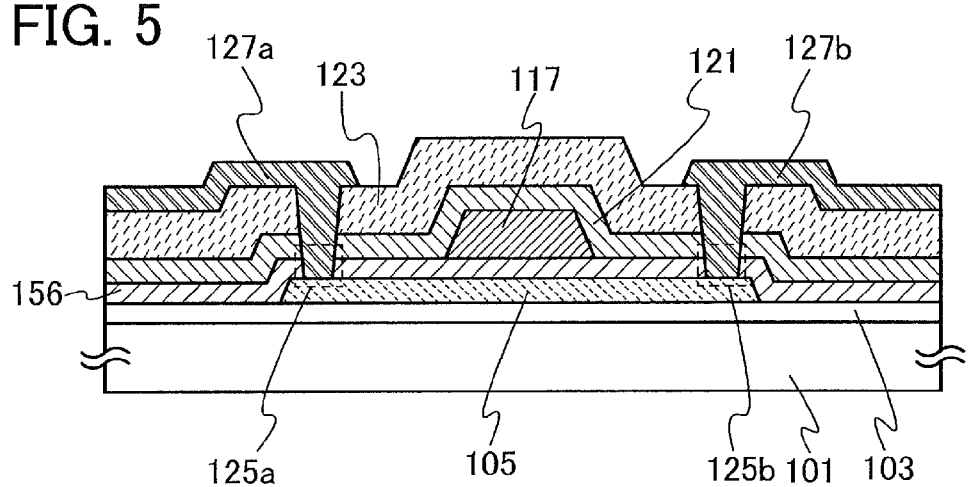
FIG. 5 is a cross-sectional view illustrating a method for manufacturing a transistor.

By processing only the conductive film 157 in the step of processing the insulating film 156 and the conductive film 157 into the gate insulating film 113 and the gate electrode 117, and by forming openings in the insulating film 156, a transistor in which the insulating film 156 serves as a gate insulating film can be manufactured (see FIG. 5). Note that in order to process only the conductive film 157, etching conditions are set such that the etching selectivity ratio of the conductive film 157 to the insulating film 156 is high.

As described above, bias power is supplied to the substrate side in an oxygen atmosphere and an oxide semiconductor film is formed by a sputtering method with self-bias voltage controlled, and then heat treatment is performed, whereby an oxide semiconductor film which contains excess oxygen and in which hydrogen and oxygen vacancies are reduced can be formed. A transistor manufactured using the oxide semiconductor film, in which charge due to hydrogen and oxygen vacancies in the oxide semiconductor film is reduced, achieves at least a suppression of a shift of the threshold voltage in the negative direction and a reduction in the off-state current. Accordingly, one embodiment of the present invention can provide a high-performance semiconductor device having favorable electric characteristics.

Note that the structures, methods, and the like described in this embodiment can be used as appropriate in combination with any of the structures, methods, and the like described in the other embodiments and example.

Embodiment 2

In this embodiment, a semiconductor device having a structure which is partly different from that of the semiconductor device described in the above embodiment will be described. Note that a transistor will be described as an example of the semiconductor device also in this embodiment. In this embodiment, the drawings (including reference numerals and hatching patterns) and descriptions in the above embodiment are used as appropriate, and points described in the above embodiment are not repeated in some cases.

The transistor described in this embodiment has a structure in which the oxide semiconductor film of the transistor described in the above embodiment includes a first region functioning as a channel formation region and a pair of second regions having lower resistance than the first region and functioning as a source region and a drain region. The first region and the pair of second regions can be formed in a self-aligned manner by injection of a dopant with use of the gate electrode as a mask.

<Structure Example of Transistor>

Figure 6A:
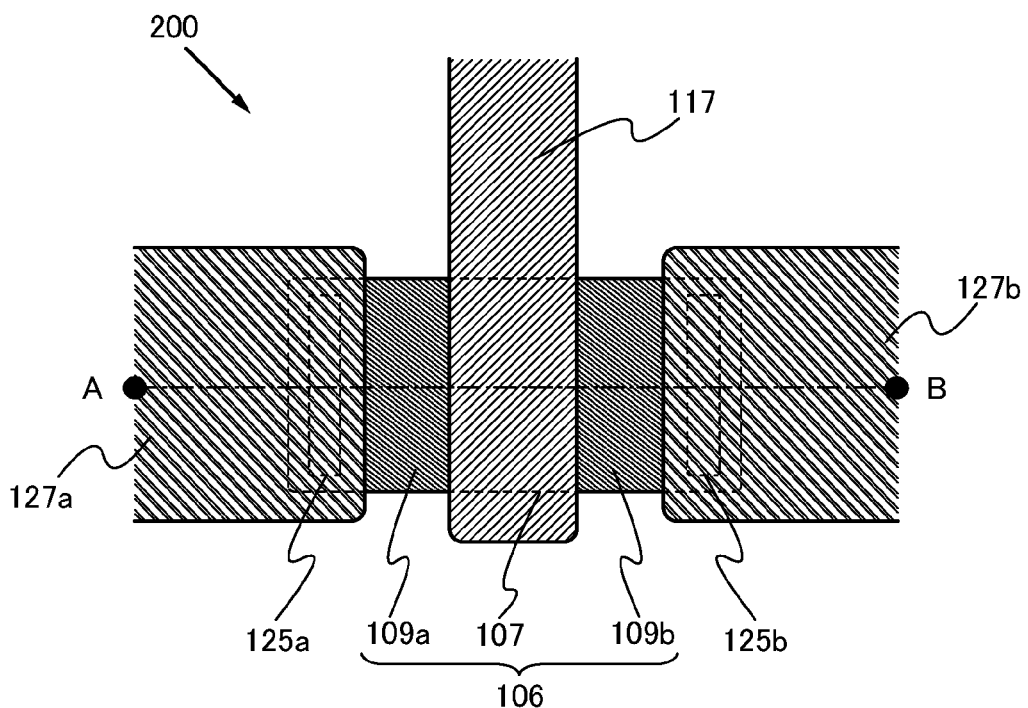
FIGS. 6A and 6B are a top view and a cross-sectional view illustrating an example of a transistor.
Figure 6B:
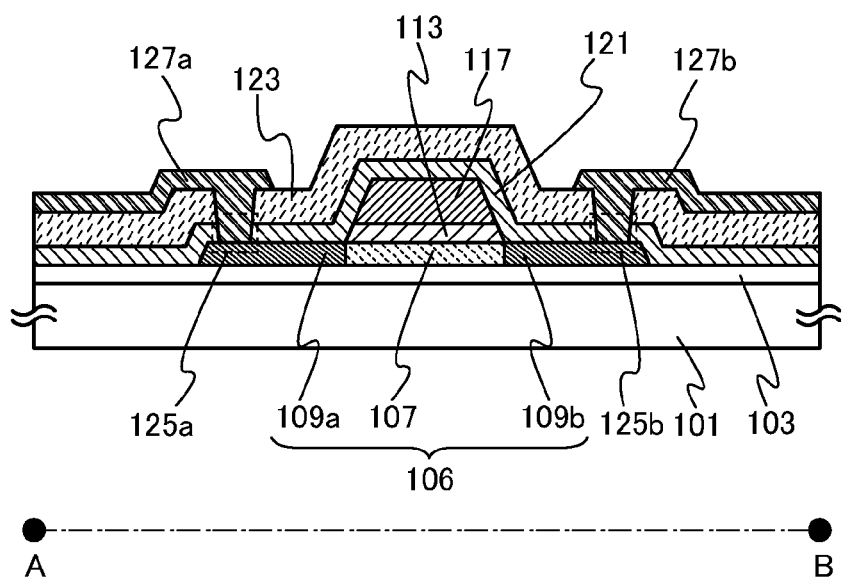

FIGS. 6A and 6B are a top view and a cross-sectional view which illustrate a transistor 200. FIG. 6A is a top view of the transistor 200, and FIG. 6B is a cross-sectional view taken along dashed-dotted line A-B in FIG. 6A. Note that in FIG. 6A, some components of the transistor 200 (e.g., the substrate 101, the base insulating film 103, and the gate insulating film 113) are omitted for simplicity.

According to FIGS. 6A and 6B, in the transistor 200, the base insulating film 103 is provided over the substrate 101, an oxide semiconductor film 106 is provided over the base insulating film 103, the gate insulating film 113 is provided over the oxide semiconductor film 106, the gate electrode 117 is provided over the gate insulating film 113, the metal oxide film 121 having an insulating property is provided over the base insulating film 103, the oxide semiconductor film 106, the gate insulating film 113, and the gate electrode 117, the interlayer insulating film 123 is provided over the metal oxide film 121 having an insulating property, and the source electrode 127a and the drain electrode 127b are provided in contact with the oxide semiconductor film 106 through the openings 125a and 125b formed in the metal oxide film 121 having an insulating property and the interlayer insulating film 123. Note that the base insulating film 103 and the interlayer insulating film 123 are not necessarily provided.

The oxide semiconductor film 106 includes a first region 107 and a pair of second regions 109a and 109b facing each other with the first region 107 provided therebetween. In the oxide semiconductor film 106, the first region 107 does not contain the dopant and the pair of second regions 109a and 109b contains the dopant. The pair of second regions 109a and 109b has lower resistance than the first region 107.

The concentration of the dopant contained in the pair of second regions 109a and 109b is preferably higher than or equal to $5 \times 10^{18}/cm^3$ and lower than or equal to $1 \times 10^{22}/cm^3$.

The gate electrode 117 is provided so as to face the first region 107 of the oxide semiconductor film 106 with the gate insulating film 113 therebetween. The source electrode 127a and the drain electrode 127b are provided in contact with upper surfaces of the pair of second regions 109a and 109b. Accordingly, the first region 107 overlapping with the gate electrode 117 with the gate insulating film 113 therebetween functions as a channel formation region and the pair of second regions 109a and 109b functions as a source region and a drain region.

In the oxide semiconductor film 106, the first region 107 functioning as a channel formation region is an oxide semiconductor film with high purity and high resistance in which hydrogen and oxygen vacancies are reduced. Specifically, the spin density of the first region 107, which is calculated from the peak of a signal detected at a g value (g) of around 1.93 by electron spin resonance spectroscopy, is lower than $9.3 \times 10^{16}$ spins/cm$^3$, preferably lower than or equal to $5 \times 10^{16}$ spins/cm$^3$, further preferably below the lower limit of detection, and the carrier density thereof is lower than $1 \times 10^{15}/cm^3$.

The hydrogen concentration in the first region 107 is lower than $5 \times 10^{18}$ atoms/cm$^3$, preferably lower than or equal to $5 \times 10^{17}$ atoms/cm$^3$. Note that the hydrogen concentration is measured by SIMS.

Similarly to the transistor 100, the transistor 200 is a top-gate transistor. Details of the substrate 101, the base insulating film 103, the gate insulating film 113, the gate electrode 117, the metal oxide film 121 having an insulating property, the interlayer insulating film 123, the source electrode 127a, and the drain electrode 127b of the transistor 200, as well as a material that can be used for the oxide semiconductor film 106, are similar to those described in Embodiment 1.

In a transistor including an oxide semiconductor, a short channel length might cause degradation of electric characteristics, such as a shift of threshold voltage. Thus, in the transistor 200, for example, the pair of second regions 109a and 109b is provided on the ends of the first region 107, whereby an electric field applied between the source region and the drain region of the oxide semiconductor film 106, particularly electric-field concentration in the vicinity of the drain region can be reduced. Consequently, degradation of electric characteristics can be prevented. Owing to a reduction in electric-field concentration, the transistor can be prevented from being damaged by the electric-field concentration.

Further, since the resistance of the pair of second regions 109a and 109b is reduced, the contact resistance with the source electrode 127a and the drain electrode 127b is reduced.

According to the above, the transistor 200 has favorable electric characteristics, degradation of which is prevented. Specifically, the off-state current is reduced, the on-state current, field-effect mobility, and withstand voltage are increased, and a shift of the threshold voltage in the negative direction is suppressed.

<Method for Manufacturing Transistor>

Next, a method for manufacturing the transistor 200 is described with reference to drawings.

Steps from the preparation of the substrate 101 to the formation of the gate insulating film 113 and the gate electrode 117 can be performed in a manner similar to that in the method for manufacturing the transistor 100 (see FIGS. 3A to 3D).

Figure 7A:
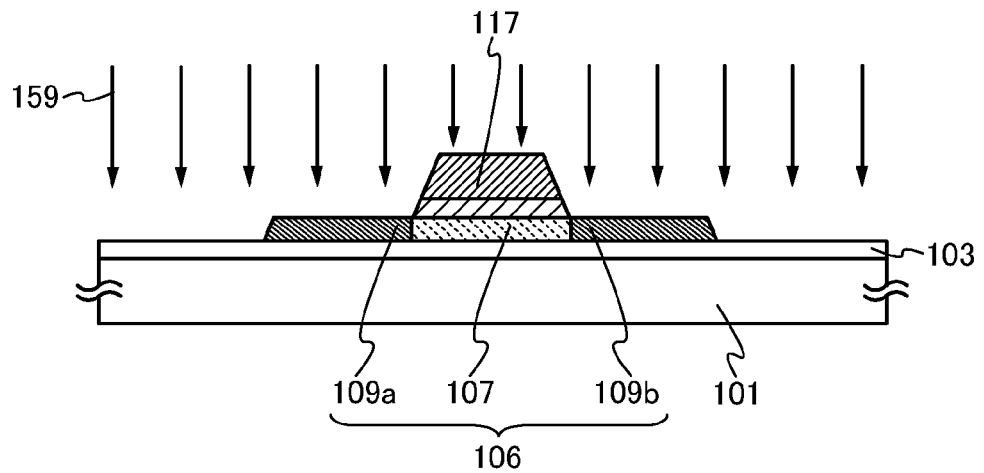
FIGS. 7A to 7C are cross-sectional views illustrating a method for manufacturing a transistor.

Next, a dopant 159 is injected into the oxide semiconductor film 105 with use of the gate electrode 117 as a mask to provide the oxide semiconductor film 106 including the first region 107 and the pair of second regions 109a and 109b having lower resistance than the first region 107 and containing the dopant 159 (see FIG. 7A). As the dopant 159, one or more elements selected from boron, nitrogen, fluorine, aluminum, phosphorus, arsenic, indium, tin, antimony, helium, neon, argon, krypton, and xenon may be used. Note that the dopant may be injected by an ion implantation method or an ion doping method. Alternatively, plasma treatment or heat treatment may be performed in an atmosphere containing a dopant that reduces the resistance of the oxide semiconductor film 105 so that the dopant is injected into the oxide semiconductor film 105. It is preferable to employ an ion implantation method.

The dopant 159 is injected with injection conditions, e.g., acceleration voltage and dose, set as appropriate. For example, in the case where phosphorus is used as the dopant 159 and phosphorus ions are injected by an ion implantation method, the acceleration voltage can be 30 kV, and the dose can be greater than or equal to $1\times10^{13}$ ions/cm$^2$ and less than or equal to $5\times10^{16}$ ions/cm$^2$, specifically $1\times10^{15}$ ions/cm$^2$.

Note that heat treatment may be performed after the dopant 159 is injected into the oxide semiconductor film 105 by an ion implantation method. The heat treatment is performed at a temperature higher than or equal to 300° C. and lower than or equal to 700° C., or higher than or equal to 300° C. and lower than the strain point of the substrate under an oxygen atmosphere, a nitrogen atmosphere, reduced pressure, or the air (ultra-dry air). For example, the heat treatment is preferably performed at a temperature higher than or equal to 300° C. and lower than or equal to 450° C. for one hour in an oxygen atmosphere.

In the case where the regions containing the dopant 159 in the oxide semiconductor film 106 are amorphous, hydrogen contained in the first region 107 easily diffuses into the regions containing the dopant 159 during heat treatment performed in any step after the injection of the dopant 159 in the manufacturing process of the transistor 200. Thus, hydrogen in the first region 107 is reduced, whereby the first region 107 is highly purified, and the resistance of the regions containing the dopant 159 is further reduced.

In the case where the oxide semiconductor film 105 is a crystalline oxide semiconductor film, a portion of the oxide semiconductor film 105 becomes amorphous by the injection of the dopant 159 in some cases. In that case, the crystallinity of the portion which has become amorphous can be recovered by heat treatment at a temperature high enough for the region to be crystallized.

Figure 7B:
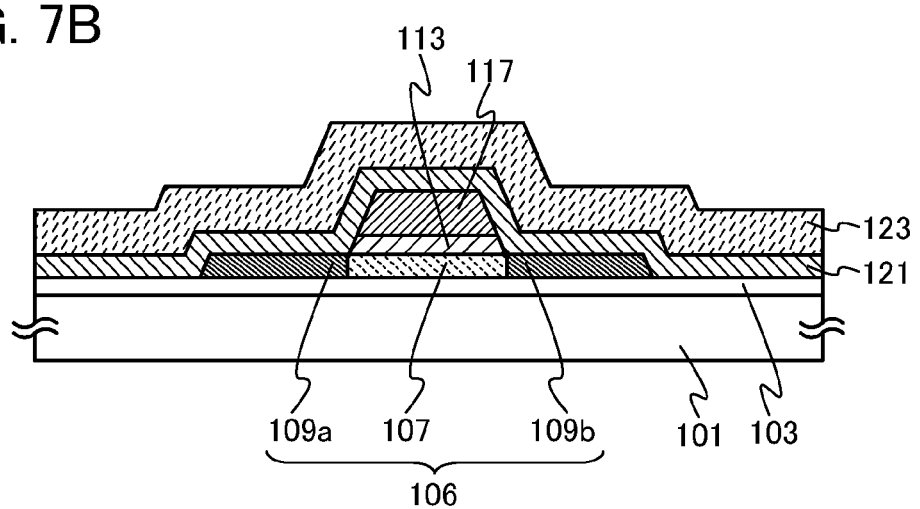

Then, the metal oxide film 121 having an insulating property is formed to cover the base insulating film 103, the oxide semiconductor film 106, the gate insulating film 113, and the gate electrode 117, and the interlayer insulating film 123 is formed over the metal oxide film 121 having an insulating property (see FIG. 7B). Note that the metal oxide film 121 having an insulating property and the interlayer insulating film 123 can be formed in a manner similar to that in the method for manufacturing the transistor 100.

In the method for manufacturing the transistor 200 as well as in the method for manufacturing the transistor 100, heat treatment is preferably performed at least after the formation of the metal oxide film 121 having an insulating property. Owing to this heat treatment, part of oxygen contained in the base insulating film 103 and the gate insulating film 113 can be supplied to the interface between the base insulating film 103 and the oxide semiconductor film 106 (particularly the first region 107), the interface between the gate insulating film 113 and the oxide semiconductor film 106 (particularly the first region 107), and the oxide semiconductor film 106 to reduce the interface state density of each interface and fill the oxygen vacancies in the oxide semiconductor film 106.

Moreover, the metal oxide film 121 having an insulating property has an effect of preventing oxygen contained in the base insulating film 103 and the gate insulating film 113 from being released outside, which enables the interface state density to be reduced and oxygen vacancies to be filled efficiently and sufficiently. Accordingly, in the transistor 200, carrier trapping at the interface between the base insulating film 103 and the oxide semiconductor film 106 and the interface between the gate insulating film 113 and the oxide semiconductor film 106, which is caused by the operation of the transistor or the like, is suppressed; thus, the transistor 200 has excellent reliability. The oxide semiconductor film 106 has fewer electrons due to oxygen vacancies, and the metal oxide film 121 having an insulating property has an effect of preventing entry of an impurity such as hydrogen or moisture in the outside air, which also enables the transistor 200 to have excellent reliability. Note that hydrogen and moisture contained in the interlayer insulating film 123 can be removed by performing the heat treatment after the formation of the interlayer insulating film 123.

Figure 7C:
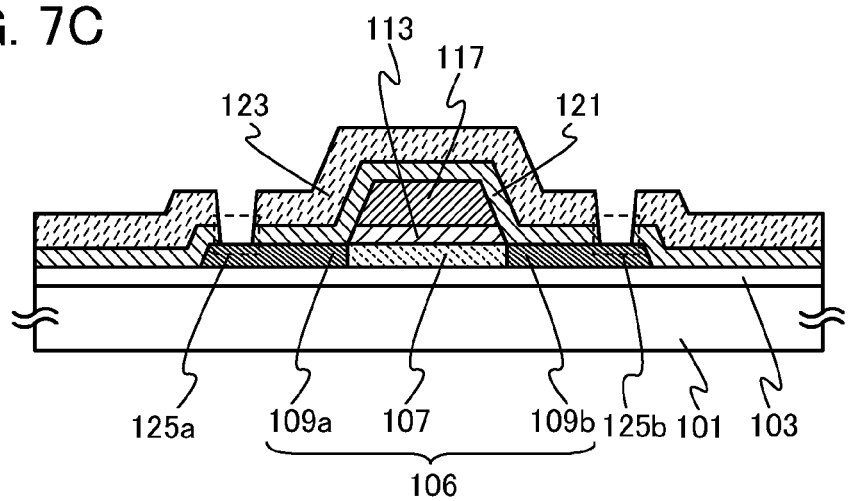

Next, as in the above embodiment, the openings 125a and 125b reaching the pair of second regions 109a and 109b of the oxide semiconductor film 106 are formed in the metal oxide film 121 having an insulating property and the interlayer insulating film 123 (see FIG. 7C). As in the above embodiment, the source electrode 127a and the drain electrode 127b are formed over the openings 125a and 125b (see FIG. 6B).

In addition, as in the transistor 100, a planarization insulating film may be formed over the interlayer insulating film 123 in order to reduce surface unevenness due to the transistor.

Figure 8A:
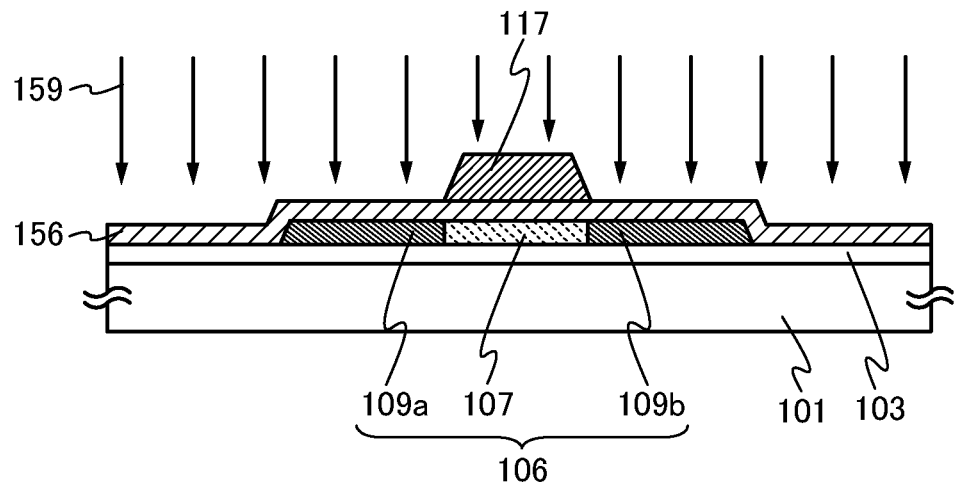
FIGS. 8A and 8B are cross-sectional views illustrating a method for manufacturing a transistor.
Figure 8B:
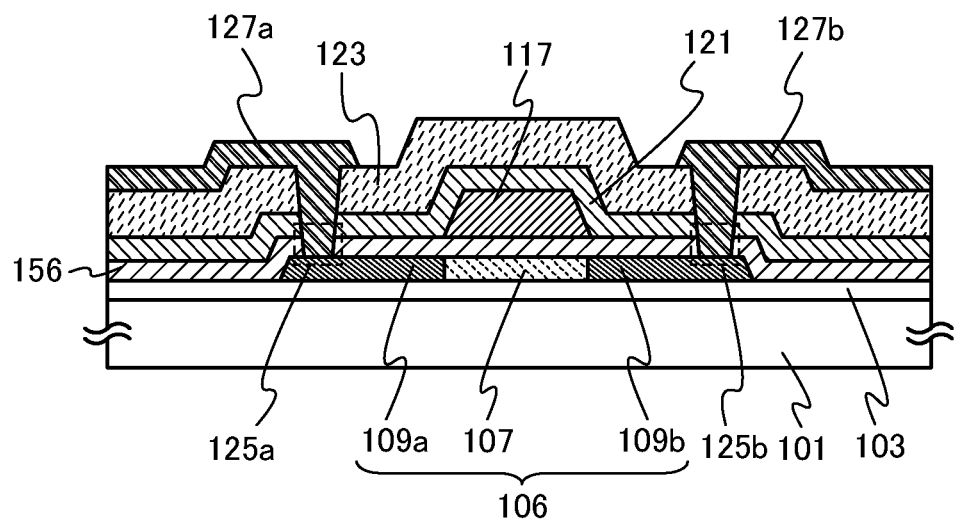

In the above manufacturing method, the dopant 159 is directly injected into the oxide semiconductor film 105. Another example is described here. The insulating film 156 covers the oxide semiconductor film 105 without being processed like the gate insulating film 113, and the dopant 159 is injected into the oxide semiconductor film 105 through the insulating film 156 to provide the oxide semiconductor film 106 (see FIG. 8A). The insulating film 156 is used as a gate insulating film (see FIG. 8B). Note that the transistor 200 can also be manufactured in the following manner: the insulating film 156 is processed so as to overlap with only the first region 107 after the dopant 159 is injected into the oxide semiconductor film 105 through the insulating film 156 (see FIG. 6B).

As described above, one embodiment of the present invention can provide a high-performance semiconductor device having favorable electric characteristics.

Note that the structures, methods, and the like described in this embodiment can be used as appropriate in combination with any of the structures, methods, and the like described in the other embodiments and example.

Embodiment 3

In this embodiment, a semiconductor device having a structure which is partly different from those of the semiconductor devices described in the above embodiments will be described. Note that a transistor will be described as an example of the semiconductor device also in this embodiment. In this embodiment, the drawings (including reference numerals and hatching patterns) and descriptions in the above embodiments are used as appropriate, and points described in the above embodiments are not repeated in some cases.

The transistor described in this embodiment has a structure in which the oxide semiconductor film of the transistor described in either of the above embodiments includes a first region, a pair of second regions having lower resistance than the first region, and a pair of third regions having lower resistance than the pair of second regions. The first region, the pair of second regions, and the pair of third regions are formed in a self-aligned manner by injection of a dopant through the gate electrode and a sidewall insulating film that is provided in contact with a side surface of the gate electrode.

<Structure Example of Transistor>

Figure 9A:
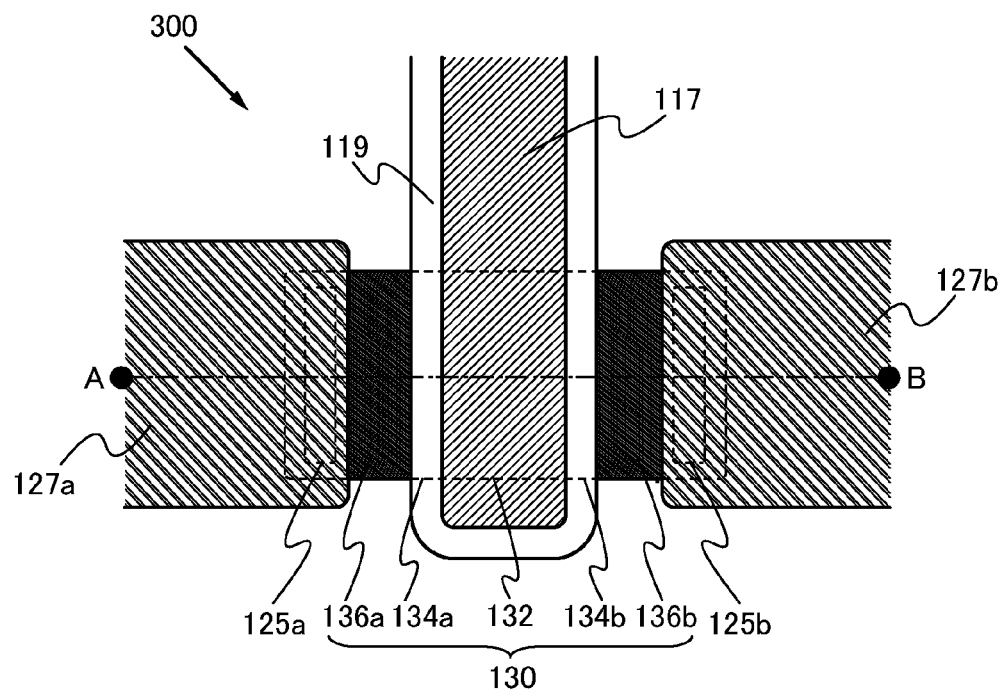
FIGS. 9A and 9B are a top view and a cross-sectional view illustrating an example of a transistor.
Figure 9B:
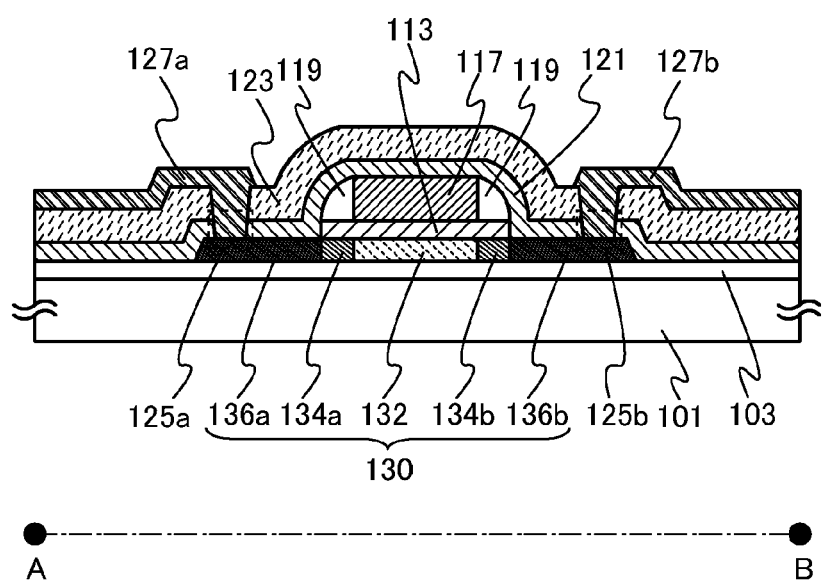

FIGS. 9A and 9B are a top view and a cross-sectional view which illustrate a transistor 300. FIG. 9A is a top view of the transistor 300, and FIG. 9B is a cross-sectional view taken along dashed-dotted line A-B in FIG. 9A. Note that in FIG. 9A, some components of the transistor 300 (e.g., the substrate 101, the base insulating film 103, and the gate insulating film 113) are omitted for simplicity.

According to FIGS. 9A and 9B, in the transistor 300, the base insulating film 103 is provided over the substrate 101, an oxide semiconductor film 130 is provided over the base insulating film 103, the gate insulating film 113 is provided over the oxide semiconductor film 130, the gate electrode 117 is provided over the gate insulating film 113, a sidewall insulating film 119 is provided in contact with the gate electrode 117 and the gate insulating film 113, the metal oxide film 121 having an insulating property is provided over the base insulating film 103, the oxide semiconductor film 130, the gate insulating film 113, the sidewall insulating film 119, and the gate electrode 117, the interlayer insulating film 123 is provided over the metal oxide film 121 having an insulating property, and the source electrode 127a and the drain electrode 127b are provided in contact with the oxide semiconductor film 130 through the openings 125a and 125b formed in the metal oxide film 121 having an insulating property and the interlayer insulating film 123. Note that the base insulating film 103 and the interlayer insulating film 123 are not necessarily provided.

The oxide semiconductor film 130 includes a first region 132, a pair of second regions 134a and 134b facing each other with the first region 132 provided therebetween, and a pair of third regions 136a and 136b facing each other with the first region 132 and the pair of second regions 134a and 134b provided therebetween. In the oxide semiconductor film 130, the first region 132 does not contain the dopant and the pair of second regions 134a and 134b and the pair of third regions 136a and 136b contain the dopant. Note that the first region 132 of the transistor 300 is similar to the first region 107 of the transistor 200.

The pair of second regions 134a and 134b has lower resistance than the first region 132, and the pair of third regions 136a and 136b has lower resistance than the pair of second regions 134a and 134b. The concentration of the dopant contained in the pair of second regions 134a and 134b and the pair of third regions 136a and 136b is preferably higher than or equal to $5\times10^{18}$/cm$^3$ and lower than or equal to $1\times10^{22}$/cm$^3$.

The gate electrode 117 is provided so as to face the first region 132 of the oxide semiconductor film 130 with the gate insulating film 113 therebetween. Accordingly, the first region 132 overlapping with the gate electrode 117 with the gate insulating film 113 therebetween functions as a channel formation region.

Regions with different resistances are provided as the pair of second regions 134a and 134b and the pair of third regions 136a and 136b so that regions in contact with the source electrode 127a and the drain electrode 127b have the lowest resistance. Accordingly, the source electrode 127a and the drain electrode 127b are in contact with upper surfaces of the pair of third regions 136a and 136b. The pair of third regions 136a and 136b thus functions as a source region and a drain region.

In the oxide semiconductor film 130, the first region 132 functioning as a channel formation region is an oxide semiconductor film with high purity and high resistance in which hydrogen and oxygen vacancies are reduced. Specifically, the spin density of the first region 132, which is calculated from the peak of a signal detected at a g value (g) of around 1.93 by electron spin resonance spectroscopy, is lower than $9.3\times10^{16}$ spins/cm$^3$, preferably lower than or equal to $5\times10^{16}$ spins/cm$^3$, further preferably below the lower limit of detection, and the carrier density thereof is lower than $1\times10^{15}$/cm$^3$.

The hydrogen concentration in the first region 132 is lower than $5\times10^{18}$ atoms/cm$^3$, preferably lower than or equal to $5\times10^{17}$ atoms/cm$^3$. Note that the hydrogen concentration is measured by SIMS.

Owing to a difference in dopant concentration in the oxide semiconductor film 130, the first region 132, the pair of second regions 134a and 134b, and the pair of third regions 136a and 136b are gradually varied in resistance. Thus, an electric field from the drain region can be gradually applied to the oxide semiconductor film 130 (particularly the first region 132) included in the transistor 300, so that electric-field concentration in the vicinity of the drain region can be reduced, which results in prevention of a shift of threshold voltage, damage to the transistor, or the like due to the electric-field concentration.

By providing regions which are gradually varied in resistance, like the pair of second regions 134a and 134b and the pair of third regions 136a and 136b, an electric field applied to the oxide semiconductor film 130 (particularly the first region 132) can be effectively reduced as compared with the case where only one pair of low-resistance regions is provided as in the transistor 200.

Further, since the resistance of the pair of third regions 136a and 136b is reduced, the contact resistance with the source electrode 127a and the drain electrode 127b is reduced.

According to the above, the transistor 300 has favorable electric characteristics, degradation of which is prevented. Specifically, the off-state current is reduced, the on-state current, field-effect mobility, and withstand voltage are increased, and a shift of the threshold voltage in the negative direction is suppressed.

<Method for Manufacturing Transistor>

Next, a method for manufacturing the transistor 300 is described with reference to drawings.

Steps from the preparation of the substrate 101 to the formation of the insulating film 156 and the conductive film 157 that is processed into the gate electrode 117 can be performed in a manner similar to that in the method for manufacturing the transistor 100 (see FIGS. 3A to 3C).

Next, a photolithography step and an etching step are performed on the conductive film 157, whereby the gate electrode 117 is formed. In view of forming the sidewall insulating film 119 in a later step, the taper angle of the gate electrode 117 is preferably substantially perpendicular to the bottom surface of the gate electrode 117 (the top surface of the insulating film 156). Anisotropic etching such as reactive ion etching (RIE) is preferably employed for such processing.

Figure 10A:
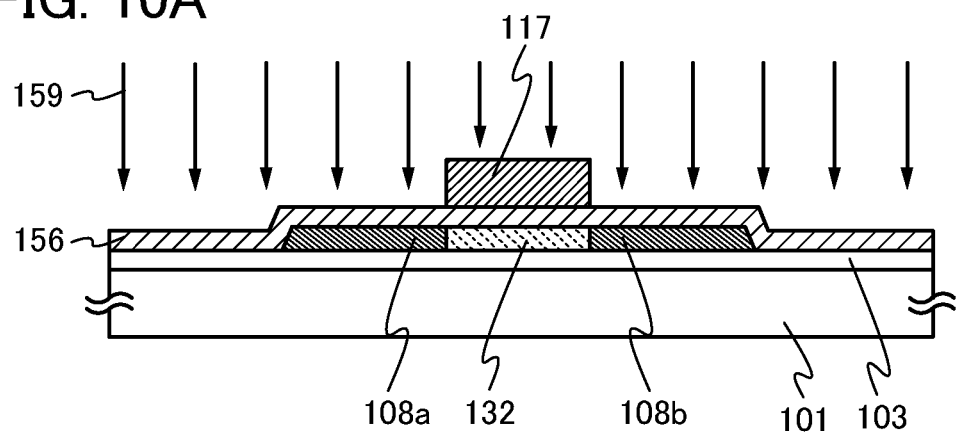
FIGS. 10A to 10D are cross-sectional views illustrating a method for manufacturing a transistor.

Next, the dopant 159 is injected into the oxide semiconductor film 105 with use of the gate electrode 117 as a mask to form the first region 132 and a pair of regions 108a and 108b having lower resistance than the first region 132 and containing the dopant 159 (see FIG. 10A). Note that an element which can be used as the dopant 159 and an injection method are similar to those in Embodiment 2. Heat treatment may be performed after the injection of the dopant 159 as in Embodiment 2.

Figure 10B:
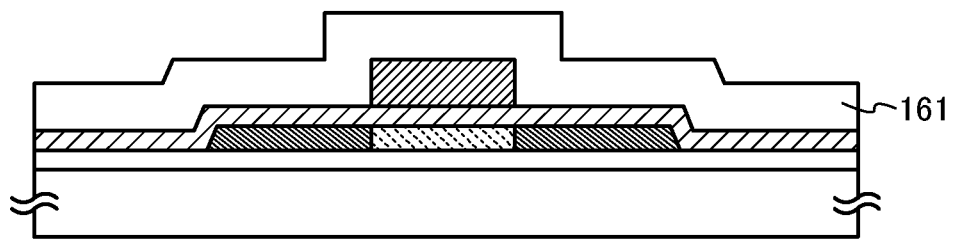

Next, an insulating film 161 is formed over the insulating film 156 and the gate electrode 117 in order to form the sidewall insulating film 119 (see FIG. 10B).

Figure 10C:
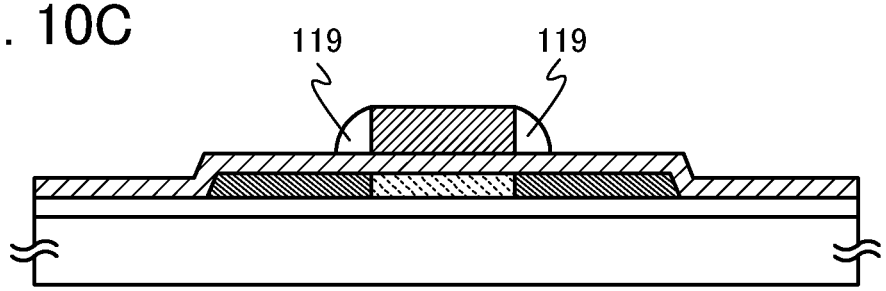

The insulating film 161 is processed by anisotropic etching such as RIE, whereby the sidewall insulating film 119 is formed in contact with a side surface of the gate electrode 117 in a self-aligned manner (see FIG. 10C). Here, the insulating film 161 is preferably a nitride insulating film (e.g., a silicon nitride film or an aluminum nitride film). Using different materials for the insulating film 156 and the insulating film 161 enables the insulating film 161 to have a high etching selectivity ratio to the insulating film 156; thus, the end point in the etching for forming the sidewall insulating film 119 can be easily detected. In addition, the insulating film 156 serves as an etching stopper which prevents the pair of regions 108a and 108b from being etched at the time of forming the sidewall insulating film 119. Note that the insulating film 161 can be formed by a method which can be applied to the base insulating film 103 or the insulating film 156.

Figure 10D:
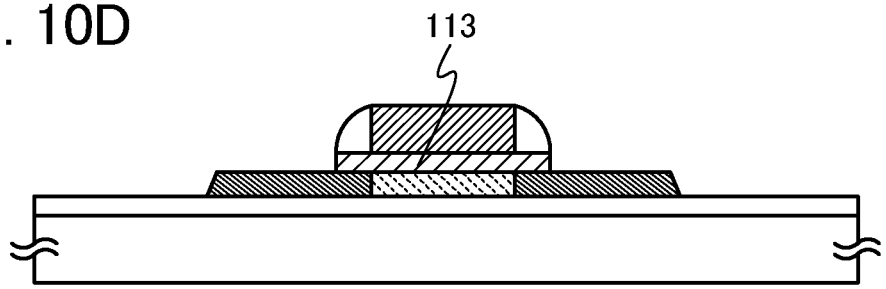

Next, the insulating film 156 is processed by anisotropic etching such RIE with use of the gate electrode 117 and the sidewall insulating film 119 as masks, whereby the gate insulating film 113 is formed (see FIG. 10D). Part of the pair of regions 108a and 108b is exposed when the gate insulating film 113 is formed.

Figure 11A:
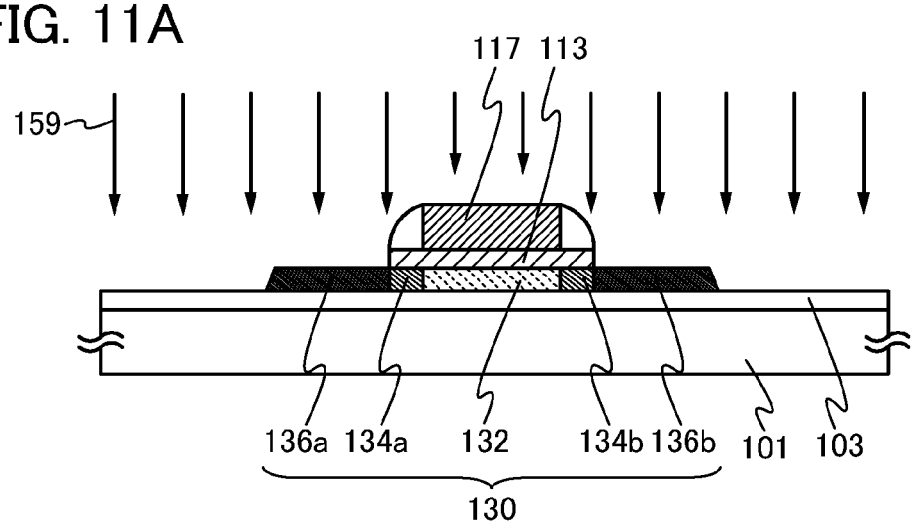
FIGS. 11A to 11D are cross-sectional views illustrating a method for manufacturing a transistor.

Next, the dopant 159 is injected into the pair of regions 108a and 108b with use of the gate electrode 117 and the sidewall insulating film 119 as masks, whereby the pair of second regions 134a and 134b and the pair of third regions 136a and 136b are formed (see FIG. 11A). By this step, the oxide semiconductor film 130 including the first region 132, the pair of second regions 134a and 134b, and the pair of third regions 136a and 136b is formed. Note that an element which can be used as the dopant 159 and an injection method are similar to those in Embodiment 2. Heat treatment may be performed after the injection of the dopant 159 as in Embodiment 2.

Figure 11B:
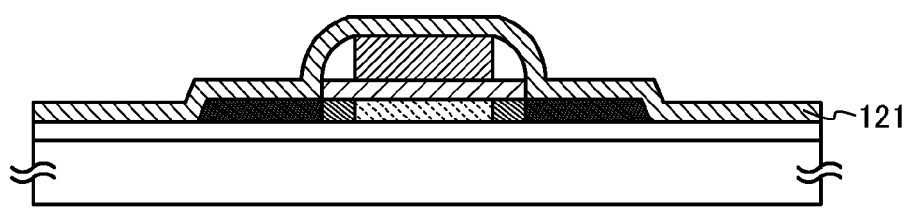
Figure 11C:
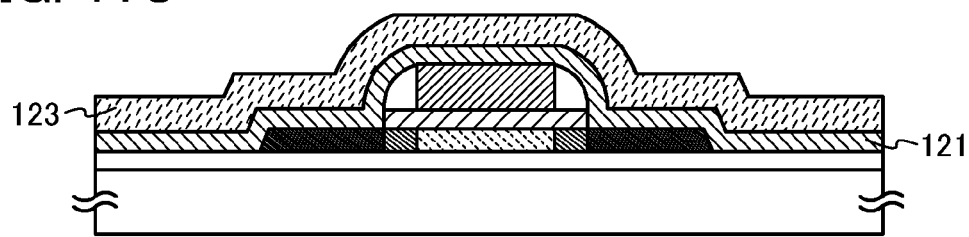

Then, the metal oxide film 121 having an insulating property is formed to cover the base insulating film 103, the oxide semiconductor film 130, the gate insulating film 113, and the gate electrode 117 (see FIG. 11B). Further, the interlayer insulating film 123 is formed over the metal oxide film 121 having an insulating property (see FIG. 11C). Note that the metal oxide film 121 having an insulating property and the interlayer insulating film 123 can be formed in a manner similar to that in the method for manufacturing the transistor 100.

In the method for manufacturing the transistor 300 as well as in the method for manufacturing the transistor 100, heat treatment is preferably performed at least after the formation of the metal oxide film 121 having an insulating property. Owing to this heat treatment, part of oxygen contained in the base insulating film 103 and the gate insulating film 113 can be supplied to the interface between the base insulating film 103 and the oxide semiconductor film 130 (particularly the first region 132), the interface between the gate insulating film 113 and the oxide semiconductor film 130 (particularly the first region 132), and the oxide semiconductor film 130 to reduce the interface state density of each interface and fill the oxygen vacancies in the oxide semiconductor film 130.

Moreover, the metal oxide film 121 having an insulating property has an effect of preventing oxygen contained in the base insulating film 103 and the gate insulating film 113 from being released outside, which enables the interface state density to be reduced efficiently and sufficiently. Accordingly, in the transistor 300, carrier trapping at the interface between the base insulating film 103 and the oxide semiconductor film 130 and the interface between the gate insulating film 113 and the oxide semiconductor film 130, which is caused by the operation of the transistor or the like, is suppressed; thus, the transistor 300 has excellent reliability. The oxide semiconductor film 130 has fewer electrons due to oxygen vacancies, and the metal oxide film 121 having an insulating property has an effect of preventing entry of an impurity such as hydrogen or moisture in the outside air, which also enables the transistor 300 to have excellent reliability. Note that hydrogen and moisture contained in the interlayer insulating film 123 can be removed by performing the heat treatment after the formation of the interlayer insulating film 123.

Figure 11D:
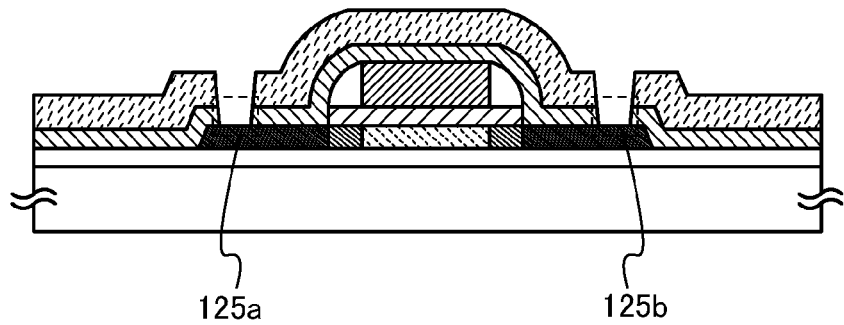

Next, as in the above embodiments, the openings 125a and 125b reaching the pair of third regions 136a and 136b of the oxide semiconductor film 130 are formed in the metal oxide film 121 having an insulating property and the interlayer insulating film 123 (see FIG. 11D). As in the above embodiments, the source electrode 127a and the drain electrode 127b are formed over the openings 125a and 125b (see FIG. 9B).

In addition, as in the transistor 100, a planarization insulating film may be formed over the interlayer insulating film 123 in order to reduce surface unevenness due to the transistor.

Figure 12A:
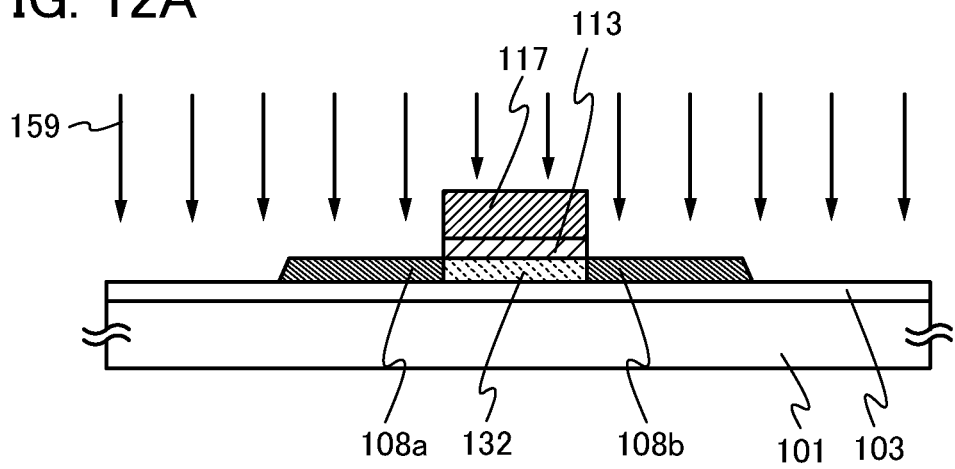
FIGS. 12A to 12C are cross-sectional views illustrating a method for manufacturing a transistor.
Figure 12B:
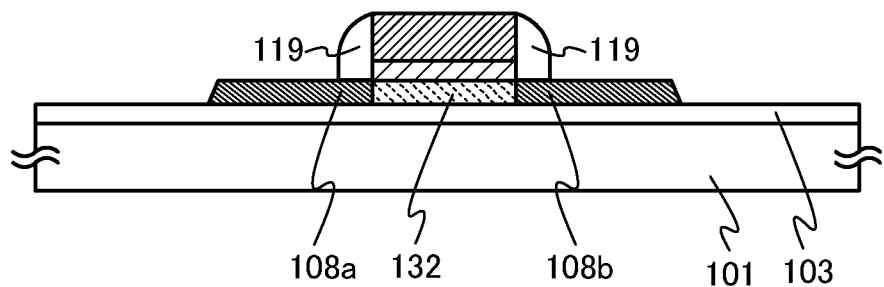
Figure 12C:
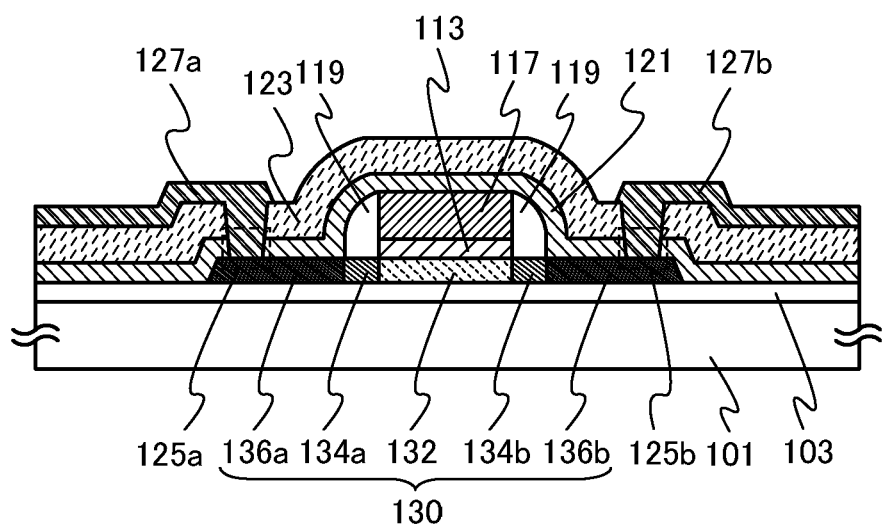

In the above manufacturing method, the dopant 159 is injected into the oxide semiconductor film 105 through the insulating film 156 (see FIG. 10A). Another example is described here. The insulating film 156 is processed into the gate insulating film 113 before this step, and the dopant 159 is injected into the oxide semiconductor film 105 in a state where the oxide semiconductor film 105 is exposed, whereby the pair of regions 108a and 108b is formed (see FIG. 12A). Then, the insulating film 161 is formed to cover the pair of regions 108a and 108b, the gate insulating film 113, and the gate electrode 117 and subjected to anisotropic etching such as RIE, whereby the sidewall insulating film 119 is formed (see FIG. 12B). FIG. 12C is a cross-sectional view illustrating a transistor including the sidewall insulating film 119 formed in this manner.

As described above, one embodiment of the present invention can provide a high-performance semiconductor device having favorable electric characteristics.

Note that the structures, methods, and the like described in this embodiment can be used as appropriate in combination with any of the structures, methods, and the like described in the other embodiments and example.

Embodiment 4

In this embodiment, a transistor which is manufactured by a method partly different from those of the transistors described in the above embodiments will be described. Accordingly, in this embodiment, the drawings (including reference numerals and hatching patterns) and descriptions in the above embodiments are used as appropriate, and points described in the above embodiments are not repeated in some cases.

<Structure Example of Transistor>

Figure 13A:
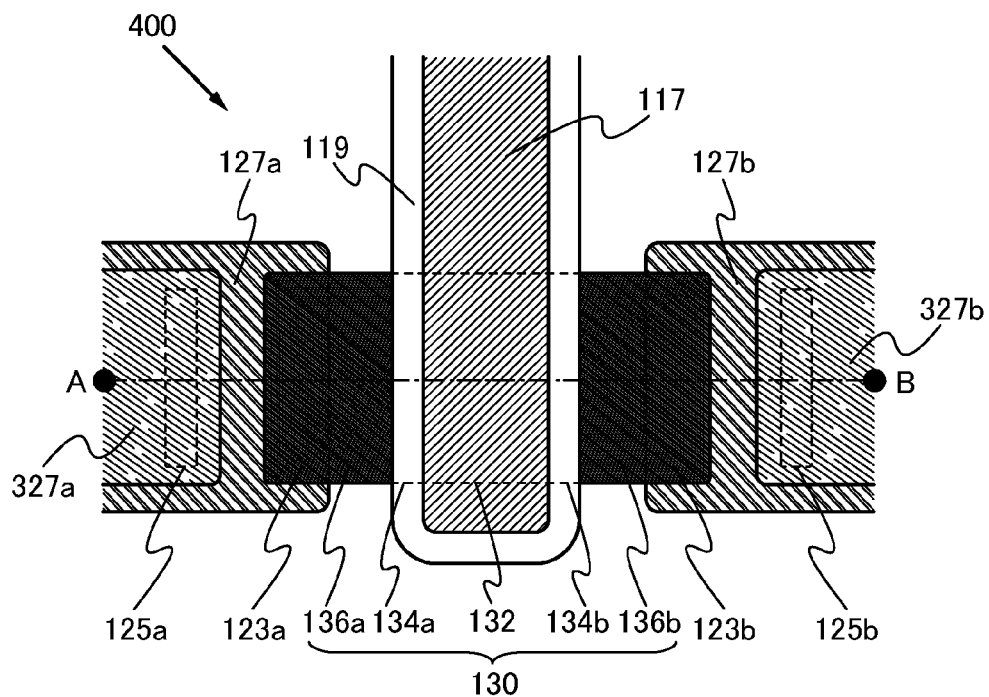
FIGS. 13A and 13B are a top view and a cross-sectional view illustrating an example of a transistor.
Figure 13B:
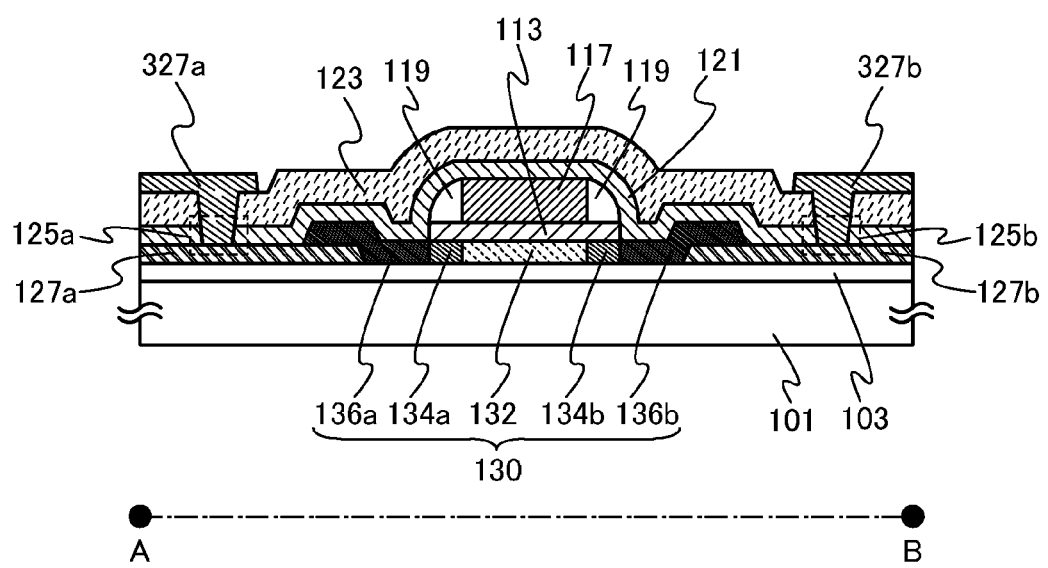

FIGS. 13A and 13B are a top view and a cross-sectional view which illustrate a transistor 400. FIG. 13A is a top view of the transistor 400, and FIG. 13B is a cross-sectional view taken along dashed-dotted line A-B in FIG. 13A. Note that in FIG. 13A, some components of the transistor 400 (e.g., the substrate 101, the base insulating film 103, and the gate insulating film 113) are omitted for simplicity.

According to FIGS. 13A and 13B, in the transistor 400, the base insulating film 103 is provided over the substrate 101, the source electrode 127a and the drain electrode 127b are provided over the base insulating film 103, the oxide semiconductor film 130 is provided over the base insulating film 103 to be in contact with part of the source electrode 127a and the drain electrode 127b, the gate insulating film 113 is provided over the oxide semiconductor film 130, the gate electrode 117 is provided over the gate insulating film 113, the sidewall insulating film 119 is provided in contact with the gate electrode 117 and the gate insulating film 113, the metal oxide film 121 having an insulating property is provided over the base insulating film 103, the oxide semiconductor film 130, the gate insulating film 113, the sidewall insulating film 119, and the gate electrode 117, the interlayer insulating film 123 is provided over the metal oxide film 121 having an insulating property, and a source wiring 327a and a drain wiring 327b are provided in contact with the source electrode 127a and the drain electrode 127b through the openings 125a and 125b formed in the metal oxide film 121 having an insulating property and the interlayer insulating film 123. Note that the base insulating film 103 and the interlayer insulating film 123 are not necessarily provided.

Details of the substrate 101, the base insulating film 103, the oxide semiconductor film 130, the gate insulating film 113, the gate electrode 117, the sidewall insulating film 119, the metal oxide film 121 having an insulating property, the interlayer insulating film 123, the source electrode 127a, and the drain electrode 127b of the transistor 400 are similar to those of the transistor 300.

The source wiring 327a and the drain wiring 327b are provided to be electrically connected to the source electrode 127a and the drain electrode 127b as lead wirings of the source electrode 127a and the drain electrode 127b.

<Method for Manufacturing Transistor>

Next, a method for manufacturing the transistor 400 is described with reference to drawings.

Figure 14A:
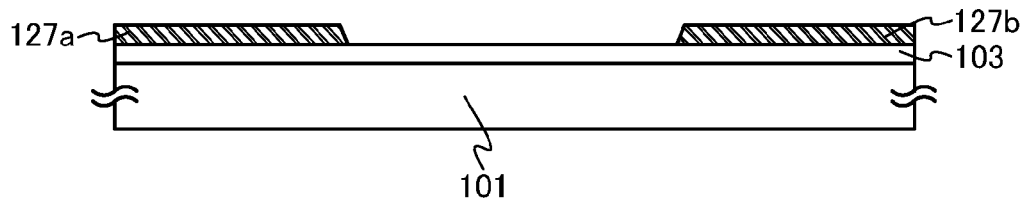
FIGS. 14A to 14D are cross-sectional views illustrating a method for manufacturing a transistor.

First, the substrate 101 is prepared, the base insulating film 103 is formed over the substrate 101, and the source electrode 127a and the drain electrode 127b are formed over the base insulating film 103 (see FIG. 14A).

A substrate selected from those given in Embodiment 1 can be used as the substrate 101, and the base insulating film 103 can be formed using any of the materials and methods described in Embodiment 1.

The source electrode 127a and the drain electrode 127b are formed using any of the materials and methods described in Embodiment 1 as appropriate.

Figure 14B:
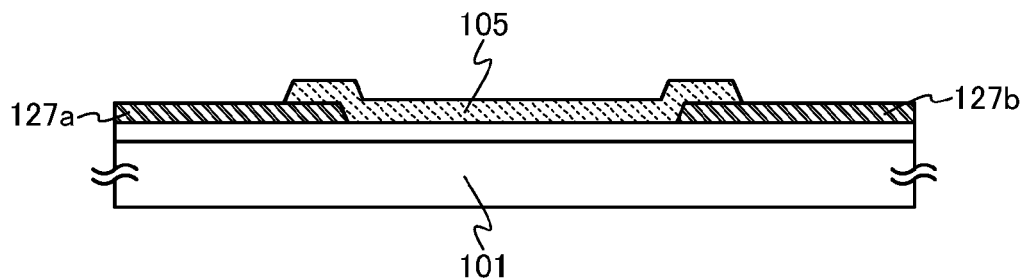
Figure 14C:
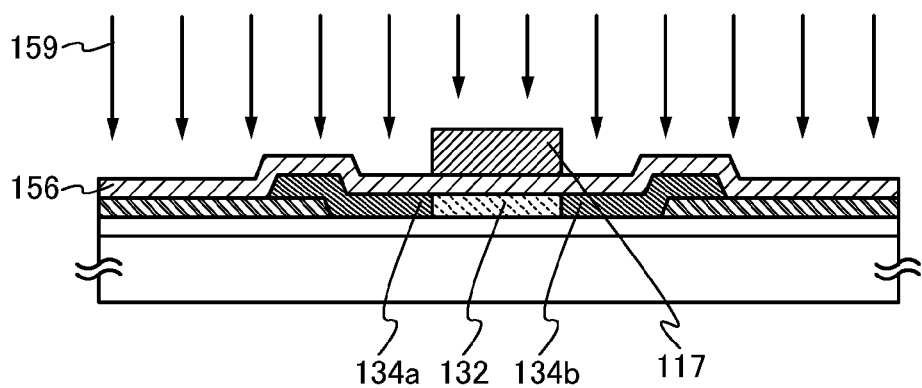
Figure 14D:
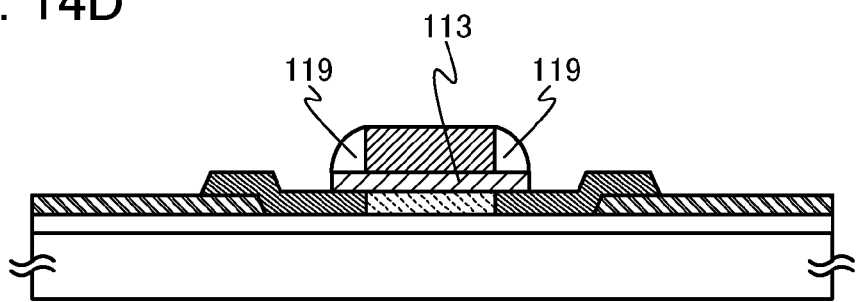
Figure 15A:
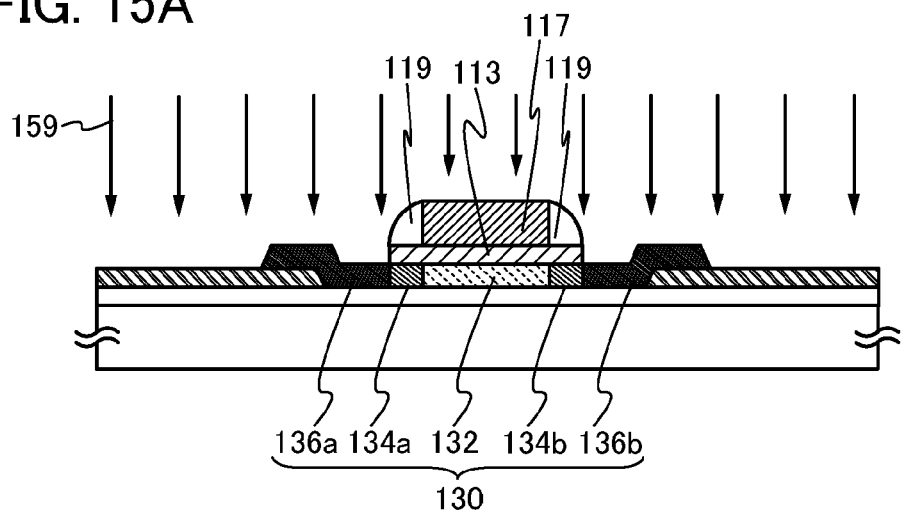
FIGS. 15A to 15C are cross-sectional views illustrating a method for manufacturing a transistor.
Figure 15B:
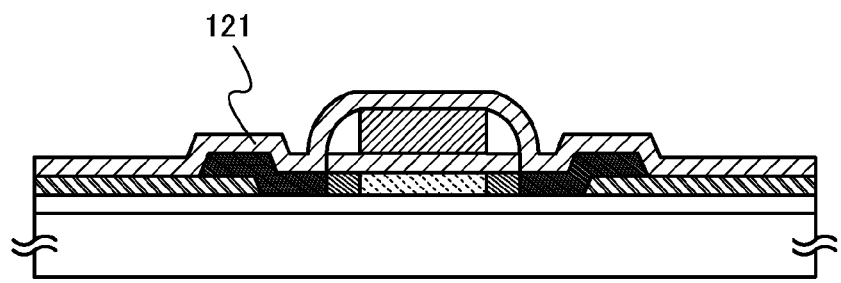
Figure 15C:
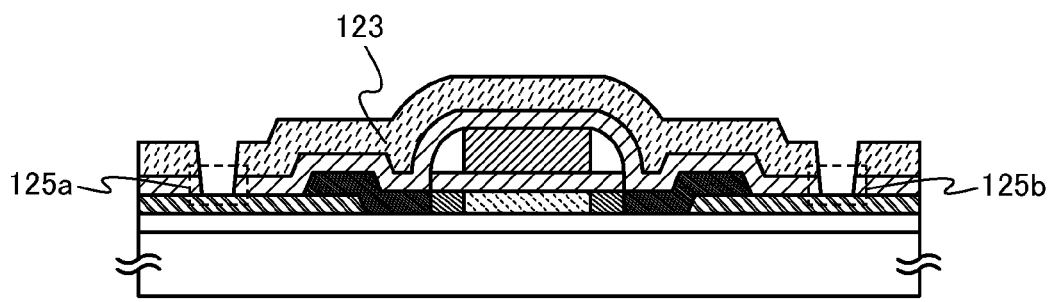

The following steps are similar to those in the manufacturing process of the transistor 300. The oxide semiconductor film 105 is formed (see FIG. 14B); the insulating film 156 and the gate electrode 117 are formed and the dopant 159 is injected into the oxide semiconductor film 105 with use of the gate electrode 117 as a mask to form the first region 132 and the pair of regions 108a and 108b (see FIG. 14C); the insulating film 156 is processed into the gate insulating film 113 and the sidewall insulating film 119 is formed (see FIG. 14D); the dopant 159 is injected into the pair of regions 108a and 108b with use of the gate electrode 117 and the sidewall insulating film 119 as masks to provide the oxide semiconductor film 130 including the first region 132, the pair of second regions 134a and 134b, and the pair of third regions 136a and 136b (see FIG. 15A); the metal oxide film 121 having an insulating property is formed (see FIG. 15B); the interlayer insulating film 123 is formed and the openings 125a and 125b are formed (see FIG. 15C); and the source wiring 327a and the drain wiring 327b are formed in the openings 125a and 125b; whereby the transistor 400 can be manufactured (see FIG. 13B).

Heat treatment can be performed as appropriate as in Embodiment 1. For example, heat treatment is preferably performed after the oxide semiconductor film is processed into the oxide semiconductor film 105 or at least after the metal oxide film 121 having an insulating property is formed. By the heat treatment, the oxide semiconductor film is dehydrogenated or dehydrated and oxygen vacancies in the oxide semiconductor film can be filled, so that the manufactured transistor 400 can have favorable electric characteristics.

As described above, one embodiment of the present invention can provide a high-performance semiconductor device having favorable electric characteristics.

Note that the structures, methods, and the like described in this embodiment can be used as appropriate in combination with any of the structures, methods, and the like described in the other embodiments and example.

Embodiment 5

In this embodiment, a transistor having a structure which is partly different from those of the transistors described in the above embodiments will be described. Note that also in this embodiment, the drawings (including reference numerals and hatching patterns) and descriptions in the above embodiments are used as appropriate, and points described in the above embodiments are not repeated in some cases.

<Structure Example of Transistor>

Figure 16A:
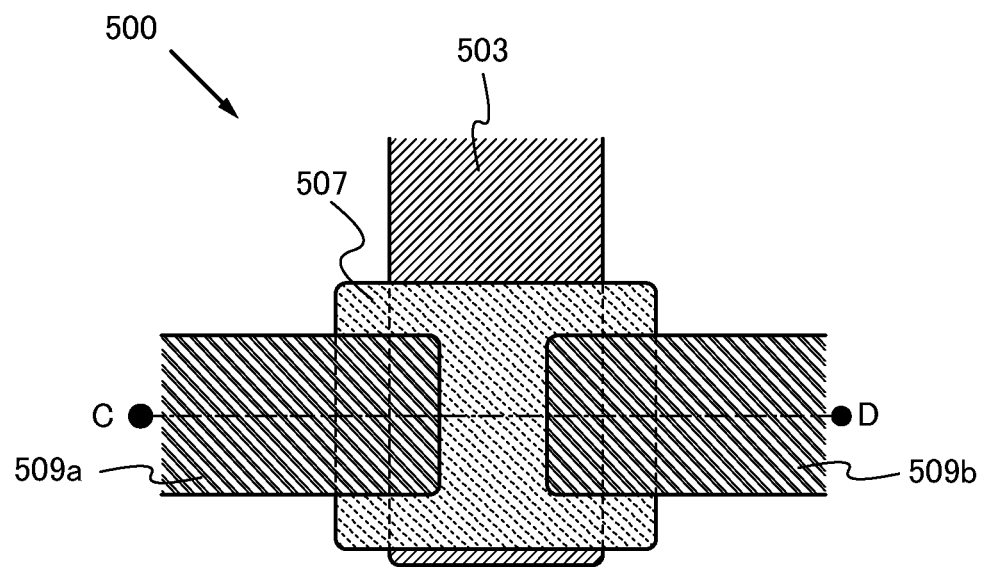
FIGS. 16A and 16B are a top view and a cross-sectional view illustrating an example of a transistor.
Figure 16B:
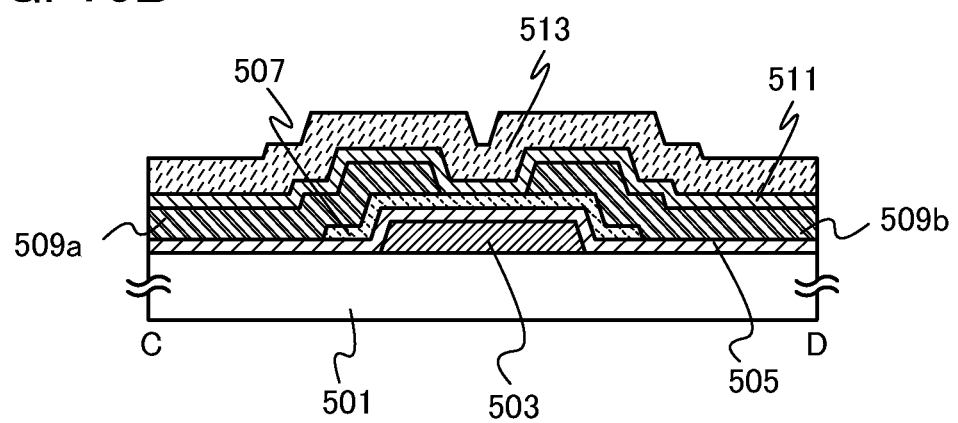

FIGS. 16A and 16B are a top view and a cross-sectional view which illustrate a transistor 500. FIG. 16A is a top view of the transistor 500, and FIG. 16B is a cross-sectional view taken along dashed-dotted line C-D in FIG. 16A. Note that in FIG. 16A, some components of the transistor 500 (e.g., a substrate 501 and a gate insulating film 505) are omitted for simplicity.

According to FIGS. 16A and 16B, in the transistor 500, a gate electrode 503 is provided over the substrate 501, the gate insulating film 505 is provided over the substrate 501 and the gate electrode 503, an oxide semiconductor film 507 is provided over the gate insulating film 505, a source electrode 509a and a drain electrode 509b are provided over the gate insulating film 505 and the oxide semiconductor film 507, a protective insulating film 511 is provided over the oxide semiconductor film 507, the source electrode 509a, and the drain electrode 509b, and an interlayer insulating film 513 is provided over the protective insulating film 511. Note that a base insulating film may be provided between the substrate 501 and the gate electrode 503.

The oxide semiconductor film 507 is provided so as to overlap with the gate electrode 503 with the gate insulating film 505 therebetween. A region overlapping with the gate electrode 503 in the oxide semiconductor film 507 serves as a channel formation region. Accordingly, the gate electrode 503 is in contact with the bottom surface of the gate insulating film 505 (i.e., provided below the gate insulating film 505), which means that the transistor 500 is a bottom-gate transistor. In the transistor 500, the source electrode 509a and the drain electrode 509b are provided so as to cover part of the oxide semiconductor film 507.

The gate electrode 503 also serves as a gate wiring. The source electrode 509a also serves as a source wiring. The drain electrode 509b also serves as a drain wiring.

Details of the substrate 501 of the transistor 500 are similar to those of the substrate 101 of the transistor described in the above embodiment. Similarly, details of the gate electrode 503 are similar to those of the gate electrode 117. Details of the gate insulating film 505 are similar to those of the gate insulating film 113 and the insulating film 156. Details of the oxide semiconductor film 507 are similar to those of the oxide semiconductor film 105. Details of the source electrode 509a and the drain electrode 509b are similar to those of the source electrode 127a and the drain electrode 127b.

The protective insulating film 511 is preferably an insulating film having an effect of supplying part of its oxygen to the oxide semiconductor film by being heated to fill the oxygen vacancies in the oxide semiconductor film, and thus is preferably an insulating film containing oxygen.

For example, one insulating film selected from an oxide insulating film of silicon oxide, gallium oxide, aluminum oxide, or the like, an oxynitride insulating film of silicon oxynitride, aluminum oxynitride, or the like, and a nitride oxide insulating film of silicon nitride oxide or the like, or a stack of any of these films can be used as the protective insulating film 511. It is preferable to use an insulating film which releases part of its oxygen by being heated in a manufacturing process of the transistor 500, particularly an oxide insulating film, an oxynitride insulating film, or a nitride oxide insulating film which contains silicon. The protective insulating film 511 can be formed by a CVD method, a sputtering method, an MBE method, a PLD method, or the like.

Details of the interlayer insulating film 513 are similar to those of the interlayer insulating film 123 of the transistor described in the above embodiment.

<Method for Manufacturing Transistor>

Next, a method for manufacturing the transistor 500 is described with reference to drawings.

First, the substrate 501 is prepared, and the gate electrode 503 is formed over the substrate 501. In this embodiment, a 30 nm thick tantalum nitride film and a 200 nm thick tungsten film are stacked over the substrate 501 in this order by a sputtering method and subjected to a photolithography step and an etching step, whereby the gate electrode 503 is formed.

Figure 17A:
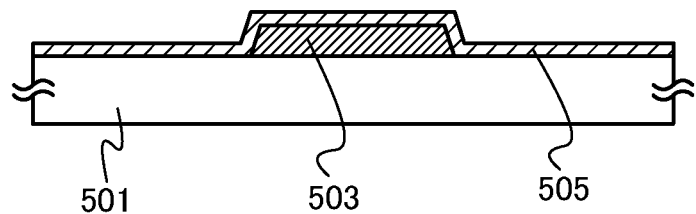
FIGS. 17A to 17D are cross-sectional views illustrating a method for manufacturing a transistor.

Next, the gate insulating film 505 is formed over the gate electrode 503 (see FIG. 17A). In this embodiment, an insulating film which releases part of its oxygen by being heated, specifically, a 50 nm thick silicon oxynitride film containing excess oxygen is formed as the gate insulating film 505. In this manner, as in the transistors described in the above embodiments, oxygen released by the heat treatment in the manufacturing process of the transistor can be supplied to the oxide semiconductor film to fill the oxygen vacancies in the oxide semiconductor film (particularly in the channel formation region). Accordingly, the manufactured transistor 500 can have favorable electrical characteristics.

Figure 17B:
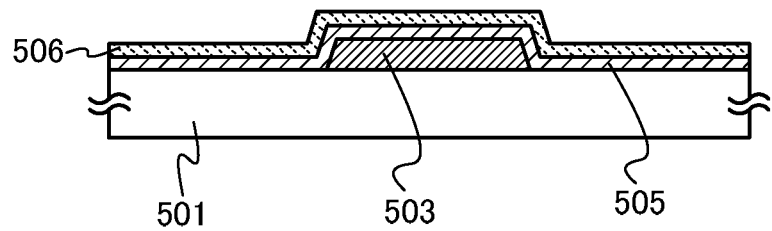

Next, an oxide semiconductor film 506 is formed over the gate insulating film 505 (see FIG. 17B). Similarly to the oxide semiconductor film 154 described in the above embodiment, the oxide semiconductor film 506 can be formed by a sputtering method with bias power supplied to the substrate side. In this embodiment, a 20 nm thick IGZO film is formed as the oxide semiconductor film 506.

Figure 17C:
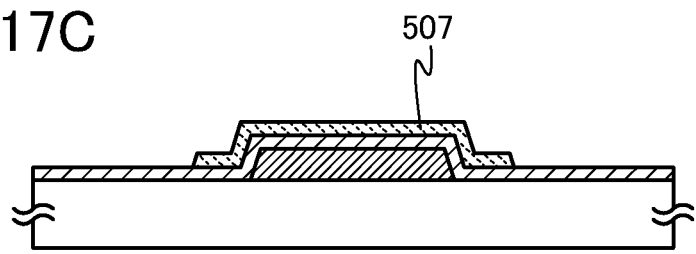

After that, a photolithography step and an etching step are performed on the oxide semiconductor film 506, whereby the oxide semiconductor film 507 is formed (see FIG. 17C).

Figure 17D:
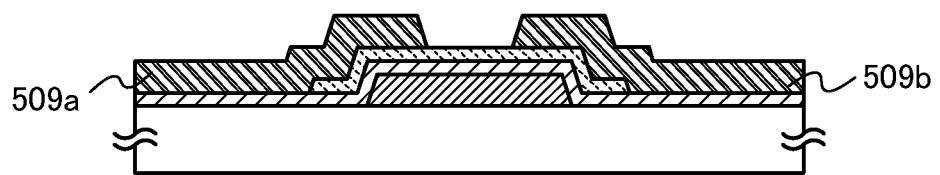

Then, the source electrode 509a and the drain electrode 509b are formed over the gate insulating film 505 and part of the oxide semiconductor film 507 (see FIG. 17D). In this embodiment, similarly to the source electrode 127a and the drain electrode 127b described in the above embodiment, the source electrode 509a and the drain electrode 509b are formed by stacking titanium, aluminum, and titanium in this order.

Next, the protective insulating film 511 is formed over part of the oxide semiconductor film 507, the source electrode 509a, and the drain electrode 509b. The protective insulating film 511 may be formed using a material selected from those given above. In this embodiment, a 30 nm thick silicon oxynitride film is formed.

Then, the interlayer insulating film 513 is formed over the protective insulating film 511 (see FIG. 16B). In this embodiment, a 370 nm thick silicon oxynitride film is formed.

In the method for manufacturing the transistor 500, heat treatment is preferably performed at least after the formation of the protective insulating film 511. The heat treatment is performed at a temperature higher than or equal to 200° C. and lower than or equal to 700° C., or higher than or equal to 200° C. and lower than the strain point of the substrate under an oxygen atmosphere, a nitrogen atmosphere, reduced pressure, or the air (ultra-dry air).

In the method for manufacturing the transistor 500, the protective insulating film 511 and the interlayer insulating film 513 may be formed after heat treatment for removing hydrogen from the oxide semiconductor film 507 and oxygen plasma treatment for injecting oxygen ions into the oxide semiconductor film 507 are performed in this order after the source electrode 509a and the drain electrode 509b are formed. Instead of oxygen plasma treatment, an ion implantation method, an ion doping method, or heat treatment in an oxygen atmosphere may be employed for the injection of oxygen ions into the oxide semiconductor film 507. Further, in the method for manufacturing the transistor 500, oxygen ions may be injected into the oxide semiconductor film 507 by any of the above methods between the formation of the protective insulating film 511 and the formation of the interlayer insulating film 513.

Through these steps, the transistor 500 can be manufactured.

Note that a channel-stop transistor can be manufactured by forming a channel protective film before the formation of the source electrode 509a and the drain electrode 509b. Similarly to the gate insulating film 505 and the protective insulating film 511, the channel protective film, which is in contact with the oxide semiconductor film 507, is preferably an oxide insulating film.

As described above, a bottom-gate transistor can also be manufactured using an oxide semiconductor film in which charge due to hydrogen and oxygen vacancies is reduced. In other words, also in a bottom-gate transistor, a shift of the threshold voltage in the negative direction can be suppressed and off-state current can be reduced. Consequently, one embodiment of the present invention can provide a high-performance semiconductor device having favorable electric characteristics.

Embodiment 6

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example. Alternatively, a microcrystalline oxide semiconductor film, for example, includes a crystal-amorphous mixed phase structure where crystal parts (each of which is greater than or equal to 1 nm and less than 10 nm) are distributed.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

The CAAC-OS film is not absolutely amorphous. The CAAC-OS film, for example, includes an oxide semiconductor with a crystal-amorphous mixed phase structure where crystal parts and amorphous parts are intermingled. Note that in most cases, the crystal part fits inside a cube whose one side is less than 100 nm In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

Note that part of oxygen included in the oxide semiconductor film may be substituted with nitrogen.

In the case where a CAAC-OS film is used as the oxide semiconductor film used in any of the transistors described in the above embodiments, when the surface planarity of the oxide semiconductor film is enhanced, the transistor can have higher field-effect mobility than a transistor in which an amorphous oxide semiconductor film is used. In order to enhance the surface planarity of the oxide semiconductor film, the oxide semiconductor film is preferably formed over a flat surface. Specifically, the oxide semiconductor film is preferably formed over a surface with an average surface roughness ($R_a$) less than or equal to 0.15 nm, preferably less than or equal to 0.1 nm.

For example, in the transistors 100, 200, 300, and 400, polishing treatment (e.g., chemical mechanical polishing (CMP)), dry-etching treatment, or plasma treatment is preferably performed before the formation of the oxide semiconductor film 154 so that a surface of the base insulating film 103 has an average surface roughness ($R_a$) in the above range. In the transistor 500, polishing treatment, dry-etching treatment, or plasma treatment is preferably performed so that a surface of the gate insulating film 505 has an average surface roughness ($R_a$) in the above range.

As plasma treatment, for example, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the base insulating film 103 or the surface of the gate insulating film 505.

As the planarization treatment, polishing treatment, dry etching treatment, or plasma treatment may be performed plural times, or these treatments may be performed in combination. In the case where the treatments are performed in combination, the order of steps is not particularly limited and may be set as appropriate depending on the roughness of the surface of the base insulating film 103 or the surface of the gate insulating film 505.

Note that $R_a$ is obtained by expanding, into three dimensions, arithmetic mean surface roughness that is defined by JIS B 0601: 2001 (ISO4287:1997) so as to be able to apply it to a curved surface. $R_a$ can be expressed as an "average value of the absolute values of deviations from a reference surface to a specific surface" and is defined by the following formula.

$$Ra = \frac{1}{S_0}\int_{y1}^{y2}\int_{x1}^{x2}|f(x, y) - Z_0|dxdy \quad \text{[FORMULA 2]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

There are three methods for obtaining a CAAC-OS film, for example. The first method is to form an oxide semiconductor film with the temperature set higher than or equal to 200° C. and lower than or equal to 500° C. The second method is to form a thin oxide semiconductor film and then perform heat treatment at a temperature higher than or equal to 200° C. and lower than or equal to 700° C. The third method is to form a thin oxide semiconductor film first, perform heat treatment at a temperature higher than or equal to 200° C. and lower than or equal to 700° C., and form an oxide semiconductor film over the thin oxide semiconductor film, thereby obtaining a CAAC-OS film. Since the substrate support 205 in the sputtering apparatuses illustrated in FIGS. 2A and 2B is provided with a heater, the CAAC-OS film can be formed by any of the above methods. Bias power is supplied to the substrate side and the oxide semiconductor film is formed by any of the above methods with self-bias voltage controlled, and then heat treatment is performed, whereby a CAAC-OS film in which hydrogen and oxygen vacancies are reduced can be formed.

For example, when the oxide semiconductor film is formed by any of the methods described in this embodiment in the methods for manufacturing the transistors 100, 200, 300, and 400, the transistors 100, 200, 300, and 400 including a CAAC-OS film in which hydrogen and oxygen vacancies are reduced can be manufactured. Further, when the oxide semiconductor film 506 is formed by any of the methods described in this embodiment in the method for manufacturing the transistor 500, the transistor 500 including a CAAC-OS film in which hydrogen and oxygen vacancies are reduced can be manufactured.

Consequently, a transistor having favorable electric characteristics and excellent reliability can be manufactured.

Note that the structures, methods, and the like described in this embodiment can be used as appropriate in combination with any of the structures, methods, and the like described in the other embodiments and example.

Embodiment 7

In this embodiment, a semiconductor device which is one embodiment of the present invention will be described. Note that a memory element (memory cell) is described in this embodiment as an example of a semiconductor device, using the reference numerals used in the above embodiments as appropriate.

The semiconductor device includes a first transistor formed using a single crystal semiconductor substrate, a second transistor formed using a semiconductor film, and a capacitor. The second transistor and the capacitor are provided above the first transistor with an insulating film positioned therebetween.

Semiconductor materials and structures of the first transistor and the second transistor, which are stacked, may be the same as or different from each other. Described here is an example in which transistors with materials and structures suitable for a circuit of the semiconductor device are used as the first transistor and the second transistor.

Any of the transistors described in the above embodiments can be used as the second transistor. Note that the layered structure and connection relations of the first transistor and the capacitor are changed as appropriate depending on the structure of the transistor used as the second transistor. In this embodiment, an example in which the transistor 400 is used as the second transistor is described.

Figure 18A:
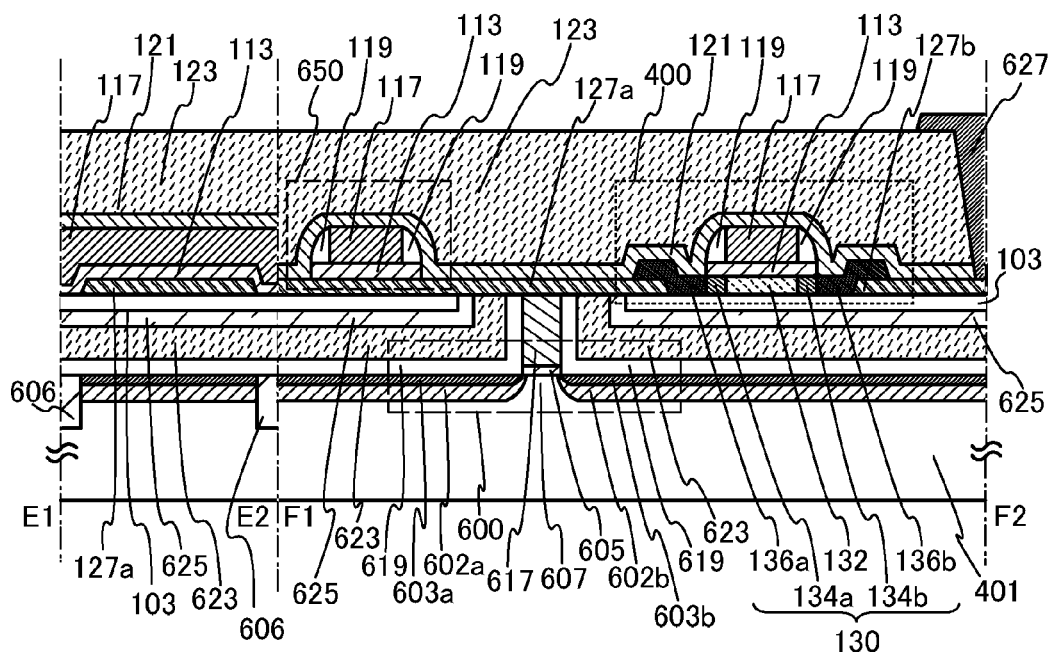
FIGS. 18A to 18C are a cross-sectional view, a top view, and a circuit diagram which illustrate an example of a semiconductor memory device.
Figure 18B:
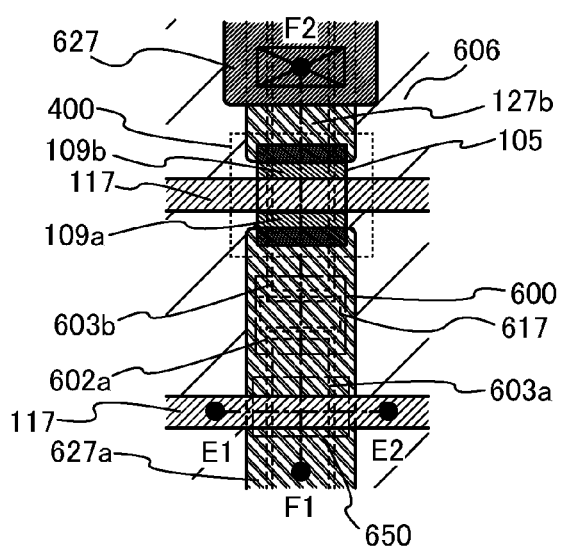
Figure 18C:
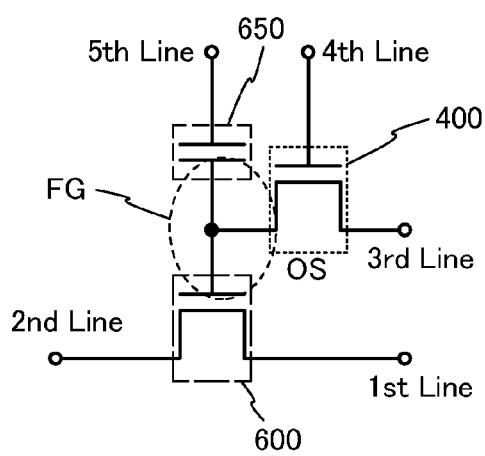

FIGS. 18A to 18C illustrate an example of the structure of the semiconductor device. FIG. 18A illustrates a cross section of the semiconductor device, and FIG. 18B illustrates a plan view of the semiconductor device. FIG. 18A corresponds to a cross section along line E1-E2 and line F1-F2 in FIG. 18B. Note that in FIG. 18B, some components of the semiconductor device (e.g., a substrate 601, an insulating film 619, an insulating film 623, an insulating film 625, the base insulating film 103, the gate insulating film 113, and the sidewall insulating film 119) are omitted for simplicity. "OS" in FIGS. 18A to 18C indicates that any of the transistors described in the above embodiments can be applied to the transistor denoted by "OS" in the semiconductor device.

FIG. 18C illustrates an example of a circuit diagram of the semiconductor device. The semiconductor device illustrated in FIGS. 18A and 18B includes a transistor 600 including a first semiconductor material in a lower portion, and the transistor 400 including a second semiconductor material and a capacitor 650 in an upper portion. Such materials and structures are suitable for the semiconductor device. In this embodiment, the first semiconductor material is a semiconductor material other than an oxide semiconductor, and the second semiconductor material is an oxide semiconductor. As the semiconductor material other than an oxide semiconductor, for example, silicon, germanium, silicon germanium, silicon carbide, gallium arsenide, or the like can be used, and a single crystal semiconductor is preferably used. A transistor including such a semiconductor material can operate at sufficiently high speed. Alternatively, an organic semiconductor material or the like may be used as the semiconductor material other than an oxide semiconductor. A transistor including an oxide semiconductor enables charge to be held for a long time owing to its characteristics.

A method for manufacturing the semiconductor device in FIGS. 18A to 18C is described with reference to FIGS. 18A to 18C.

The transistor 600 includes a channel formation region 607 provided in the substrate 601 containing a semiconductor material (e.g., silicon), impurity regions 602a and 602b provided so that the channel formation region 607 is provided therebetween, intermetallic compound regions 603a and 603b in contact with the impurity regions 602a and 602b, a gate insulating film 605 provided over the channel formation region 607, and a gate electrode 617 provided over the gate insulating film 605.

As the substrate 601 containing a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Note that although the term "SOI substrate" generally means a substrate in which a silicon semiconductor film is provided over an insulating surface, the term "SOI substrate" in this specification and the like also includes a substrate in which a semiconductor film formed using a material other than silicon is provided over an insulating surface. That is, a semiconductor film included in the "SOI substrate" is not limited to a silicon semiconductor film. Moreover, the SOI substrate can be a substrate in which a semiconductor film is provided over an insulating substrate such as a glass substrate with an insulating film positioned therebetween.

As a method for forming the SOI substrate, any of the following methods can be used: a method in which oxygen ions are implanted into a mirror-polished wafer and then heating is performed at a high temperature, whereby an oxide layer is formed at a certain depth from a surface of the wafer and a defect caused in the surface layer is eliminated; a method in which a semiconductor substrate is separated by utilizing the growth of microvoids, which are formed by hydrogen ion irradiation, by heat treatment; a method in which a single crystal semiconductor film is formed over an insulating surface by crystal growth; and the like.

For example, ions are added through one surface of a single crystal semiconductor substrate, an embrittlement layer is formed at a certain depth from the one surface of the single crystal semiconductor substrate, and an insulating film is formed on the one surface of the single crystal semiconductor substrate or over an element substrate. Heat treatment is performed in a state where the single crystal semiconductor substrate and the element substrate are bonded to each other with the insulating film interposed therebetween, so that a crack is generated in the embrittlement layer and the single crystal semiconductor substrate is separated along the embrittlement layer. Thus, a single crystal semiconductor film, which is separated from the single crystal semiconductor substrate, is formed as a semiconductor film over the element substrate. An SOI substrate formed by the above method can also be favorably used.

Over the substrate 601, an element isolation insulating film 606 is provided so as to surround the transistor 600 (see FIG. 18B). Note that for high integration, it is preferable that the transistor 600 not be provided with a sidewall insulating film. On the other hand, when the electric characteristics of the transistor 600 have priority, a sidewall insulating film may be formed on a side surface of the gate electrode 617 so that the impurity regions include regions having different impurity concentrations.

The transistor 600 including a single crystal semiconductor substrate can operate at high speed. Thus, when the transistor 600 is used as a reading transistor, data can be read at a high speed. A plurality of insulating films is formed so as to cover the transistor 600. As treatment prior to formation of the transistor 400 and the capacitor 650, CMP treatment is performed on the plurality of insulating films, whereby the insulating films 619, 623, and 625 that are planarized are formed and, at the same time, the base insulating film 103 functioning as a base insulating film of the transistor 400 is formed and an upper surface of the gate electrode 617 is exposed.

As each of the insulating films 619, 623, and 625, typically, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used. The insulating films 619, 623, and 625 can be formed by a plasma CVD method, a sputtering method, or the like.

Alternatively, an organic material such as polyimide, an acrylic resin, or a benzocyclobutene-based resin can be used for the insulating films 619, 623, and 625. Other than such organic materials, it is also possible to use a low-dielectric constant material (a low-k material) or the like. In the case of using an organic material, the insulating films 619, 623, and 625 may be formed by a wet method such as a spin coating method or a printing method.

It is preferable that a silicon nitride film be used as the insulating film 625 and subjected to heat treatment at a temperature higher than or equal to 450° C. and lower than or equal to 650° C. in a nitrogen atmosphere. In this manner, hydrogen contained in the silicon nitride film can be supplied to the transistor 600 to hydrogenate the semiconductor material of the transistor 600. In addition, the silicon nitride film used as the insulating film 625 can prevent entry of hydrogen contained in the transistor 600 and the insulating films 619 and 623 in a manufacturing process of the transistor 400 and the capacitor 650.

In this embodiment, a 50 nm thick silicon oxynitride film is formed as the insulating film 619 by a CVD method, a 550 nm thick silicon oxide film is formed as the insulating film 623 by a sputtering method, and a 50 nm thick silicon nitride film is formed as the insulating film 625 by a CVD method.

The transistor 400 and the capacitor 650 are formed over the insulating film 625. The transistor 400 can be manufactured in accordance with the description in the above embodiment (see FIGS. 13A and 13B, FIGS. 14A to 14D, and FIGS. 15A to 15C).

In the semiconductor device of this embodiment, the capacitor 650 is manufactured by utilizing the manufacturing process of the transistor 400; thus, the capacitor 650 can be formed on the same plane as the transistor 400. Accordingly, additional steps for manufacturing the capacitor 650 can be omitted, which leads to an improvement in productivity and a reduction in manufacturing cost of the semiconductor device.

In the capacitor 650, the source electrode 127a of the transistor 400 is used as one electrode, the gate insulating film 113 of the transistor 400 is used as a dielectric, and the gate electrode 117 of the transistor 400 is used as the other electrode. Note that in the case where the sidewall insulating film 119 of the transistor 400 is formed in a self-aligned manner, an insulating film similar to the sidewall insulating film 119 of the transistor 400 is formed on the other electrode of the capacitor 650.

With the oxide semiconductor film 130, which includes the pair of second regions 134a and 134b and the pair of third regions 136a and 136b having lower resistance than the first region 132 functioning as a channel formation region with the first region 132 provided in the channel length direction between those pair of regions, the on-state characteristics (e.g., on-state current and field-effect mobility) of the transistor 400 are increased, which enables high-speed operation and high-speed response of the transistor 400.

In addition, the pair of second regions 134a and 134b and the pair of third regions 136a and 136b can reduce the electric field applied to the first region 132 (the channel formation region). The pair of third regions 136a and 136b functions as a source region and a drain region. The pair of third regions 136a and 136b has the lowest resistance in the oxide semiconductor film 130; thus, the contact resistance with the source electrode 127a and the drain electrode 127b can be reduced. Accordingly, the transistor 400 can achieve excellent on-state characteristics (e.g., high on-state current and high field-effect mobility), high-speed operation, and high-speed response.

Further, the transistor 400 and the capacitor 650 include the metal oxide film 121 having an insulating property, which prevents penetration of impurities such as hydrogen and moisture contained in the external air, and thus have excellent reliability. Accordingly, the semiconductor device of this embodiment has excellent reliability.

A wiring 627 may be formed in a manner similar to those of the source wiring 327a and the drain wiring 327b of the transistor 400. For example, an opening reaching the drain electrode 127b is formed in the metal oxide film 121 having an insulating property and the interlayer insulating film 123, and the wiring 627 is formed in the opening in a manner similar to those of the source wiring 327a and the drain wiring 327b of the transistor 400.

Through the above process, the semiconductor device including the transistor 600, the transistor 400, and the capacitor 650 can be manufactured. The transistor 400 is a transistor including the oxide semiconductor film 130 which is highly purified and whose oxygen vacancies are filled. Thus, a change in the electric characteristics of the transistor 400 is suppressed.

In the capacitor 650, sufficient insulation is secured by the gate insulating film 113. For example, in order to secure sufficient capacitance, the gate insulating film 113 is preferably made thinner in the capacitor 650. In the case where a capacitor is not needed, a structure without the capacitor 650 can also be employed for the semiconductor device of this embodiment.

FIG. 18C is an example of a diagram of a circuit including the semiconductor device as a memory cell. In FIG. 18C, one of a source electrode and a drain electrode of the transistor 400, one electrode of the capacitor 650, and the gate electrode of the transistor 600 are electrically connected to one another. A first wiring (1st Line, also referred to as a source line) is electrically connected to a source electrode of the transistor 600. A second wiring (2nd Line, also referred to as a bit line) is electrically connected to a drain electrode of the transistor 600. A third wiring (3rd line, also referred to as a first signal line) is electrically connected to the other of the source electrode and the drain electrode of the transistor 400. A fourth wiring (4th line, also referred to as a second signal line) is electrically connected to the gate electrode of the transistor 400. A fifth wiring (5th Line, also referred to as a word line) is electrically connected to the other electrode of the capacitor 650.

The transistor 400 including an oxide semiconductor has an extremely low off-state current; therefore, when the transistor 400 is in an off state, the potential of a node (hereinafter, a node FG) where the one of the source electrode and the drain electrode of the transistor 400, the one electrode of the capacitor 650, and the gate electrode of the transistor 600 are electrically connected to one another can be held for an extremely long time. The capacitor 650 facilitates holding of charge given to the node FG and reading of the held data.

When data is stored in the semiconductor device (writing), first, the potential of the fourth wiring is set to a potential at which the transistor 400 is turned on, whereby the transistor 400 is turned on. Thus, the potential of the third wiring is supplied to the node FG and a predetermined amount of charge is accumulated in the node FG. Here, charge for supplying either of two different potential levels (hereinafter referred to as low-level charge and high-level charge) is given. After that, the potential of the fourth wiring is set to a potential at which the transistor 400 is turned off, whereby the transistor 400 is turned off. This makes the node FG floating and the predetermined amount of charge is held in the node FG. The predetermined amount of charge is thus accumulated and held in the node FG, whereby the memory cell can store data.

Since the off-state current of the transistor 400 is extremely small, the charge supplied to the node FG is held for a long time. This can remove the need of refresh operation or drastically reduce the frequency of the refresh operations, which leads to a sufficient reduction in power consumption. Moreover, stored data can be held for a long time even when power is not supplied.

When stored data is read out (reading), an appropriate potential (reading potential) is supplied to the fifth wiring while a predetermined potential (fixed potential) is supplied to the first wiring, whereby the transistor 600 changes its state depending on the amount of charge held in the node FG. This is because in general, when the transistor 600 is an n-channel transistor, an apparent threshold value $V_{th\_H}$ of the transistor 600 in the case where the high-level charge is held in the node FG is lower than an apparent threshold value $V_{th\_L}$ of the transistor 600 in the case where the low-level charge is held in the node FG. Here, an apparent threshold value refers to a potential of the fifth wiring, which is needed to turn on the transistor 600. Thus, by setting the potential of the fifth wiring to a potential $V_0$ which is between $V_{th\_H}$ and $V_{th\_L}$, charge held in the node FG can be determined. For example, in the case where the high-level charge is given in writing, when the potential of the fifth wiring is set to $V_0$ ($>V_{th\_H}$), the transistor 600 is turned on. In the case where the low-level charge is given in writing, even when the potential of the fifth wiring is set to $V_0$ ($<V_{th\_L}$), the transistor 600 remains in an off state. In such a manner, by controlling the potential of the fifth wiring and determining whether the transistor 600 is in an on state or off state (reading out the potential of the second wiring), stored data can be read out.

Further, in order to rewrite stored data, a new potential is supplied to the node FG that is holding the predetermined amount of charge given in the above writing, so that the charge for new data is held in the node FG. Specifically, the potential of the fourth wiring is set to a potential at which the transistor 400 is turned on, whereby the transistor 400 is turned on. Thus, the potential of the third wiring (potential for new data) is supplied to the node FG, and the predetermined amount of charge is accumulated in the node FG. After that, the potential of the fourth wiring is set to a potential at which the transistor 400 is turned off, whereby the transistor 400 is turned off. Thus, charge for the new data is held in the node FG. In other words, while the predetermined amount of charge given in the first writing is held in the node FG, the same operation (second writing) as in the first writing is performed, whereby the stored data can be overwritten.

The off-state current of the transistor 400 described in this embodiment can be sufficiently reduced by using the oxide semiconductor film 130 which is highly purified and whose oxygen vacancies are filled. Further, with the use of such a transistor, a semiconductor device in which stored data can be held for an extremely long time even when power is not supplied can be provided.

As described above, a high-performance semiconductor device can be provided by using any of the transistors described in the above embodiments.

Note that the structures, methods, and the like described in this embodiment can be used as appropriate in combination with any of the structures, methods, and the like described in the other embodiments and example.

Embodiment 8

In this embodiment, application examples of the semiconductor device described in Embodiment 7 will be described with reference to FIGS. 19A and 19B.

Figure 19A:
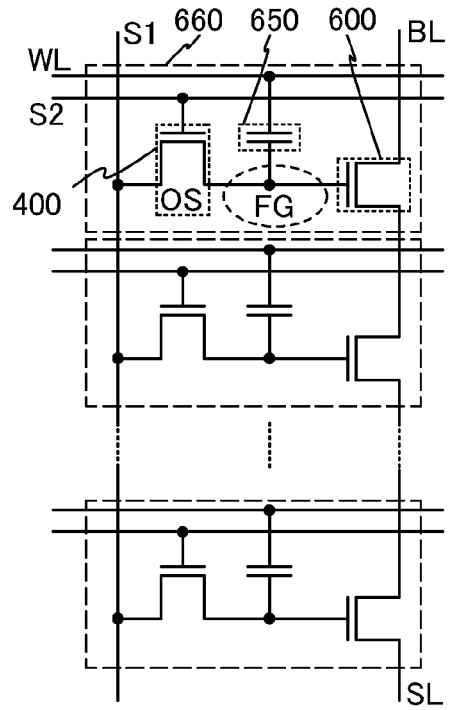
FIGS. 19A and 19B are circuit diagrams each illustrating an example of a semiconductor memory device.
Figure 19B:
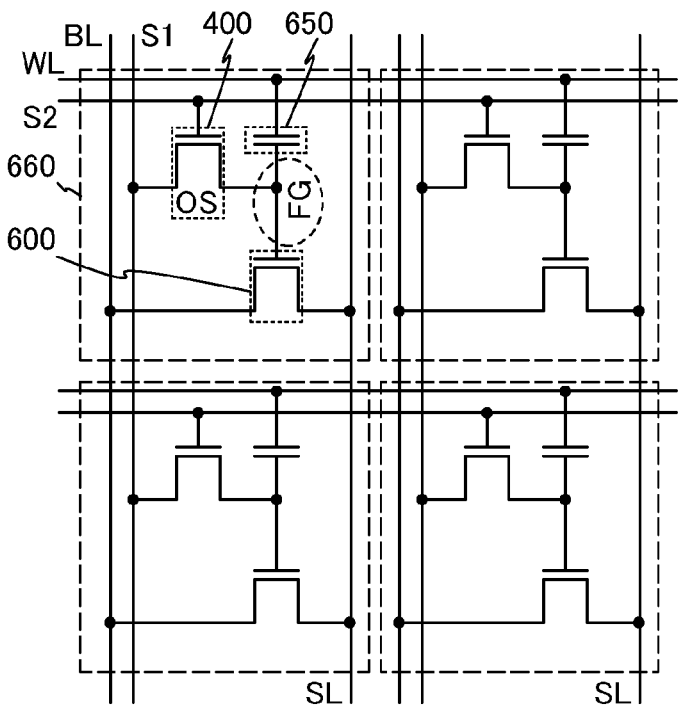

FIGS. 19A and 19B are circuit diagrams of semiconductor devices each including a plurality of memory elements (hereinafter also referred to as memory cells 660) illustrated in FIGS. 18A to 18C. FIG. 19A is a circuit diagram of a so-called NAND semiconductor device in which the memory cells 660 are connected in series, and FIG. 19B is a circuit diagram of a so-called NOR semiconductor device in which the memory cells 660 are connected in parallel.

The semiconductor device illustrated in FIG. 19A includes a source line SL, a bit line BL, a first signal line S1, a plurality of second signal lines S2, a plurality of word lines WL, and the plurality of memory cells 660. In FIG. 19A, one source line SL and one bit line BL are provided in the semiconductor device; however, one embodiment of the present invention is not limited to this structure. A plurality of source lines SL and a plurality of bit lines BL may be provided.

In each of the memory cells 660, the gate electrode of the transistor 600, one of a source electrode and a drain electrode of the transistor 400, and one electrode of the capacitor 650 are electrically connected to one another. The first signal line S1 and the other of the source electrode and the drain electrode of the transistor 400 are electrically connected to each other, and the second signal line S2 and the gate electrode of the transistor 400 are electrically connected to each other. The word line WL and the other electrode of the capacitor 650 are electrically connected to each other.

Further, the source electrode of the transistor 600 included in the memory cell 660 is electrically connected to the drain electrode of the transistor 600 in the adjacent memory cell 660. The drain electrode of the transistor 600 included in the memory cell 660 is electrically connected to the source electrode of the transistor 600 in the adjacent memory cell 660. Note that the drain electrode of the transistor 600 included in the memory cell 660 of the plurality of memory cells connected in series, which is provided at one end, is electrically connected to the bit line. In addition, the source electrode of the transistor 600 included in the memory cell 660 of the plurality of memory cells connected in series, which is provided at the other end, is electrically connected to the source line.

In the semiconductor device in FIG. 19A, writing operation and reading operation are performed for each row. The writing operation is performed as follows. A potential at which the transistor 400 is turned on is supplied to the second signal line S2 of a row where writing is to be performed, so that the transistor 400 of the row where writing is to be performed is turned on. Accordingly, the potential of the first signal line S1 is supplied to the gate electrode of the transistor 600 of the specified row, so that predetermined charge is given to the gate electrode. Thus, data can be written into the memory cell of the specified row.

Further, the reading operation is performed as follows. First, a potential at which the transistor 600 is turned on regardless of charge given to the gate electrode of the transistor 600 is supplied to the word lines WL of rows other than a row where reading is to be performed, so that the transistors 600 of the rows other than the row where reading is to be performed are turned on. Then, a potential (reading potential) at which an on state or an off state of the transistor 600 is determined depending on charge in the gate electrode of the transistor 600 is supplied to the word line WL of the row where reading is to be performed. After that, a constant potential is supplied to the source line SL, and a reading circuit (not illustrated) connected to the bit line BL is operated. Here, the plurality of transistors 600 between the source line SL and the bit line BL are in an on state except the transistor 600 of the row where reading is to be performed; therefore, conductance between the source line SL and the bit line BL is determined by the state (an on state or an off state) of the transistor 600 of the row where reading is to be performed. The conductance of the transistor 600 of the row where reading is to be performed depends on charge in the gate electrode thereof. Thus, the potential of the bit line BL varies accordingly. By reading the potential of the bit line with the reading circuit, data can be read out from the memory cell of the specified row.

The semiconductor device illustrated in FIG. 19B includes a plurality of source lines SL, a plurality of bit lines BL, a plurality of first signal lines S1, a plurality of second signal lines S2, a plurality of word lines WL, and the plurality of memory cells 660. The gate electrode of the transistor 600, one of a source electrode and a drain electrode of the transistor 400, and one electrode of the capacitor 650 are electrically connected to one another. The source line SL and the source electrode of the transistor 600 are electrically connected to each other. The bit line BL and the drain electrode of the transistor 600 are electrically connected to each other. The first signal line S1 and the other of the source electrode and the drain electrode of the transistor 400 are electrically connected to each other, and the second signal line S2 and the gate electrode of the transistor 400 are electrically connected to each other. The word line WL and the other electrode of the capacitor 650 are electrically connected to each other.

In the semiconductor device in FIG. 19B, writing operation and reading operation are performed for each row. The writing operation is performed in a manner similar to that of the semiconductor device in FIG. 19A. The reading operation is performed as follows. First, a potential at which the transistor 600 is turned off regardless of charge given to the gate electrode of the transistor 600 is supplied to the word lines WL of rows other than a row where reading is to be performed, so that the transistors 600 of the rows other than the row where reading is to be performed are turned off. Then, a potential (reading potential) at which an on state or an off state of the transistor 600 is determined depending on charge in the gate electrode of the transistor 600 is supplied to the word line WL of the row where reading is to be performed. After that, a constant potential is supplied to the source line SL, and a reading circuit (not illustrated) connected to the bit line BL is operated. Here, conductance between the source lines SL and the bit lines BL is determined by the state (an on state or an off state) of the transistors 600 of the row where reading is to be performed. That is, the potential of the bit lines BL varies depending on charge in the gate electrodes of the transistors 600 of the row where reading is to be performed. By reading the potential of the bit lines with the reading circuit, data can be read out from the memory cells of the specified row.

Although the amount of data which can be stored in each of the memory cells 660 is one bit in the above description, the structure of the memory device of this embodiment is not limited thereto. The amount of data which can be stored in each of the memory cells 660 may be increased by preparing three or more potentials to be supplied to the gate electrode of the transistor 600. For example, in the case where the number of potentials to be supplied to the gate electrode of the transistor 600 is four, data of two bits can be stored in each of the memory cells.

Note that the structures, methods, and the like described in this embodiment can be used as appropriate in combination with any of the structures, methods, and the like described in the other embodiments and example.

Embodiment 9

In this embodiment, a semiconductor device to which the transistor described in any of the above embodiments is applied will be described with reference to FIGS. 20A and 20B. Note that a memory element (memory cell) is described as an example of a semiconductor device also in this embodiment. The memory element has a structure different from that in the above embodiment.

Figure 20A:
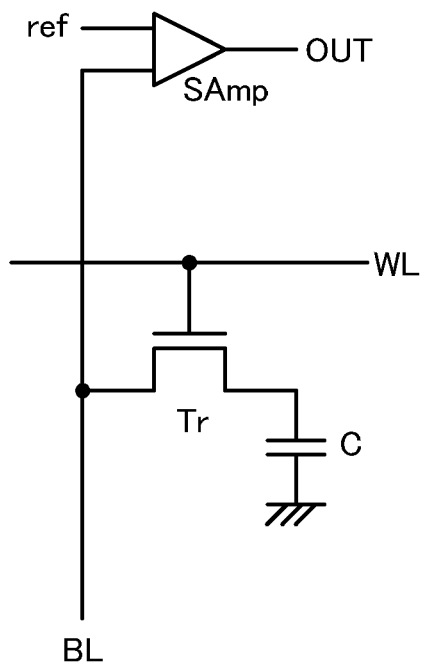
FIGS. 20A and 20B are a circuit diagram illustrating an example of a semiconductor memory device including a transistor and a graph showing the relation between time and capacitor potential.

FIG. 20A is a circuit diagram illustrating a memory element described in this embodiment.

The memory cell illustrated in FIG. 20A includes a bit line BL, a word line WL, a sense amplifier SAmp, a transistor Tr, and a capacitor C.

Figure 20B:
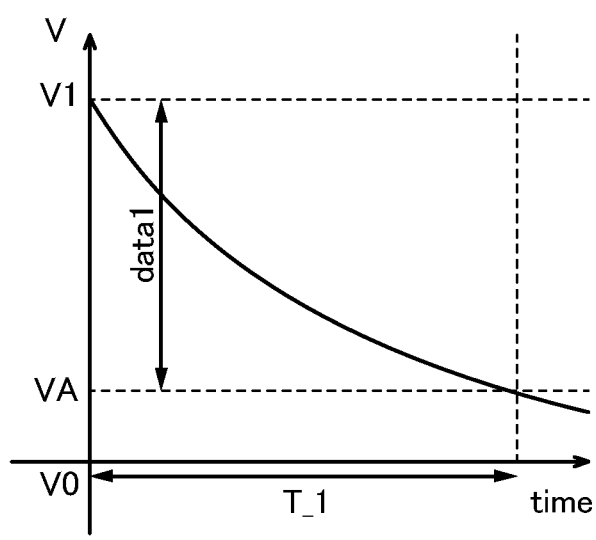

Note that it is known that the voltage held in the capacitor C is gradually decreased with time as shown in FIG. 20B owing to the off-state current of the transistor Tr. A voltage originally charged from V0 to V1 is decreased with time to VA that is a limit for reading out data 1. This period is called a holding period T_1. In the case of a two-level memory cell, refresh operation needs to be performed within the holding period T_1.

The transistor described in any of the above embodiments includes an oxide semiconductor film which is highly purified and whose oxygen vacancies are filled, and thus has less change in electric characteristics and sufficiently reduced off-state current. Therefore, when the transistor described in any of the above embodiments is used as the transistor Tr, the holding period T_1 can be extended. That is, the intervals between refresh operations can be extended; thus, power consumption can be reduced. For example, in the case where the memory cell described in this embodiment is formed using a transistor that includes an oxide semiconductor film and has an off-state current of $1\times10^{-21}$ A or lower, preferably $1\times10^{-24}$ A or lower, data can be held for several days to several decades without supply of power.

Furthermore, since the transistor described in any of the above embodiments has high on-state current and high field-effect mobility, a memory cell capable of high-speed operation and high-speed response can be manufactured.

As described above, a high-performance semiconductor device can be provided by using any of the transistors described in the above embodiments.

Note that the structures, methods, and the like described in this embodiment can be used as appropriate in combination with any of the structures, methods, and the like described in the other embodiments and example.

Embodiment 10

In this embodiment, a semiconductor device to which the transistor described in any of the above embodiments is applied will be described with reference to FIGS. 21A and 21B.

Figure 21A:
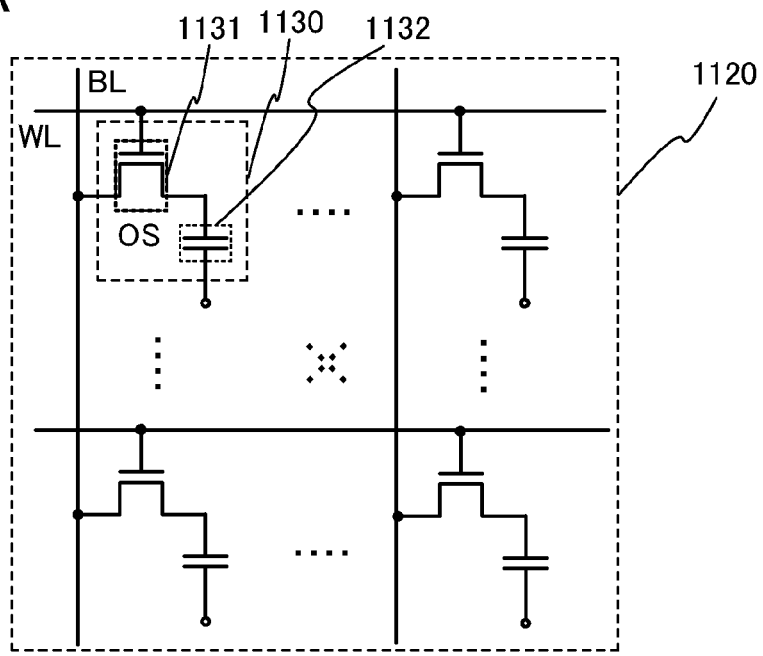
FIGS. 21A and 21B are circuit diagrams each illustrating an example of a semiconductor memory device.

FIG. 21A illustrates an example of a semiconductor device whose structure corresponds to that of a so-called dynamic random access memory (DRAM). A memory cell array 1120 illustrated in FIG. 21A has a structure in which a plurality of memory cells 1130 is arranged in a matrix. Further, the memory cell array 1120 includes m first wirings and n second wirings. Note that in this embodiment, the first wiring and the second wiring are referred to as a word line WL and a bit line BL, respectively.

The memory cell 1130 includes a transistor 1131 and a capacitor 1132. A gate electrode of the transistor 1131 is connected to the first wiring (the word line WL). Further, one of a source electrode and a drain electrode of the transistor 1131 is connected to the second wiring (the bit line BL). The other of the source electrode and the drain electrode of the transistor 1131 is connected to one electrode of the capacitor. The other electrode of the capacitor is connected to a capacitor line CL and is supplied with predetermined potential. The transistor described in any of the above embodiments is applied to the transistor 1131.

The transistor described in any of the above embodiments includes an oxide semiconductor film which is highly purified and whose oxygen vacancies are filled, and thus has less change in electric characteristics and sufficiently reduced off-state current. With the use of such a transistor, the semiconductor device in FIG. 21A, which is regarded as a so-called DRAM, can be used as a substantially nonvolatile memory.

Figure 21B:
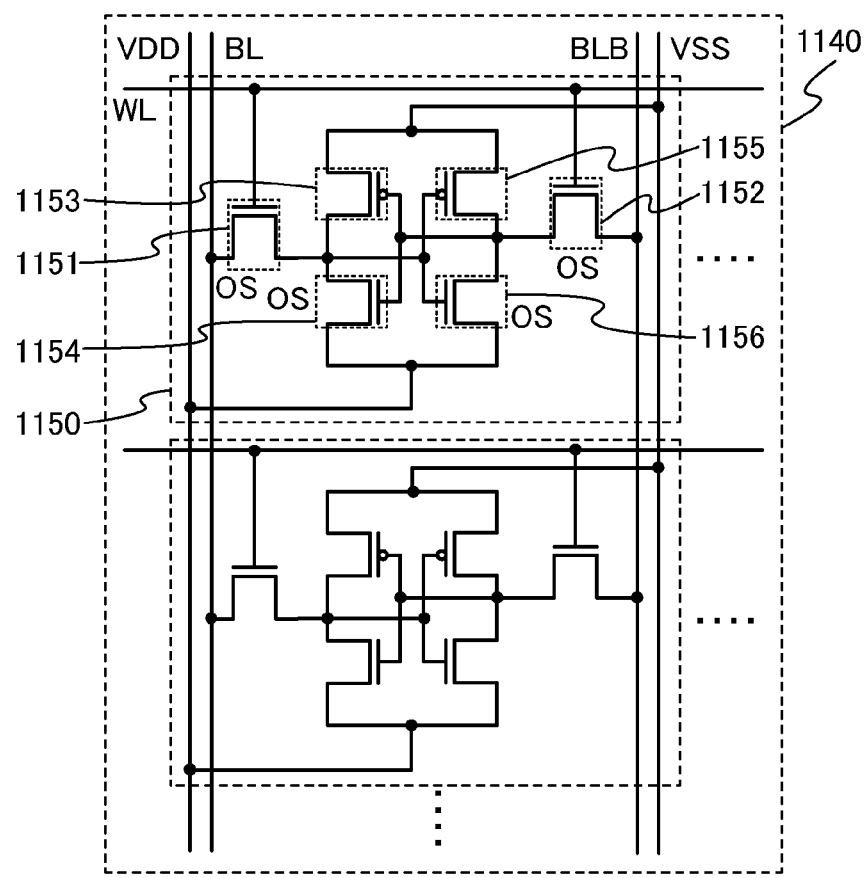

FIG. 21B illustrates an example of a semiconductor device whose structure corresponds to that of a so-called static random access memory (SRAM). A memory cell array 1140 illustrated in FIG. 21B can have a structure in which a plurality of memory cells 1150 is arranged in a matrix. Further, the memory cell array 1140 includes a first wiring (a word line WL), a second wiring (a bit line BL), a third wiring (an inverted bit line BLB), a power supply line VDD, and a ground potential line VSS.

The memory cell 1150 includes a first transistor 1151, a second transistor 1152, a third transistor 1153, a fourth transistor 1154, a fifth transistor 1155, and a sixth transistor 1156. The first transistor 1151 and the second transistor 1152 function as selection transistors. One of the third transistor 1153 and the fourth transistor 1154 is an n-channel transistor (here, the fourth transistor 1154 is an n-channel transistor), and the other of the third transistor 1153 and the fourth transistor 1154 is a p-channel transistor (here, the third transistor 1153 is a p-channel transistor). In other words, the third transistor 1153 and the fourth transistor 1154 form a CMOS circuit. Similarly, the fifth transistor 1155 and the sixth transistor 1156 form a CMOS circuit.

The first transistor 1151, the second transistor 1152, the fourth transistor 1154, and the sixth transistor 1156 are n-channel transistors and the transistor described in any of the above embodiments can be applied to these transistors. Each of the third transistor 1153 and the fifth transistor 1155 is a p-channel transistor in which a channel formation region is formed using a material (e.g., single crystal silicon) other than an oxide semiconductor.

Since the transistor described in any of the above embodiments has high on-state current and high field-effect mobility, a semiconductor device capable of high-speed operation and high-speed response can be manufactured.

As described above, a high-performance semiconductor device can be provided by using any of the transistors described in the above embodiments.

The structures, methods, and the like described in this embodiment can be used as appropriate in combination with any of the structures, methods, and the like described in the other embodiments and example.

Embodiment 11

A central processing unit (CPU) can be formed using the transistor described in any of the above embodiments for at least part of the CPU.

Figure 22A:
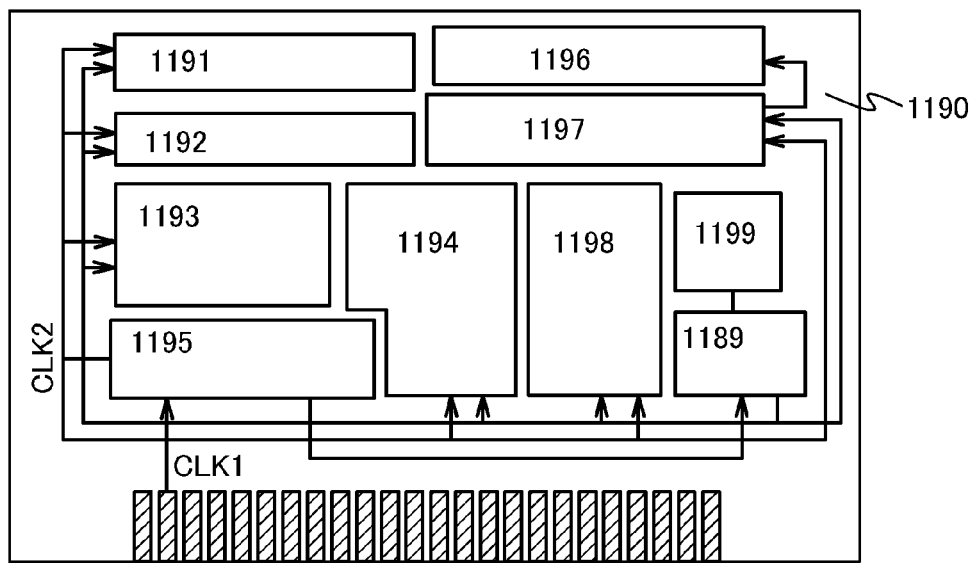
FIG. 22A is a block diagram illustrating a specific example of a CPU.

FIG. 22A is a block diagram illustrating a specific configuration of a CPU. The CPU illustrated in FIG. 22A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM I/F 1189 may be provided over a separate chip. Obviously, the CPU illustrated in FIG. 22A is just an example in which the configuration has been simplified, and an actual CPU may have various configurations depending on the application.

An instruction that is input to the CPU through the Bus I/F 1198 is input to the instruction decoder 1193 and decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit on the basis of its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 22A, a memory element is provided in the register 1196. Any of the memory elements described in the above embodiments can be used as the memory element provided in the register 1196.

In the CPU illustrated in FIG. 22A, the register controller 1197 selects operation of holding data in the register 1196 in accordance with an instruction from the ALU 1191. That is, the register controller 1197 selects whether data is held by a logic element which inverts a logic (logic level) or a capacitor in the memory element included in the register 1196. When data holding by the logic element which inverts a logic (logic level) is selected, power supply voltage is supplied to the memory element in the register 1196. When data holding by the capacitor is selected, the data is rewritten in the capacitor, and supply of power supply voltage to the memory element in the register 1196 can be stopped.

Figure 22B:
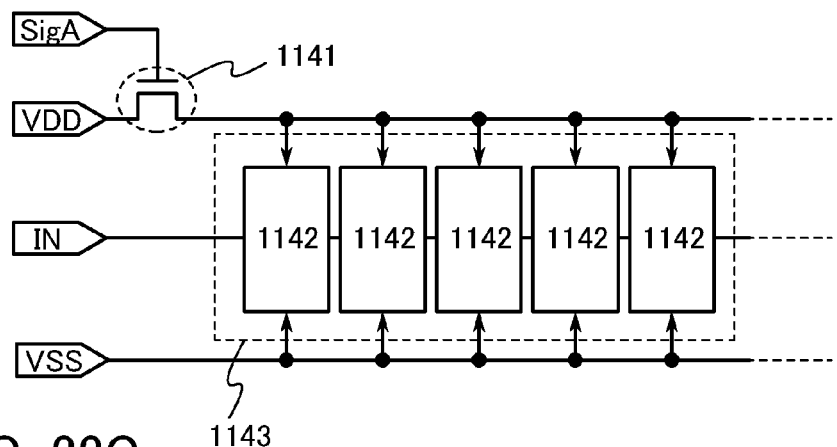
FIGS. 22B and 22C are circuit diagrams each illustrating part of the CPU.
Figure 22C:
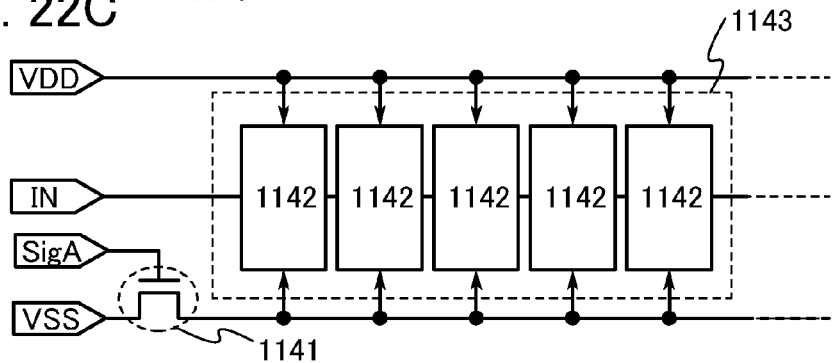

A switching element provided between a memory element group and a node to which a power supply potential Vdd or a power supply potential Vss is supplied, as illustrated in FIG. 22B or FIG. 22C, allows the power supply voltage to be stopped. Circuits illustrated in FIGS. 22B and 22C are described below.

FIGS. 22B and 22C each illustrate an example of a configuration of a memory circuit including a transistor in which a channel formation region is formed using an oxide semiconductor as a switching element for controlling supply of a power supply potential to a memory element.

The memory device illustrated in FIG. 22B includes a switching element 1141 and a memory element group 1143 including a plurality of memory elements 1142. Specifically, as each of the memory elements 1142, the memory element described in the above embodiment can be used. Each of the memory elements 1142 included in the memory element group 1143 is supplied with the high-level power supply potential Vdd through the switching element 1141. Further, each of the memory elements 1142 included in the memory element group 1143 is supplied with a potential of a signal IN and the low-level power supply potential Vss.

In FIG. 22B, a transistor in which a channel formation region is formed using an oxide semiconductor is used as the switching element 1141, and the switching of the transistor is controlled by a signal Sig A supplied to a gate electrode thereof.

Note that FIG. 22B illustrates the configuration in which the switching element 1141 includes only one transistor; however, one embodiment of the present invention is not limited thereto. The switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential Vdd to each of the memory elements 1142 included in the memory element group 1143 in FIG. 22B, the switching element 1141 may control the supply of the low-level power supply potential Vss.

In FIG. 22C, an example of a memory device in which each of the memory elements 1142 included in the memory element group 1143 is supplied with the low-level power supply potential Vss through the switching element 1141 is illustrated. The supply of the low-level power supply potential Vss to each of the memory elements 1142 included in the memory element group 1143 can be controlled by the switching element 1141.

When a switching element is provided between a memory element group and a node to which the power supply potential Vdd or the power supply potential Vss is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

The structures, methods, and the like described in this embodiment can be used as appropriate in combination with any of the structures, methods, and the like described in the other embodiments and example.

Embodiment 12

In this embodiment, an example in which at least part of a driver circuit and a transistor provided in a pixel portion are formed over one substrate is described.

The transistor of the pixel portion is formed by the method for manufacturing the transistor described in any of the above embodiments. The transistor described in any of the above embodiments can be easily formed as an n-channel transistor, and thus part of a driver circuit that can be formed using an n-channel transistor can be formed over the same substrate as the transistor of the pixel portion.

The transistor described in any of the above embodiments includes an oxide semiconductor film which is highly purified and whose oxygen vacancies are filled, and thus has less change in electric characteristics and sufficiently reduced off-state current. In addition, the transistor has high on-state current and high field-effect mobility. Therefore, by using the transistor described in any of the above embodiments for the pixel portion or the driving circuit, a high-performance display device with high reliability can be provided.

Figure 23A:
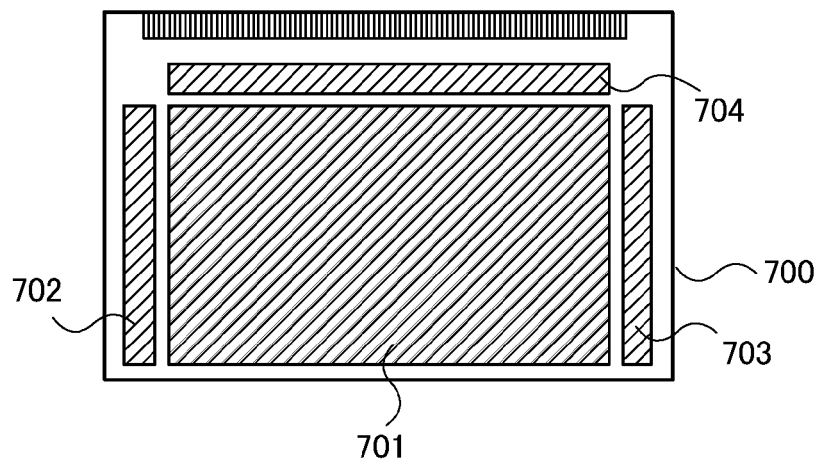
FIGS. 23A to 23C are a top view and circuit diagrams illustrating an active matrix display device.

FIG. 23A illustrates an example of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 is arranged and a plurality of scan lines extended from the first scan line driver circuit 702 and the second scan line driver circuit 703 is arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 23A, the first scan line driver circuit 702, the second scan line driver circuit 703, and the signal line driver circuit 704 are formed over the substrate 700 where the pixel portion 701 is formed. Accordingly, the number of components of a drive circuit which is provided outside and the like is reduced, so that a reduction in cost can be achieved. Further, if the driver circuit is provided outside the substrate 700, wirings would need to be extended and the number of connections of wirings would be increased, but by providing the driver circuit over the substrate 700, the number of connections of the wirings can be reduced. Consequently, an improvement in reliability or yield can be achieved.

Figure 23B:
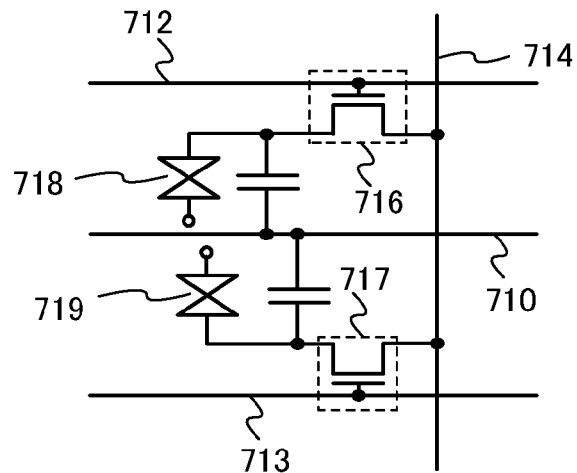

FIG. 23B illustrates an example of a circuit configuration of the pixel portion. Here, a pixel structure of a VA liquid crystal display panel is shown.

In this pixel structure, a plurality of pixel electrodes is provided in one pixel, and transistors are connected to the respective pixel electrodes. The transistors are driven by different gate signals. In other words, signals applied to individual pixel electrodes in a multi-domain pixel are controlled independently.

A gate wiring 712 of a transistor 716 and a gate wiring 713 of a transistor 717 are separated so that different gate signals can be supplied thereto. In contrast, a source or drain wiring 714 functioning as a data line is shared by the transistors 716 and 717. The transistor described in any of the above embodiments can be used as appropriate as each of the transistors 716 and 717. Thus, a high-performance liquid crystal display panel can be provided.

A first pixel electrode electrically connected to the transistor 716 and a second pixel electrode electrically connected to the transistor 717 have different shapes and are separated by a slit. The second pixel electrode is provided so as to surround the external side of the first pixel electrode which is spread in a V shape. Timing of voltage application is made to vary between the first and second pixel electrodes by the transistors 716 and 717 in order to control alignment of the liquid crystal. The transistor 716 is connected to the gate wiring 712, and the transistor 717 is connected to the gate wiring 713. When different gate signals are supplied to the gate wiring 712 and the gate wiring 713, operation timings of the transistor 716 and the transistor 717 can be varied.

Further, a storage capacitor is formed using a capacitor wiring 710, a gate insulating film functioning as a dielectric, and a capacitor electrode electrically connected to the first pixel electrode or the second pixel electrode.

The first pixel electrode, a liquid crystal layer, and a counter electrode overlap with each other to form a first liquid crystal element 718. The second pixel electrode, the liquid crystal layer, and the counter electrode overlap with each other to form a second liquid crystal element 719. The pixel structure is a multi-domain structure in which the first liquid crystal element 718 and the second liquid crystal element 719 are provided in one pixel.

Note that a pixel structure of the present invention is not limited to that shown in FIG. 23B. For example, a switch, a resistor, a capacitor, a transistor, a sensor, a logic circuit, or the like may be added to the pixel illustrated in FIG. 23B.

Figure 23C:
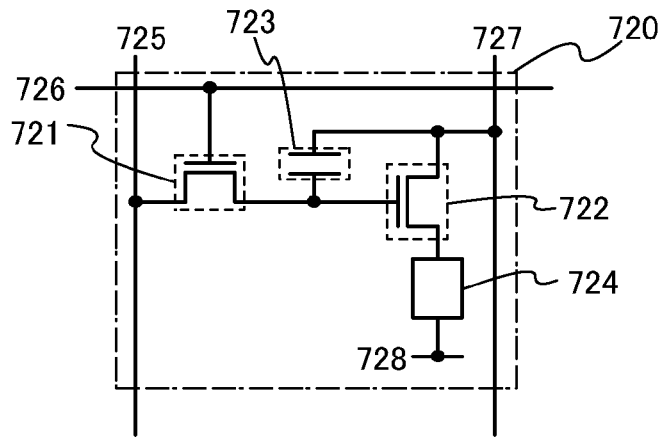

FIG. 23C illustrates an example of a circuit configuration of the pixel portion. Here, a pixel structure of a display panel using an organic EL element is shown.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 23C illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor film.

A pixel 720 includes a switching transistor 721, a driver transistor 722, a light-emitting element 724, and a capacitor 723. A gate electrode of the switching transistor 721 is connected to a scan line 726, a first electrode (one of a source electrode and a drain electrode) of the switching transistor 721 is connected to a signal line 725, and a second electrode (the other of the source electrode and the drain electrode) of the switching transistor 721 is connected to a gate electrode of the driver transistor 722. The gate electrode of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As the switching transistor 721 and the driver transistor 722, the transistor described in any of the above embodiments can be used as appropriate. In this manner, a highly reliable display panel including an organic EL element can be provided.

The second electrode (the common electrode 728) of the light-emitting element 724 is set to have a low power supply potential. Note that the low power supply potential is a potential which is lower than a high power supply potential when the high power supply potential that is set to the power supply line 727 is a reference. As the low power supply potential, GND, 0 V, or the like may be employed, for example. A potential difference between the high power supply potential and the low power supply potential is applied to the light-emitting element 724 and current is supplied to the light-emitting element 724, so that the light-emitting element 724 emits light. Here, in order to make the light-emitting element 724 emit light, each potential is set so that the potential difference between the high power supply potential and the low power supply potential is greater than or equal to the forward threshold voltage of the light-emitting element 724.

Note that gate capacitance of the driver transistor 722 may be used as a substitute for the capacitor 723, so that the capacitor 723 can be omitted. The gate capacitance of the driver transistor 722 may be formed between the channel formation region and the gate electrode.

In the case of a voltage-input voltage driving method, a video signal is input to the gate electrode of the driver transistor 722 so that the driver transistor 722 is in either of two states of being sufficiently turned on and turned off. That is, the driver transistor 722 operates in a linear region. In order for the driver transistor 722 to operate in a linear region, voltage higher than the voltage of the power supply line 727 is applied to the gate electrode of the driver transistor 722. Note that voltage higher than or equal to a voltage which is the sum of the voltage of the power supply line and Vth of the driver transistor 722 is applied to the signal line 725.

In the case of performing analog grayscale driving instead of digital time grayscale driving, the same pixel structure as in FIG. 23C can be used by changing signal input.

In the case of performing analog grayscale driving, a voltage greater than or equal to a voltage which is the sum of the forward voltage of the light-emitting element 724 and Vth of the driver transistor 722 is applied to the gate electrode of the driver transistor 722. The forward voltage of the light-emitting element 724 indicates a voltage at which a desired luminance is obtained, and includes at least forward threshold voltage. A video signal by which the driver transistor 722 is operated in a saturation region is input, so that current can be supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that a pixel structure of the present invention is not limited to that shown in FIG. 23C. For example, a switch, a resistor, a capacitor, a sensor, a transistor, a logic circuit, or the like may be added to the pixel illustrated in FIG. 23C.

The structures, methods, and the like described in this embodiment can be used as appropriate in combination with any of the structures, methods, and the like described in the other embodiments and example.

Embodiment 13

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in any of the above embodiments are described.

Figure 24A:
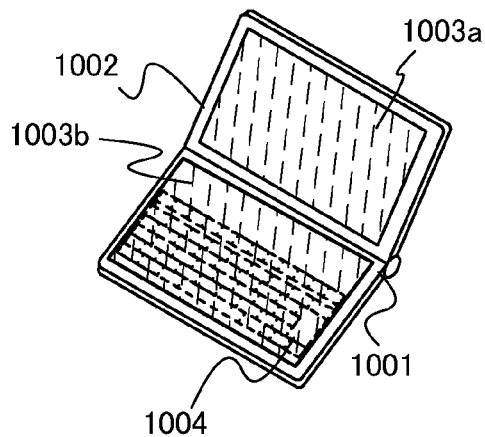
FIGS. 24A to 24D are external views of electronic devices.

FIG. 24A illustrates an example of a portable information terminal, which includes a main body 1001, a housing 1002, display portions 1003a and 1003b, and the like. The display portion 1003b is a touch panel. By touching a keyboard 1004 displayed on the display portion 1003b, a screen can be operated and text can be input. It is needless to say that the display portion 1003a may be a touch panel. A liquid crystal panel or an organic light-emitting panel manufactured by using the transistor described in any of the above embodiments as a switching element is applied to the display portion(s), whereby a high-performance portable information terminal can be provided. For example, a portable information terminal with low power consumption and high reliability can be provided.

The portable information terminal illustrated in FIG. 24A can have a function of displaying a variety of kinds of information (e.g., a still image, a moving image, and a text image), a function of displaying a calendar, a date, the time, or the like on the display portion, a function of operating or editing the information displayed on the display portion, a function of controlling processing by a variety of kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 24A may transmit and receive data wirelessly. Through wireless communication, desired book data or the like can be purchased and downloaded from an electronic book server.

Figure 24B:
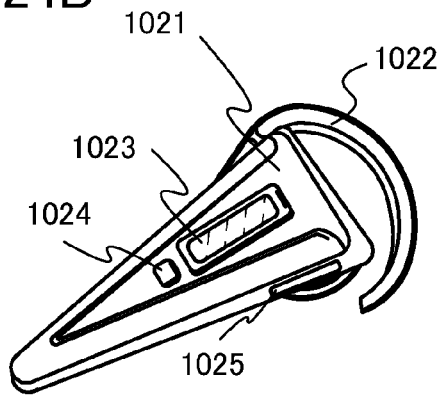

FIG. 24B illustrates an example of a portable music player, which includes, in a main body 1021, a display portion 1023, a fixing portion 1022 with which the main body is worn on the ear, a speaker, an operation button 1024, an external memory slot 1025, and the like. A liquid crystal panel or an organic light-emitting panel manufactured by using the transistor described in any of the above embodiments as a switching element is applied to the display portion, whereby a high-performance portable music player can be provided. For example, a portable music player with low power consumption and high reliability can be provided.

Furthermore, when the portable music player illustrated in FIG. 24B has an antenna, a microphone function, or a wireless communication function and is used with a mobile phone, a user can talk on the phone wirelessly in a hands-free way while driving a car or the like.

Figure 24C:
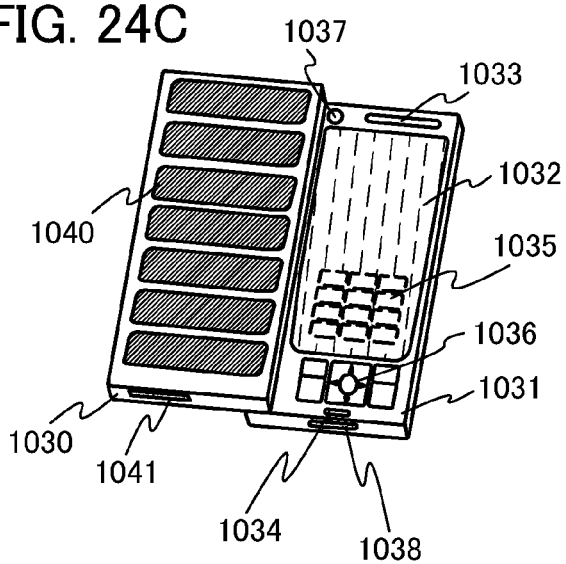

FIG. 24C illustrates an example of a mobile phone, which includes two housings, a housing 1030 and a housing 1031. The housing 1031 includes a display panel 1032, a speaker 1033, a microphone 1034, a pointing device 1036, a camera lens 1037, an external connection terminal 1038, and the like. In addition, the housing 1030 includes a solar cell 1040 having a function of charge of the portable information terminal, an external memory slot 1041, and the like. Further, an antenna is incorporated in the housing 1031. A liquid crystal panel or an organic light-emitting panel manufactured by using the transistor described in any of the above embodiments as a switching element is applied to the display panel, whereby a high-performance mobile phone can be provided. For example, a mobile phone with low power consumption and high reliability can be provided.

Further, the display panel 1032 is provided with a touch panel. A plurality of operation keys 1035 displayed as images is shown by dashed lines in FIG. 24C. Note that a boosting circuit by which a voltage output from the solar cell 1040 is increased to be sufficiently high for each circuit is also included.

The display direction of the display panel 1032 is changed as appropriate depending on a usage pattern. Further, the mobile phone is provided with the camera lens 1037 on the same surface as the display panel 1032, and thus it can be used as a video phone. The speaker 1033 and the microphone 1034 can be used for videophone calls, recording and playing sound, and the like as well as voice calls. Moreover, the housings 1030 and 1031 in a state where they are developed as illustrated in FIG. 24C can shift by sliding so that one is lapped over the other; therefore, the size of the mobile phone can be reduced, which makes the mobile phone suitable for being carried.

The external connection terminal 1038 can be connected to an AC adapter and various types of cables such as a USB cable, and charging and data communication with a personal computer are possible. Moreover, a large amount of data can be stored by inserting a storage medium into the external memory slot 1041 and can be moved.

Further, in addition to the above functions, an infrared communication function, a television reception function, or the like may be provided.

Figure 24D:
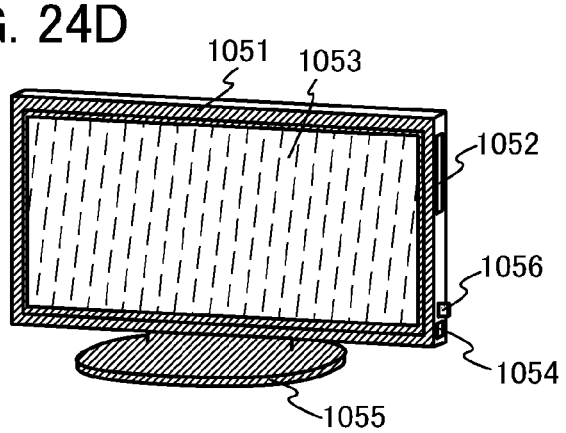

FIG. 24D illustrates an example of a television set, in which a display portion 1053 is incorporated in a housing 1051. In the television set, an image can be displayed on the display portion 1053. Here, the housing 1051 is supported by a stand 1055 incorporating a CPU. A liquid crystal panel or an organic light-emitting panel manufactured by using the transistor described in any of the above embodiments as a switching element is applied to the display portion, whereby a high-performance television set can be provided. For example, a television set with low power consumption and high reliability can be provided.

The television set can be operated with an operation switch of the housing 1051 or a separate remote controller. Further, the remote controller may be provided with a display portion for displaying data output from the remote controller.

Note that the television set is provided with a receiver, a modem, and the like. With the receiver, a general television broadcast can be received. Furthermore, when the television set is connected to a communication network by wired or wireless connection via the modem, one-way (from a transmitter to a receiver) or two-way (between a transmitter and a receiver, between receivers, or the like) data communication can be performed.

Further, the television set is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and data stored in the storage medium can be read and data can be written into the storage medium. In addition, an image, a video, or the like stored as data in an external memory 1056 inserted into the external memory slot can be displayed on the display portion 1053.

When the memory device described in any of the above embodiments is applied to the external memory 1056 or the CPU, the television set can have high reliability and power consumption thereof can be sufficiently reduced.

The structures, methods, and the like described in this embodiment can be used as appropriate in combination with any of the structures, methods, and the like described in the other embodiments and example.

Example 1

In this example, physical properties of an oxide semiconductor film which can be applied to a semiconductor device according to one embodiment of the present invention are described.

First, a method for fabricating samples whose physical properties are evaluated is described. The fabrication method includes a step of forming an oxide semiconductor film by a sputtering method with bias power supplied to the substrate side and a step of performing heat treatment on the formed oxide semiconductor film. Note that a magnetron sputtering apparatus is used in this example; thus, the fabrication method is described with reference to FIG. 2B as appropriate.

An In—Ga—Zn-based oxide with an atomic ratio of In:Ga:Zn=3:1:2 was used for the oxide semiconductor film formed in this example. Accordingly, an In—Ga—Zn-based oxide target with an atomic ratio of In:Ga:Zn=3:1:2 was used as the target 207.

A substrate (a quartz substrate) was placed on the substrate support 205, an oxygen gas was supplied from the gas supply unit 204 to the treatment chamber 201, and the pressure of the treatment chamber 201 was adjusted to be 0.4 Pa. The flow rate of the oxygen gas supplied to the treatment chamber 201 was 30 sccm.

Then, RF power was applied to the electrode 203 with the power source 211 to generate oxygen plasma in the treatment chamber 201, and the oxide semiconductor film was deposited on the substrate placed on the substrate support 205 with use of the target 207. Here, a 100 nm thick oxide semiconductor film was formed with RF power supplied as bias power to the substrate support 205 (the substrate side) with the power source 215. In other words, the 100 nm thick oxide semiconductor film was formed on the substrate with self-bias voltage (Vdc) controlled. Note that the substrate temperature was room temperature and the RF power applied to the electrode 203 was 200 W in the formation of the oxide semiconductor film.

In this example, bias power of 0 W, 100 W, or 200 W was supplied to the substrate side at the time of forming the oxide semiconductor film by a sputtering method. The sample fabricated with a bias power of 0 W, which is a comparative example, is called sample A, the sample fabricated under the bias power of 100 W is called sample B, and the sample fabricated under the bias power of 200 W is called sample C.

Then, the formed oxide semiconductor film was subjected to heat treatment; thus, the samples whose physical properties were to be evaluated were fabricated. The heat treatment was performed at 650° C. for one hour in an oxygen atmosphere or a nitrogen atmosphere.

Figure 25:
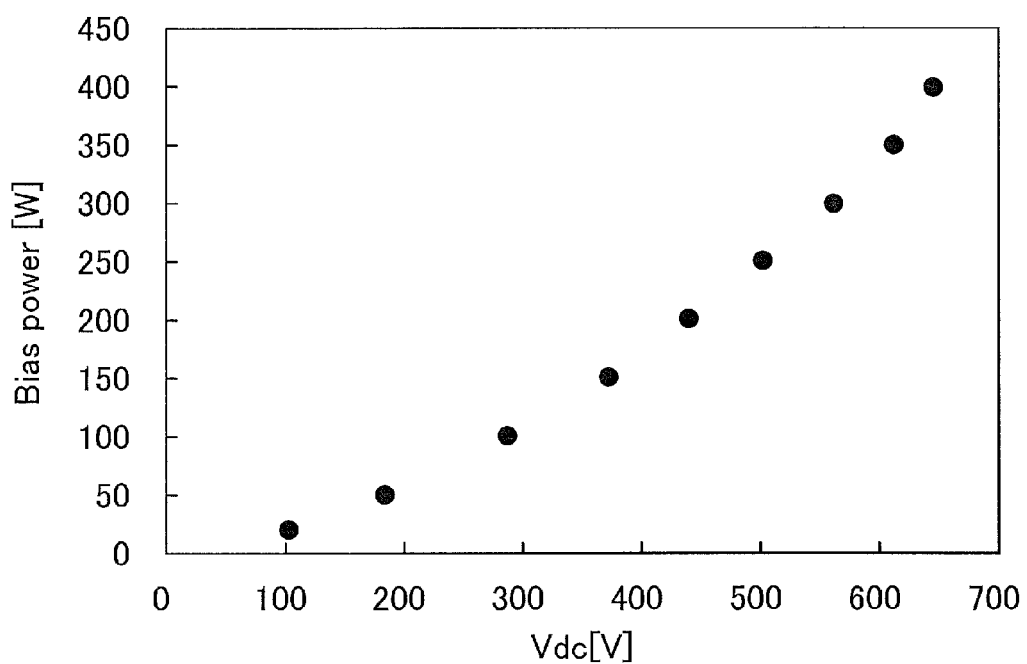
FIG. 25 shows the relation between bias power and self-bias voltage at the time of forming an oxide semiconductor film.

Note that RF power (bias power) supplied to the substrate side and self-bias voltage applied to the substrate side satisfy the relation shown in FIG. 25. Accordingly, the sample B fabricated under the bias power of 100 W can be said to be a sample to which a self-bias voltage of about 290 V was applied, and the sample C fabricated under the bias power of 200 W can be said to be a sample to which a self-bias voltage of about 440 V was applied. Note that the difference between the potential of the substrate and the ground potential was measured as the self-bias voltage.

Figure 26:
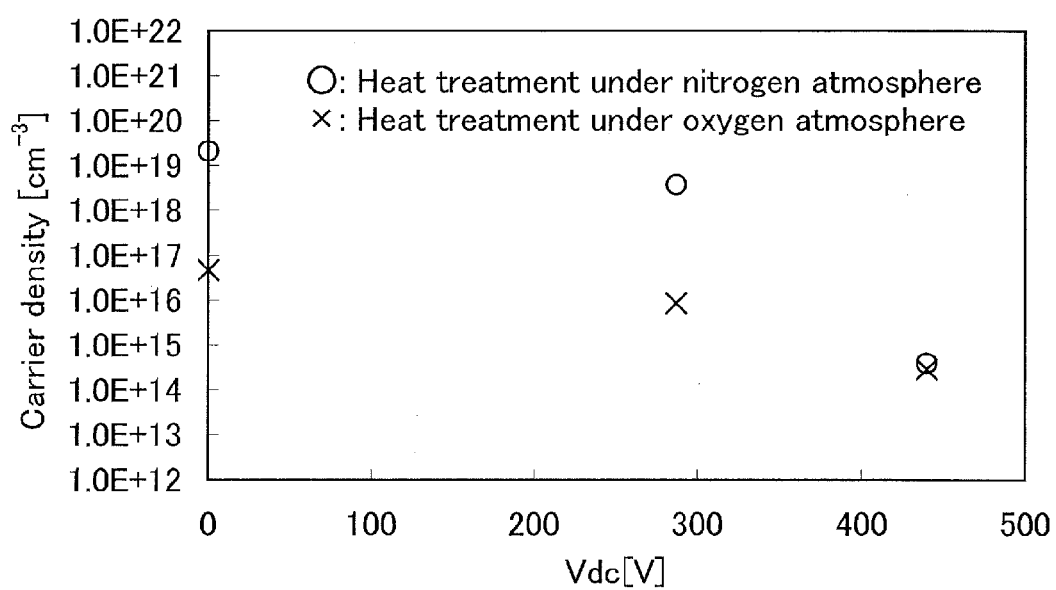
FIG. 26 shows the relation between bias power and carrier density at the time of forming an oxide semiconductor film.

Next, carrier densities in the samples A, B, and C having been subjected to the heat treatment at 650° C. in an oxygen atmosphere or a nitrogen atmosphere were measured by Hall effect measurement. FIG. 26 shows the measurement results. In FIG. 26, the horizontal axis represents the self-bias voltage (Vdc) [V] applied to the substrate side and the vertical axis represents the measured carrier density [cm$^{-3}$].

According to FIG. 26, carrier density in the sample A to which no self-bias voltage was applied, which is the comparative example, is $4.6 \times 10^{16}$ cm$^{-3}$. On the other hand, carrier density in the sample B to which a self-bias voltage of about 290 V was applied is $8.5 \times 10^{15}$ cm$^3$. Carrier density in the sample C to which a self-bias voltage of about 440 V was applied is $2.9 \times 10^{14}$ cm$^{-3}$.

The results of the samples B and C shown in FIG. 26 indicate that, if carrier density is decreased in a linear manner when the condition is switched from that of the sample B to that of the sample C, carrier density lower than $1 \times 10^{15}$ cm$^3$ can be achieved by forming an oxide semiconductor film with self-bias voltage controlled to be higher than or equal to 400 V and performing heat treatment. In other words, it can be said that carrier density lower than $1 \times 10^{15}$ cm$^{-3}$ can be achieved by forming an oxide semiconductor film with bias power higher than or equal to 200 W (see FIG. 25) supplied to the substrate side and performing heat treatment.

Next, samples D, E, and F were fabricated through processes similar to those used for the samples A, B, and C with heat treatment temperature changed from 650° C. to 450° C. In other words, the sample D is a sample fabricated with no self-bias voltage applied, the sample E is a sample fabricated with a self-bias voltage of about 290 V applied, and the sample F is a sample fabricated with a self-bias voltage of about 440 V applied.

Figure 27A:
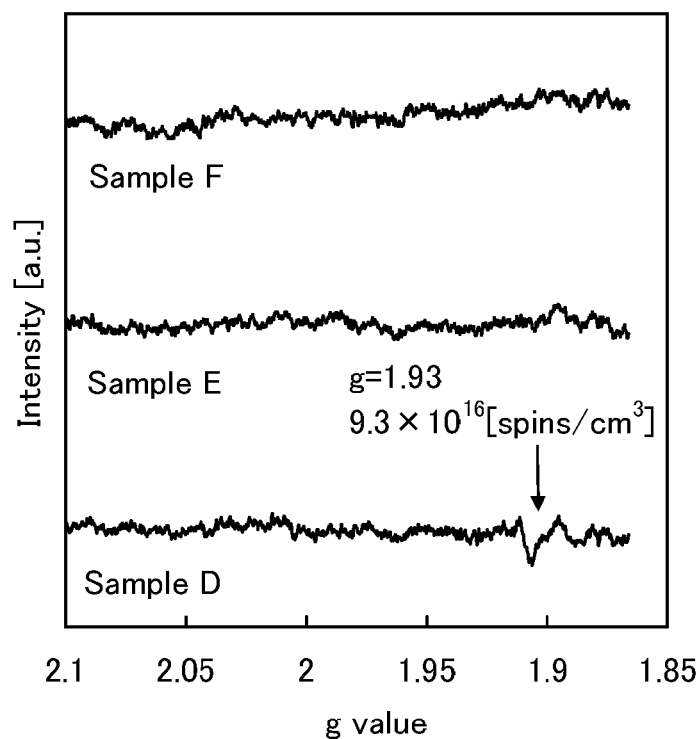
FIGS. 27A and 27B show the results of evaluating an oxide semiconductor film by electron spin resonance spectroscopy.
Figure 27B:
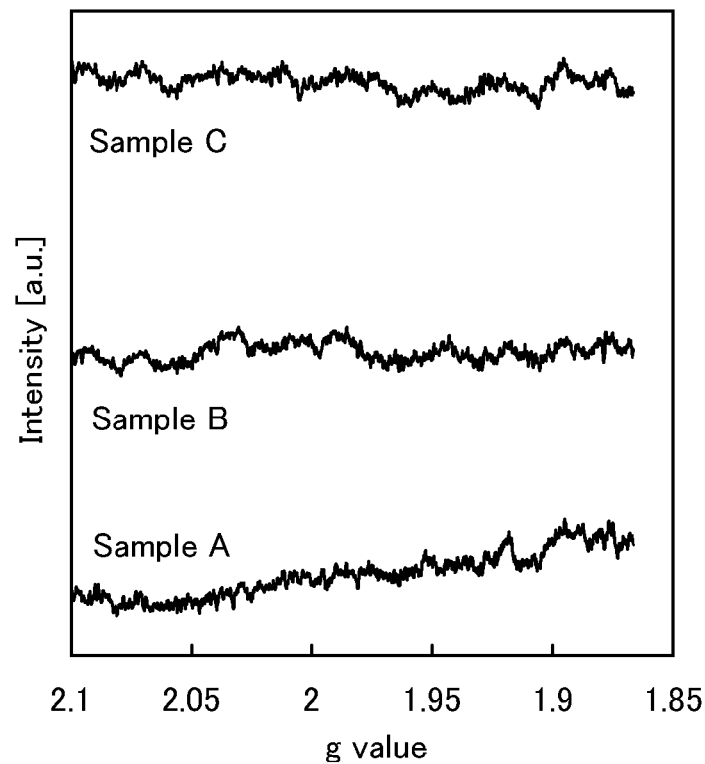

The spin density based on a signal due to oxygen vacancies in each of the samples A to F was measured by electron spin resonance spectroscopy. FIGS. 27A and 27B show the measurement results. In FIGS. 27A and 27B, the horizontal axis represents the g value and the vertical axis represents the intensity of the signal.

FIG. 27A shows the results of the samples D, E, and F subjected to heat treatment at 450° C., and FIG. 27B shows the results of the samples A, B and C subjected to heat treatment at 650° C. According to FIG. 27A, a symmetrical signal is observed at a g value (g) of around 1.93 in the sample D in which no bias power (0 W) was supplied to the substrate side. The signal is a signal due to oxygen vacancies in the oxide semiconductor film. The spin density of the sample D was calculated based on the signal by comparing the integral value of a peak of an absorption curve which was obtained by integral transformation of the signal with that of a standard sample of which the total number of defects was quantified in advance. The spin density was $9.3 \times 10^{16}$ spins/cm$^3$.

In this example, an In—Ga—Zn-based oxide with an atomic ratio of In:Ga:Zn=3:1:2 is used for the oxide semiconductor film in each of the samples A to F, which means that the proportion of In in the oxide semiconductor film is higher than those of Ga and Zn. Therefore, the g value (g) at which the signal due to oxygen vacancies in the oxide semiconductor film in each of the samples A to F is found is smaller than 1.93.

For example, when an In—Ga—Zn-based oxide with an atomic ratio of In:Ga:Zn=1:1:1 is used for the oxide semiconductor film in each of the samples A to F, the signal due to oxygen vacancies is expected to be found at a g value (g) of 1.93.

On the other hand, a symmetrical signal is not observed at a g value (g) of around 1.93 in the sample E in which a bias power of 100 W (Vdc of about 290 V) was supplied to the substrate side and the sample F in which a bias power of 200 W (Vdc of about 440 V) was supplied to the substrate side. It is thus confirmed that an oxide semiconductor film can be formed while taking in oxygen by supplying bias power to the substrate side and by forming the oxide semiconductor film in oxygen plasma with self-bias voltage applied to the substrate side being controlled, so that an oxide semiconductor film in which oxygen vacancies are reduced can be formed.

Moreover, according to FIG. 27B, a symmetrical signal is not observed at a g value (g) of around 1.93 in the samples A, B, and C subjected to heat treatment at 650° C. That is, the spin density based on the signal is below the lower limit of detection in the samples A, B, and C.

As described above, an oxide semiconductor film is formed by a sputtering method in an oxygen atmosphere with self-bias voltage applied to the substrate side being controlled, and then heat treatment is performed, whereby an oxide semiconductor film in which oxygen vacancies are reduced can be formed. In this manner, for example, an oxide semiconductor film whose spin density, which is calculated from the peak of a signal detected at a g value (g) of around 1.93 by electron spin resonance spectroscopy, is lower than $9.3 \times 10^{16}$ spins/cm$^3$, preferably lower than or equal to $5 \times 10^{16}$ spins/cm$^3$, further preferably below the lower limit of detection and whose carrier density is lower than $1 \times 10^{15}$/cm$^3$ can be formed. Consequently, a high-performance semiconductor device can be manufactured by using the oxide semiconductor film formed by this method.

This application is based on Japanese Patent Application serial no. 2012-046295 filed with Japan Patent Office on Mar. 2, 2012 and Japanese Patent Application serial no.

2012-046296 filed with Japan Patent Office on Mar. 2, 2012, the entire contents of which are hereby incorporated by reference.

What is claimed is:

1. A method for manufacturing a semiconductor device, comprising the steps of:
   forming a gate electrode over a substrate;
   forming a gate insulating film in contact with the gate electrode;
   forming an oxide semiconductor film in contact with the gate insulating film; and
   forming a source electrode and a drain electrode in contact with the oxide semiconductor film,
   wherein the step of forming the oxide semiconductor film comprises:
      providing the substrate on a stage of a reaction chamber, wherein the stage is electrically connected to a first power source;
      supplying a gas containing oxygen;
      generating oxygen plasma in the reaction chamber by using a second power source, wherein the second power source is electrically connected to an electrode;
      supplying RF power from the first power source to the stage so as to generate a self-bias voltage between the oxygen plasma and the substrate so that the oxide semiconductor film is formed, wherein the substrate has a negative potential with respect to a potential of the oxygen plasma; and
      heating the oxide semiconductor film so that a spin density of the oxide semiconductor film is lower than $9.3 \times 10^{16}$ spins/cm$^3$, the spin density corresponding to a peak of a signal detected at a g-value of around 1.93 by electron spin resonance spectroscopy.

2. The method for manufacturing a semiconductor device according to claim 1,
   wherein the step of forming the gate insulating film comprises:
      providing the substrate on the stage of the reaction chamber, wherein the stage is electrically connected to the first power source;
      supplying a gas containing oxygen;
      generating oxygen plasma in the reaction chamber by using the second power source, wherein the second power source is electrically connected to the electrode; and
      supplying RF power from the first power source to the stage.

3. The method for manufacturing a semiconductor device according to claim 2, further comprising the step of performing heat treatment after the gate insulating film is formed,
   wherein the heat treatment is performed at a temperature higher than or equal to 300° C. and lower than or equal to 700° C. under reduced pressure, a nitrogen atmosphere, an oxygen atmosphere, or a rare gas atmosphere.

4. The method for manufacturing a semiconductor device according to claim 1, wherein the self-bias voltage is higher than or equal to 400 V.

5. The method for manufacturing a semiconductor device according to claim 1,
   wherein the step of heating the oxide semiconductor film is performed at a temperature higher than or equal to 300° C. and lower than or equal to 700° C. under reduced pressure, a nitrogen atmosphere, an oxygen atmosphere, or a rare gas atmosphere.

6. The method for manufacturing a semiconductor device according to claim 1,
   wherein a carrier density of the oxide semiconductor film is lower than $1 \times 10^{15}$/cm$^3$, and
   wherein the peak of the signal detected by electron spin resonance spectroscopy is due to oxygen vacancies in the oxide semiconductor film.

7. The method for manufacturing a semiconductor device according to claim 1, wherein the gate electrode is formed in contact with an upper surface of the gate insulating film.

8. The method for manufacturing a semiconductor device according to claim 1, wherein the gate electrode is formed in contact with a lower surface of the gate insulating film.

9. The method for manufacturing a semiconductor device according to claim 1, wherein the oxide semiconductor film comprises two or more metal elements.

10. The method for manufacturing a semiconductor device according to claim 1, wherein the oxide semiconductor film comprises indium, gallium, and zinc.

11. A method for manufacturing a semiconductor device, comprising the steps of:
    forming a first insulating film over a substrate;
    forming an oxide semiconductor film over the first insulating film;
    forming a gate insulating film over the oxide semiconductor film;
    forming a gate electrode over the gate insulating film;
    forming a second insulating film over the gate electrode; and
    forming a source electrode and a drain electrode over the second insulating film,
    wherein the step of forming the oxide semiconductor film comprises:
       providing the substrate on a stage of a reaction chamber, wherein the stage is electrically connected to a first power source;
       supplying a gas containing oxygen;
       generating oxygen plasma in the reaction chamber by using a second power source, wherein the second power source is electrically connected to an electrode;
       supplying RF power from the first power source to the stage so as to generate a self-bias voltage between the oxygen plasma and the substrate so that the oxide semiconductor film is formed, wherein the substrate has a negative potential with respect to a potential of the oxygen plasma; and
       heating the oxide semiconductor film to remove hydrogen from the oxide semiconductor film so that a spin density of the oxide semiconductor film is lower than $9.3 \times 10^{16}$ spins/cm$^3$, the spin density corresponding to a peak of a signal detected at a g-value of around 1.93 by electron spin resonance spectroscopy.

12. The method for manufacturing a semiconductor device according to claim 11,
    wherein the step of forming the gate insulating film comprises:
       providing the substrate on the stage of the reaction chamber, wherein the stage is electrically connected to the first power source;
       supplying a gas containing oxygen;
       generating oxygen plasma in the reaction chamber by using the second power source, wherein the second power source is electrically connected to the electrode; and
       supplying RF power from the first power source to the stage.

13. The method for manufacturing a semiconductor device according to claim 12, further comprising the step of performing heat treatment after the gate insulating film is formed,
wherein the heat treatment is performed at a temperature higher than or equal to 300° C. and lower than or equal to 700° C. under reduced pressure, a nitrogen atmosphere, an oxygen atmosphere, or a rare gas atmosphere.

14. The method for manufacturing a semiconductor device according to claim 11, wherein the self-bias voltage is higher than or equal to 400 V.

15. The method for manufacturing a semiconductor device according to claim 11,
wherein the step of heating the oxide semiconductor film is performed at a temperature higher than or equal to 300° C. and lower than or equal to 700° C. under reduced pressure, a nitrogen atmosphere, an oxygen atmosphere, or a rare gas atmosphere.

16. The method for manufacturing a semiconductor device according to claim 11,
wherein a carrier density of the oxide semiconductor film is lower than $1\times10^{15}/cm^3$, and
wherein the peak of the signal detected by electron spin resonance spectroscopy is due to oxygen vacancies in the oxide semiconductor film.

17. The method for manufacturing a semiconductor device according to claim 11, wherein the oxide semiconductor film comprises indium, gallium, and zinc.

18. A method for manufacturing a semiconductor device, comprising the steps of:
forming a first insulating film over a substrate;
forming an oxide semiconductor film over the first insulating film;
forming a gate insulating film over the oxide semiconductor film;
forming a gate electrode over the gate insulating film;
etching the gate insulating film and the gate electrode;
adding a dopant into the oxide semiconductor film by using the gate electrode as a mask;
forming a second insulating film over the gate electrode; and
forming a source electrode and a drain electrode over the second insulating film,
wherein the step of forming the oxide semiconductor film comprises:
providing the substrate on a stage of a reaction chamber, wherein the stage is electrically connected to a first power source;
supplying a gas containing oxygen;
generating oxygen plasma in the reaction chamber by using a second power source, wherein the second power source is electrically connected to an electrode;
supplying RF power from the first power source to the stage so as to generate a self-bias voltage between the oxygen plasma and the substrate so that the oxide semiconductor film is formed, wherein the substrate has a negative potential with respect to a potential of the oxygen plasma; and
heating the oxide semiconductor film to remove hydrogen from the oxide semiconductor film so that a spin density of the oxide semiconductor film is lower than $9.3\times10^{16}$ spins/cm$^3$ and a carrier density of the oxide semiconductor film is lower than $1\times10^{15}/cm^3$, the spin density corresponding to a peak of a signal detected at a g-value of around 1.93 by electron spin resonance spectroscopy.

19. The method for manufacturing a semiconductor device according to claim 18,
wherein the step of forming the gate insulating film comprises:
providing the substrate on the stage of the reaction chamber, wherein the stage is electrically connected to the first power source;
supplying a gas containing oxygen;
generating oxygen plasma in the reaction chamber by using the second power source, wherein the second power source is electrically connected to the electrode; and
supplying RF power from the first power source to the stage.

20. The method for manufacturing a semiconductor device according to claim 19, further comprising the step of performing heat treatment after the gate insulating film is formed,
wherein the heat treatment is performed at a temperature higher than or equal to 300° C. and lower than or equal to 700° C. under reduced pressure, a nitrogen atmosphere, an oxygen atmosphere, or a rare gas atmosphere.

21. The method for manufacturing a semiconductor device according to claim 18, wherein the self-bias voltage is higher than or equal to 400 V.

22. The method for manufacturing a semiconductor device according to claim 18,
wherein the step of heating the oxide semiconductor film is performed at a temperature higher than or equal to 300° C. and lower than or equal to 700° C. under reduced pressure, a nitrogen atmosphere, an oxygen atmosphere, or a rare gas atmosphere.

23. The method for manufacturing a semiconductor device according to claim 18,
wherein the peak of the signal detected by electron spin resonance spectroscopy is due to oxygen vacancies in the oxide semiconductor film.

24. The method for manufacturing a semiconductor device according to claim 18, wherein the oxide semiconductor film comprises indium, gallium, and zinc.

* * * * *